(12) United States Patent
Sasao et al.

(10) Patent No.: US 7,844,924 B2
(45) Date of Patent: Nov. 30, 2010

(54) DEVICE FOR REDUCING THE WIDTH OF GRAPH AND A METHOD TO REDUCE THE WIDTH OF GRAPH, AND A DEVICE FOR LOGIC SYNTHESIS AND A METHOD FOR LOGIC SYNTHESIS

(75) Inventors: Tsutomu Sasao, Fukuoka (JP); Yukihiro Iguchi, Kanagawa (JP)

(73) Assignee: Kitakyushu Foundation for the Advancement of Industry, Science and Technology, Kitakyushu-shi, Fukuoka (JP)

(*) Notice: Subject to any disclaimer, the term of this patent is extended or adjusted under 35 U.S.C. 154(b) by 939 days.

(21) Appl. No.: 10/579,743

(22) PCT Filed: Nov. 19, 2004

(86) PCT No.: PCT/JP2004/017263

§ 371 (c)(1),
(2), (4) Date: Mar. 5, 2007

(87) PCT Pub. No.: WO2005/050494

PCT Pub. Date: Jun. 2, 2005

(65) Prior Publication Data

US 2007/0174804 A1 Jul. 26, 2007

(30) Foreign Application Priority Data

Nov. 19, 2003 (JP) .............................. 2003-389264

(51) Int. Cl.
*G06F 17/50* (2006.01)
*G06F 19/00* (2006.01)

(52) U.S. Cl. ..................... 716/2; 716/5; 716/7; 716/8; 703/16

(58) Field of Classification Search ..................... 716/2, 716/5, 7, 18; 703/16
See application file for complete search history.

(56) References Cited

U.S. PATENT DOCUMENTS 4,811,237 A * 3/1989 Putatunda et al. .............. 716/9

(Continued)

OTHER PUBLICATIONS

T. Sasao et al., "A Cascade Realization of Multiple-Output Function for Reconfigurable Hardware," International Workshop on Logic and Synthesis (IWLS01), Lake Tahoe, CA, Jun. 12-15, 2001. pp. 225-230 and three sheets of cover page and TOC.

(Continued)

*Primary Examiner*—Phallaka Kik
(74) *Attorney, Agent, or Firm*—Edwards Angell Palmer & Dodge LLP

(57) ABSTRACT

A device for logic synthesis that can be used to synthesize LUT logic circuit having intermediate outputs for multiple-output logic functions. The device includes means to store node table 8 storing Binary Decision Diagram for Characteristic Function (BDD_for_CF) of the characteristic function $\chi(X, Y)$ of the multiple-output logic function f(X), means to store LUTs 16, means to reduce by shorting 11 partitioning BDD_for_CF into the subgraphs $B_0$ and $B_1$ at the partition line in the height lev of the partition and executing shorten-processing, means to measure the width W of BDDs 12 calculating the width W at the partition line, means to compute the intermediate variables 13 calculating the number of the intermediate variables u according to the width W, means to generate an LUT 14 generating the LUT for the sub-graph $B_0$, and means to reconstruct BDDs 15 generating a binary tree that has the same number of control inputs as that of the intermediate variables u, replacing the sub-graph $B_0$ with the binary tree and reconstructing the BDD_for_CF.

16 Claims, 25 Drawing Sheets

U.S. PATENT DOCUMENTS

| | | | | |
|---|---|---|---|---|
| 5,602,753 | A * | 2/1997 | Fukui | 716/4 |
| 5,625,630 | A * | 4/1997 | Abramovici et al. | 714/724 |
| 6,212,669 | B1 * | 4/2001 | Jain | 716/7 |
| 6,421,815 | B1 * | 7/2002 | Seawright | 716/7 |
| 6,560,758 | B1 * | 5/2003 | Jain | 716/7 |
| 7,003,738 | B2 * | 2/2006 | Bhattacharya et al. | 716/1 |
| 7,028,278 | B2 * | 4/2006 | Jain | 716/5 |
| 7,039,882 | B2 * | 5/2006 | Rana et al. | 716/3 |
| 7,673,263 | B2 * | 3/2010 | Jain | 716/5 |
| 2002/0023256 | A1 * | 2/2002 | Seawright | 716/18 |
| 2002/0053063 | A1 * | 5/2002 | Bhattacharya et al. | 716/1 |
| 2003/0233628 | A1 * | 12/2003 | Rana et al. | 716/18 |
| 2004/0015799 | A1 * | 1/2004 | Jain | 716/5 |
| 2006/0129953 | A1 * | 6/2006 | Jain | 716/3 |

OTHER PUBLICATIONS

T. Sasao et al., "DECOMPOS: An Integrated System for Functional Decomposition", reprinted from 1998 International Workshop on Logic Synthesis, Lake Tahoe, Jun. 1998, pp. 1-7.

Y-T. Lai et al., "BDD Based Decomposition of Logic Functions with Application to FPGA Synthesis", 30th ACM/IEEE Design Automation Conference, Jun. 1993, pp. 642-647.

T. Sasao, "FPGA Design by Generalized Functional Decomposition", In Logic Synthesis and Optimization, Sasao ed., Kluwer Academic Publisher, 1993, pp. 233-258 and eight sheets of cover page and TOC.

C. Scholl et al., "Communication Based FPGA Synthesis for Multi-Output Boolean Functions", reprinted from Asia and South Pacific Design Automation Conference, Aug. 1995, 9 sheets (numbered as pp. 279-287 in original).

B. Wurth et al., "Functional Multiple-Output Decomposition: Theory and Implicit Algorithm", Design Automation Conf., Jun. 1995, 6 sheets (numbered as pp. 54-59 in original).

H. Sawada et al., "Logic Synthesis for Look-Up table based FPGAs using Functional Decomposition and Support Minimization", reprinted from ICCAD, Nov. 1995, 6 sheets (numbered as pp. 353-358 in original).

J.-H.R.Jian et al., "Compatible Class Encoding in Hyper-Function Decomposition for FPGA Synthesis", Design Automation Conference, Jun. 1998, 6 sheets (numbered as pp. 712-717 in original).

P. Ashar et al., "Fast Functional Simulation Using Branching Programs", reprinted from Proc. International Conference on Computer Aided Design, Nov. 1995, 5 sheets (numbered as pp. 408-412 in original).

C. Scholl et al., "Functional Simulation using Binary Decision Diagram", reprinted from ICCAD'97, Nov. 1997, 5 sheets (numbered as pp. 8-12 in original).

A. Mishchenko et al., "Logic Synthesis of LUT Cascades with Limited Rails", IEICE Technical Report, VLD2002-99, Lake Biwa (Nov. 2002), pp. 103-108 and two sheets of TOC.

M. R. Garey et al., "Computers and Intractability: A Guide to the Theory of NP-Completeness", W. H. Freeman & Co., New York, 1979, p. 194 and six sheets of cover page and TOC.

Y. Iguchi et al., "Realization of Multiple-Output Functions by Reconfigurable Cascades", reprinted from Proceedings of 2001 International Conference on Computer Design, Sep. 23, 2001, Austin TX USA, pp. 388-393.

* cited by examiner (a) Truth table with columns $h_1$, $a_1$, $b_1$, $s_1$, $s_2$:

| $h_1$ | $a_1$ | $b_1$ | $s_1$ | $s_2$ |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

(b) Number of LUT: 4
Number of stages: 2

FIG. 13

Structure of node table

Address

| | |
|---|---|
| 0000 | labels of variable |
| | Address of child node of 0-edge |
| | Address of child node of 1-edge |
| 0001 | labels of variable |
| | Address of child node of 0-edge |
| | Address of child node of 1-edge |
| 0002 | labels of variable |
| | Address of child node of 0-edge |
| | Address of child node of 1-edge |

} One node

| Name | In | Out | method of present invention | | | Mishchenko [15] | | |
|---|---|---|---|---|---|---|---|---|
| | | | LUT | Number of stages | Cas | LUT | Number of stages | Cas |
| C1908 | 33 | 25 | 320 | 11 | 5 | 3015 | 18 | 30 |
| apex1 | 45 | 45 | 115 | 12 | 1 | 213 | 10 | 5 |
| apex6 | 135 | 99 | 385 | 18 | 4 | 728 | 18 | 18 |
| duke2 | 22 | 29 | 46 | 4 | 1 | 51 | 3 | 4 |
| term1 | 34 | 10 | 50 | 8 | 1 | 37 | 6 | 2 |
| ttt2 | 24 | 21 | 54 | 6 | 1 | 47 | 4 | 3 |

Note : Number of input $k$ of LUT as $k=10$.

(b)

(a)

DEVICE FOR REDUCING THE WIDTH OF GRAPH AND A METHOD TO REDUCE THE WIDTH OF GRAPH, AND A DEVICE FOR LOGIC SYNTHESIS AND A METHOD FOR LOGIC SYNTHESIS

BACKGROUND OF THE INVENTION

1. Field of the Invention

This invention relates to the logic synthesis technology to generate the LUT circuits used in look-up table (LUT) cascade networks or LUT-type FPGAs, to implement a multiple-output logic function.

2. Description of the Related Art

Recently, LUT-type Field Programmable Gate Arrays (FPGAs) are widely used in designs of various electronic networks. (For example, see non-patent literature 1~3). An LUT-type FPGA consists of a large number of configurable logic blocks (CLBs) arranged in a two-dimensional array, and plural vertical and horizontal routing lines located between CLBs. In each cross-point of the routing lines, there is a programmable switch block (SB) so that the reprogramming of the interconnection between them are possible. Also each CLB and routing lines are connected by a reconfigurable connection block (CB). And, at the end of each routing line, there is an input/output part (I/O part) sends and receives signal to and from the outside of the FPGA. Each CLB has one or more multi-input single-output LUTs and multiplexers (MUXs) to perform the logic operation. In an LUT-type FPGA, by reconfiguring SBs, CBs and CLBs, we can realize various combinational logic circuits by interconnecting LUTs that store desired multi-input single-output logic functions, according to the object.

On the other hand, to realize faster circuit than FPGAs, LUT cascade logic circuits have been proposed (for example, see non-patent literature 4,5). An LUT cascade logic circuit has a structure consisting of multi-input multi-output LUTs connected in a cascade. To each LUT, in addition to the external inputs, the outputs from the LUT of the preceding stage, are connected as inputs. And, from the LUT of the final stage, one or more output variables are produced. The objective logic function are decomposed into plural multiple-output logic functions, and each multiple-output logic function are stored in each LUT. In this way, we can implement the desired operations of multiple-output logic function by using an LUT cascade logic circuit.

In order to apply the above-mentioned LUT-type FPGA or LUT cascade logic circuit in the practical logic circuit design, first, we represent the desired objective logic function as a compound logic function by decomposing the objective function. Where the compound logic function is obtained by composing the decomposition function, i.e., the plural logic functions produced by functional decompositions. That is, let the objective logic function be denoted by $f(X)$, where $\{X\}$ denotes the set of the input variables. When the objective logic function is decomposed in the form $f(X_1, X_2) = g(h(X_1), X_2)$ ($\{X_1\} \subset \{X\}$, $\{X_2\} \subset \{X\}$, $\{X_1\} \cap \{X_2\} = \phi$, $\{X_1\} \cup \{X_2\} = \{X\}$), $g(h(X_1), X_2)$ is the compound function of g and h.

In this description of the patent, the symbols X and Y denote the ordered set of the input variables, and output variables, respectively, while the symbols $\{X\}$, $\{Y\}$ denotes the unordered set of the input and output variables, respectively.

From the above-mentioned functional decomposition, we have two decomposition function $h(X_1)$ and $g(h, X_2)$. Such functional decomposition is not always possible, but many practical functions, such as control circuits and arithmetic circuits used in computer are decomposable (see non-patent literature 6). Also, when the decomposition function $g(h, X_2)$ is also decomposable, we can iterate a similar functional decompositions.

And, realize each decomposition function by a separate LUT, and connect these LUTs in a network structure or in a cascade structure to form compound logic function. In this way, we can realize the objective logic function by using LUT-type FPGAs or LUT cascade logic circuits.

When the objective function has a single output, by using above-mentioned functional decomposition method, we can relatively easily implement the function by the logic circuit consisting of LUTs (for example, see non-patent literature 4, 5 reference).

On the other hand, when the objective logic function has multiple outputs, as for the synthesis technique to implement the objective logic function as an LUT circuit, the following methods are known.

(1) A method to used a multi terminal binary decision diagram (MTBDD) (See non-patent literature 7, 8).

(2) A method to realize by partitioning the outputs into several groups (See non-patent literature 7).

(3) A method to used a partition theory (See non-patent literature 9, 10).

(4) A method using substitution (See non-patent literature 11).

(5) A method to use hyper function (non-patent literature 12 reference)

(6) A method to use time-division multiplexing represented by the Encoded Characteristic Function for Non-zeros (ECFN) (See non-patent literature 4, 5).

(7) Combinations of some of above methods (See non-patent literature 11).

REFERENCE

[Non-Patent Literature 1]
S. Brown, R. J. Francis, J. Rose, and Z. G. Vranesic, "Field-Programmable Gate Arrays", Kluwer Academic Publishers, 1992.

[Non-Patent Literature 2]
P. Chow, S. O. Seo, J. Rose, K. Chung, G. Paez-Monzon, and I. Rahardja, "The design of an SRAM-based field-programmable gate array - - - Part I: Architecture," IEEE Transactions on VLSI Systems, vol. 7, pp. 191-197, June 1999.

[Non-Patent Literature 3]
Chow, P., S. Seo, J. Rose, K. Chung, G. Pez-Monzn and I. Rahardja. "The Design of an SRAM-Based Field-Programmable Gate Array, Part II: Circuit Design and Layout", IEEE Transactions on Very Large Scale Integration (VLSI) Systems, Vol. 7 No. 3, September 1999, pp. 321-330.

[Non-Patent Literature 4]
T. Sasao, M. Matsuura, and Y. Iguchi, "A Cascade Realization of Multiple-output Function and Its Application to Reconfigurable Hardware", IEICE Fault-Tolerant Research Group, FTS2001-8, pp. 57-64, Mie University (2001-04).

[Non-Patent Literature 5]
T. Sasao, M. Matsuura, and Y. Iguchi, "A cascade realization of multiple-output function for reconfigurable hardware," International Workshop on Logic and Synthesis (IWLS01), Lake Tahoe, Calif., Jun. 12-15, 2001. pp. 225-230.

[Non-Patent Literature 6]
T. Sasao and M. Matsuura, "DECOMPOS: An integrated system for functional decomposition", 1998 International Workshop on Logic Synthesis, Lake Tahoe, June 1998.

[Non-Patent Literature 7]

Y-T. Lai, M. Pedram and S. B. K. Vrudhula, "BDD based decomposition of logic functions with application to FPGA synthesis", 30th ACM/IEEE Design Automation Conference, June 1993.

[Non-Patent Literature 8]

T. Sasao, "FPGA design by generalized functional decomposition", In Logic Synthesis and Optimization, Sasao ed., Kluwer Academic Publisher, pp. 233-258, 1993.

[Non-Patent Literature 9]

C. Scholl and P. Molitor, "Communication based FPGA synthesis for multi-output Boolean functions", Asia and South Pacific Design Automation Conference, pp. 279-287, August 1995.

[Non-Patent Literature 10]

B. Wurth, K. Eckl, and K. Anterich, "Functional multiple-output decomposition: Theory and implicit algorithm", Design Automation Conf., pp. 54-59, June 1995.

[Non-Patent Literature 11]

H. Sawada, T. Suyama, and A. Nagoya, "Logic synthesis for look-up table based FPGAs using functional decomposition and support minimization", ICCAD, pp. 353-359, November 1995.

[Non-Patent Literature 12]

J.-H. R. Jian, J.-Y. Jou, and J.-D. Huang, "Compatible class encoding in hyper-function decomposition for FPGA synthesis", Design Automation Conference, pp. 712-717, June 1998.

[Non-Patent Literature 13]

P. Ashar and S. Malik, "Fast functional simulation using branching programs", Proc. International Conference on Computer Aided Design, pp. 408-412, November 1995.

[Non-Patent Literature 14]

C. Scholl, R. Drechsler, and B. Becker, "Functional simulation using binary decision diagram", ICCAD'97, pp. 8-12, November 1997.

[Non-Patent Literature 15]

A. Mishchenko and T. Sasao, "Logic Synthesis of LUT Cascades with Limited Rails", IEICE Technical Report, VLD2002-9, Lake Biwa (2002-11)

[Non-Patent Literature 16]

M. R. Garey, D. S. Johnson, "Computers and Intractability: A Guide to the Theory of NP-Completeness", W. H. Freeman & Co., New York, 1979.

SUMMARY OF THE INVENTION

None of the methods (1)~(7) presented in the above-mentioned background of invention are sufficient for the logic synthesis of multiple-output logic functions. For example, finding a functional decomposition of a multiple-output logic function by using an MTBDD is theoretically possible, but in the case of a functions with m outputs, the number of terminal nodes can be as large as $2^m$. Thus, a functional decomposition of a multiple-output logic function using an MTBDD often produces a decomposition table with large column multiplicity (to be defined in Definition 6), and not practical. Other conventional methods also similar drawbacks.

However, many logic functions exist such as comparators and adders, where some of the output values are decided before all the logic operations are completed. For example, in the case of an adder that computes the sum of the input variable $P=(p_1, p_2, p_3, p_4)$ ($P \in B^4$, $B=\{0, 1\}$) and $Q=(q_1, q_2, q_3, q_4)$ ($Q \in B^4$), and produce the output variables $R=(r_0, r_1, r_2, r_3, cout)$ ($R \in B^5$), the value of the output variable is decided when the addition of each digit is completed, but before all the operations are terminated. In this way, the output variables that are decided before all the logic operations are terminated are called "intermediate output variables".

When the objective logic function has intermediate output variables, in an LUT network or in an LUT cascade that realizes the objective logic function, by implementing the cascade so that the intermediate LUTs realize the intermediate output variables, the size of each LUT can be smaller and the operation speed can be increased.

However, logic synthesis techniques shown in the above-mentioned background of invention, for the objective logic function that has intermediate output variables, the design of an LUT network or an LUT cascade with intermediate outputs was difficult.

Furthermore, in many circuits such as radix converters and adders, some output values are not always defined for all the inputs, and for some inputs, the output can be either 0 or 1, or don't care. For the multiple-output logic functions with such don't cares, if we design LUT networks or LUT cascades without considering the don't cares, the memory would contain a large amount of redundancy. Thus, for multiple-output logic functions with don't cares, it is desirable to modify the circuit so that the redundancy of LUT networks or LUT cascades will be smaller.

Thus, the first object of the present invention is to present the logic synthesis technology that can be universally used for general multiple-output logic functions, and can be used for the LUT networks and LUT cascades that have intermediate outputs.

The second objective of present invention is to present the technique to reduce the width of the graphs representing the multiple-output logic function with don't cares, so that the redundancy of LUT networks and LUT cascades will be reduced.

BRIEF DESCRIPTION OF THE DRAWINGS

FIG. 13 is the data structure diagram of the node table.

FIG. 17 is the experimental results of the synthesis of LUT cascades using the logic synthesis method of the present invention.

EXPLANATION OF REFERENCES

Figure 1:
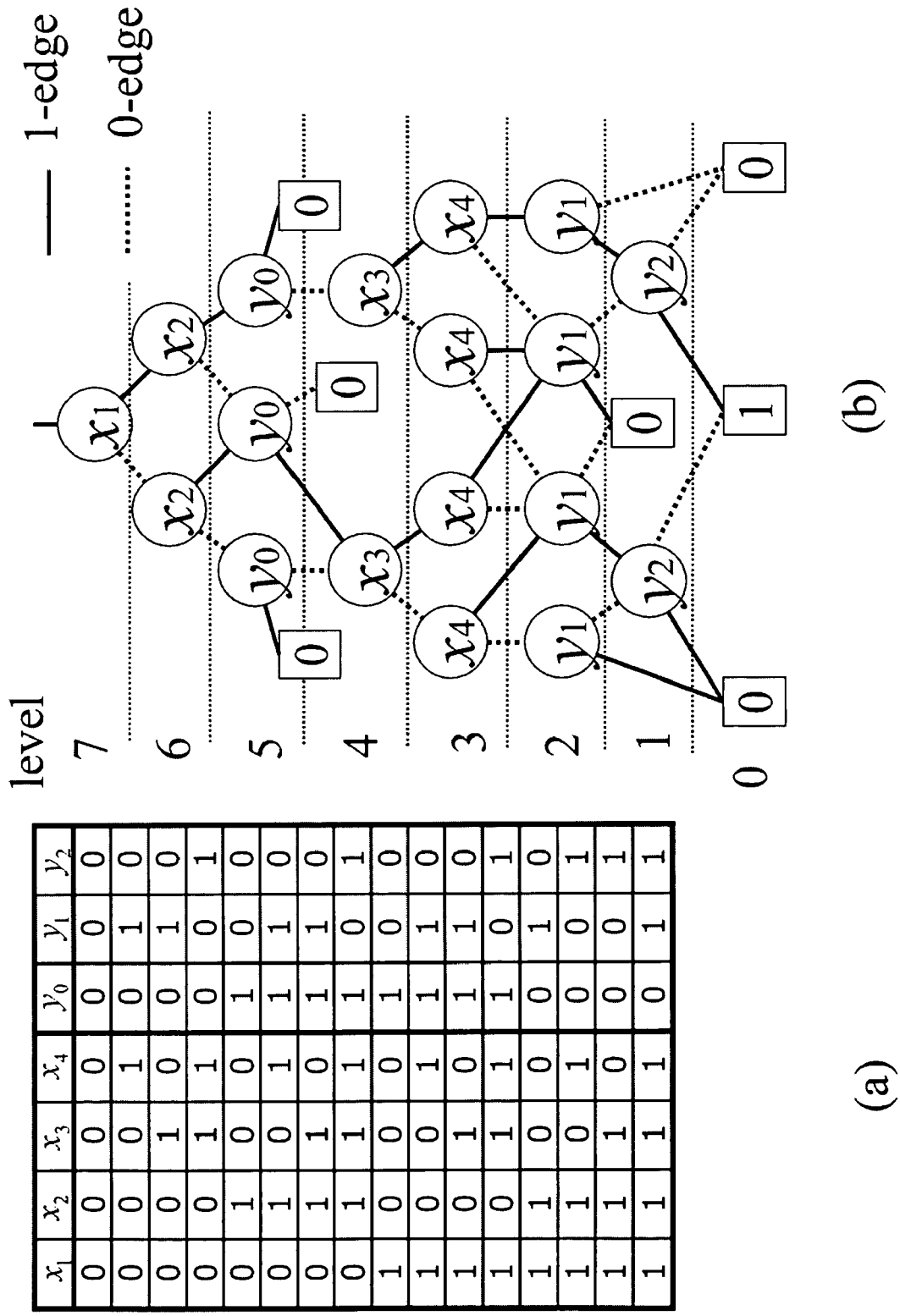
FIG. 1 is one example of the BDD_for_CF.

1, 1' "Device for Logic Synthesis"
2 "Means to Store the Logic Specification"
3 input device
4 output device
5 "Means to Decide the Ordering of Output Variables"
6 "Means to Decide the Ordering of All the Variables"
7 "Means to Generate BDDs"
8 "Means to Store Node Table"
9 "Means to Optimize the Ordering of Variables"
10 "Means to Find the Dividing Lines"
11 "Means to Reduce by Shorting"
12 "Means to Measure the Width of BDDs"
13 "Means to Compute the InterMediate Variables"
14 "Means to Generate LUTs"
15 "Means to Re-construct BDDs"
16 "Means to Store LUTs"
20 "Device for Reducing the Width of Graph"
21 "Means to Measure the Height of BDDs"
22 "Means to Find the Dividing Lines"
23 "Means to Generate Column Functions"
24 "Means to Store Column Functions"
25 "Means to Generate Compatible Edges"
26 "Means to Store Compatible Graphs"
27 "Means to Generate Cliques"
28 "Means to Store Clique Data"
29 "Means to Reconstruct Assigned BDD"

DETAILED DESCRIPTION OF EXEMPLARY EMBODIMENTS

In the following, first we will present important terminology used in this description, and then explain the basic principle of the invention, and finally we will explain the structure and operation of present invention.

[1] Definitions of Terminology

[Definition 1] (Support Variable)

If the function F depends on a variable x, then x is a support variable of F. The set of support variables of the function F is denoted by supp(F).
[End of Definition]

[Definition 2] (Completely Specified Function)

A Boolean variable is denoted by x, where x takes the values in B={0, 1}. Let X∈B$^n$ be a set of logic variables, where n is an arbitrary natural number. Then, the function F(X): B$^n$←B$^m$, where m is an arbitrary natural number, is a completely specified function. Especially when m is a natural number greater than or equal to 2, F is a completely specified multiple-output function. When m=1, F is a completely specified single-output function.
[End of Definition]

[Definition 3] (Incompletely Specified Function)

If the value of a function f(X) can be either 0 or 1, then the value is don't care, and denoted by d. A logic function F(X): B$^n$←{0,1,d}$^m$, where m is an arbitrary natural number, of a logic variable X∈B$^n$, where n is an arbitrary natural number, is an incompletely specified function. Especially, when m is greater than or equal to 2, F is an incompletely specified multiple-output function. And, when m=1, F is an incompletely specified single-output function.
[End of Definition]

[Definition 4] (A Partition of Variables)

Let $X=(x_1, x_2, \ldots, x_n)$ be the set of the input variables of a logic function. A set of variables of X is denoted by {X}. When $\{X_1\}\cup\{X_2\}=\{X\}$, and $\{X_1\}\cap\{X_2\}=\phi$, $X=(X_1,X_2)$ is a partition of X. The number of variables in X is denoted by |X|.
[End of Definition]

[Definition 5] (Decomposition Chart)

For a logic function F(X), let $X=(X_1,X_2)$ a partition of X, where $|X_1|=n_1$ and $|X_2|=n_2$. Then, the decomposition chart has $2^{n_1}$ columns and $2^{n_2}$ rows, and each row and each column has a label with binary code, and the corresponding element of the chart is equal to the truth value of F. In this case, $X_1$ denotes the bound variables, and $X_2$ denotes the free variables. Note that each column and each row of the decomposition chart have all possible patterns with $n_1$ bits and $n_2$ bits, respectively.
[End of Definition]

[Definition 6] (Column Multiplicity and Column Function)

The number of different column patterns in a decomposition chart is the column multiplicity, and is denoted by μ. The function represented by a column pattern is a column function.
[End of Definition]

EXAMPLE 1

Table 1 shows a decomposition chart of a 4-input 1-output incompletely specified function. Since all the column patterns are different, the column multiplicity μ is 4.
[End of Example]

TABLE 1

| | | $X_1 = \{x_1, x_2\}$ | | | |
|---|---|---|---|---|---|
| | | 00 | 01 | 10 | 11 |
| $X_2 = \{x_3, x_4\}$ | 00 | 0 | 0 | d | 1 |
| | 01 | 1 | 1 | d | d |

TABLE 1-continued

| | $X_1 = \{x_1, x_2\}$ | | | |
|---|---|---|---|---|
| | 00 | 01 | 10 | 11 |
| 10 | d | 1 | 0 | d |
| 11 | 0 | d | 0 | 0 |
| | $\Phi_1$ | $\Phi_2$ | $\Phi_3$ | $\Phi_4$ |

[Definition 7] (ON Function, OFF Function, and DC Function)

The sets of X that satisfy $f(X)=0, 1, d$, are the OFF set, the ON set, and the DC set, respectively. They are represented by $f^1(0)$, $f^1(1)$, and $f^1(d)$, respectively. Let $f(X)$ be an incompletely specified function of logic variable $X(\in B^n)$. The OFF function is the function where all the elements in the OFF set $f^1(0)$ are mapped to 1, and for other elements are mapped to 0, and is denoted by $f\_0$.

[Equation 1]

$$f\_0(X) = \begin{cases} 1 & (X \in f^{-1}(0)) \\ 0 & (\text{otherwise}) \end{cases} \quad (1)$$

The ON function is the function where all the elements in the ON set $f^1(1)$ are mapped to 1, and for other elements are mapped to 0, and is denoted by $f\_1$.

[Equation 2]

$$f\_1(X) = \begin{cases} 1 & (X \in f^{-1}(1)) \\ 0 & (\text{otherwise}) \end{cases} \quad (2)$$

The DC function is the function where all the elements in the DC set $f^1(d)$ are mapped to 1, and for other elements are mapped to 0, and is denoted by $f\_d$.

[Equation 3]

$$f\_d(X) = \begin{cases} 1 & (X \in f^{-1}(d)) \\ 0 & (\text{otherwise}) \end{cases} \quad (3)$$

The OFF function $f\_0$ and the ON function $f\_1$ are similarly defined when $f(X)$ is a completely specified function. Especially when $f(X)$ is a completely specified single-output function, we have the following relation:

[Equation 4]

$$f\_0 = \overline{f}(X), f\_1 = f(X) \quad (4)$$

[End of Definition]

[Definition 8] (Characteristic Function of a Completely Specified Function)

Let $X=(x_1, x_2, \ldots, x_n) \in B^n$ be a set of the input variables, and let $F(X)=(f_0(X), f_1(X), \ldots, f_{m-1}(X))$ be a completely specified multiple-output function, where m is a natural number. Then, the function $\chi(X,Y)$ defined as Eq. (5) is a characteristic function of a multiple-output logic function F, (non-patent literature 14 reference), where $Y=(y_0, \ldots, y_{m-1})$ $(m \in I,$ I is set of integer) denotes the set of output variables in.

[Equation 5]

$$\chi(X, Y) = \bigwedge_{i=0}^{m-1} (y_i \equiv f_i(X)) \quad (5)$$

[End of Definition]

The characteristic function of an n-input m-output function is a two-valued logic function of (n+m) variables. It has the input variables $x_i$ (i=1, 2, \ldots, n) and output variables $y_j$ that correspond to the outputs $f_j$ (j=0, 1, \ldots, m-1). Let $B=\{0, 1,\}$ and $X \in B^n$ and $F(X)=(f_0(X), f_1(X), \ldots, f_{m-1}(X)) \in B^m$. If $Y \in B^m$, then the value of the characteristic function $\chi(X,Y)$ for a multiple-output logic function F(X) is shown as Eq. (6).

[Equation 6]

$$\chi(X, Y) = \begin{cases} 1 & (Y = F(X)) \\ 0 & (Y \neq F(X)) \end{cases} \quad (6)$$

The characteristic function of a completely specified multiple-output function represents the set of valid combinations of the inputs and outputs. By renaming the symbol as Eq. (7), the characteristic function $\chi$ can be represented as Eq. (8).

[Equation 7]

$$f_{i\_0}(X) = \overline{f}_i(X), f_{i\_1}(X) = f_i(X) \quad (7)$$

$$\chi(X, Y) = \bigwedge_{i=0}^{m-1} (\overline{y}_i \cdot f_{i\_0} \vee y_i \cdot f_{i\_1}) \quad (8)$$

[Equation 8]

$$\chi(X, Y) = \bigwedge_{i=0}^{m-1} (\overline{y}_i \cdot f_{i\_0} \vee y_i \cdot f_{i\_1}) \quad (8)$$

On the other hand, in the case of an incompletely specified function, when the value of the function is don't care, it can be 0 or 1. Thus, the characteristic function takes the value 1 even if the values of the output variables $y_i$ is 0 or 1. Therefore, we have the following relation for the function that represents the don't care(s) inputs $f_{i\_d}$. Hence, for the functions that represents the DC inputs, we have the following relation:

[Equation 9]

$$\overline{y}_i(f_{i\_0} \vee f_{i\_d}) \vee y_i(f_{i\_1} \vee f_{i\_d}) = \overline{y}_i f_{i\_0} \vee y_i f_{i\_1} \vee f_{i\_d} \quad (9)$$

From Eq. (8) and Eq. (9), we can extend the characteristic function for a completely specified multiple-output function into the characteristic function $\chi$ for an incompletely specified function as follows:

[Definition 9] (Characteristic Function for an in Completely Specified Function)

Let $F(X)=(f_0(X), f_1(X), \ldots, f_{m-1}(X))$ be an incompletely specified multiple-output function with input variables $X=(x_1, x_2, \ldots, x_n)$ $(\in B^n)$. Then, the function $\chi(X,Y)$ defined by Eq. (10) is the characteristic function of an incompletely specified multiple-output function F. Where $Y=(y_0, \ldots, y_{m-1})$ are variables that denote outputs.

[End of Definition]

[Equation 10]

$$\chi(X, Y) = \bigwedge_{i=0}^{m-1} \{\overline{y}_i f_{i\_0} \vee y_i f_{i\_1} \vee f_{i\_d}\} \quad (10)$$

EXAMPLE 2

Consider the 4-input 2-output incompletely specified function shown in Table 2.

TABLE 2

| $x_1$ | $x_2$ | $x_3$ | $x_4$ | $f_0$ | $f_1$ |
|---|---|---|---|---|---|
| 0 | 0 | 0 | 0 | d | 1 |
| 0 | 0 | 0 | 1 | d | 1 |
| 0 | 0 | 1 | 0 | 0 | 0 |
| 0 | 0 | 1 | 1 | 0 | 0 |
| 0 | 1 | 0 | 0 | d | d |
| 0 | 1 | 0 | 1 | d | d |
| 0 | 1 | 1 | 0 | 1 | 0 |
| 0 | 1 | 1 | 1 | 1 | 1 |
| 1 | 0 | 0 | 0 | 0 | 1 |
| 1 | 0 | 0 | 1 | 0 | 1 |
| 1 | 0 | 1 | 0 | 1 | 0 |
| 1 | 0 | 1 | 1 | 1 | 0 |
| 1 | 1 | 0 | 0 | 1 | d |
| 1 | 1 | 0 | 1 | 1 | d |
| 1 | 1 | 1 | 0 | d | 0 |
| 1 | 1 | 1 | 1 | d | 1 |

From Table 2, the OFF function, the ON function, and the DC function are represented as follows:

From Table 2, the OFF function, the ON function, and the DC function are represented as follows:

[Equation 11]

$f_{0\_0} = \overline{x}_1\overline{x}_2 x_3 \vee x_1\overline{x}_2\overline{x}_3$ $f_{0\_1} = \overline{x}_1 x_2 x_3 \vee x_1\overline{x}_2 x_3 \vee x_1 x_2 \overline{x}_3$ $f_{0\_d} = \overline{x}_1\overline{x}_3 \vee x_1 x_2 x_3$ $f_{1\_0} = \overline{x}_1\overline{x}_2 x_3 \vee x_1\overline{x}_2 x_3 \vee x_2 x_3 \overline{x}_4$ $f_{1\_1} = \overline{x}_2\overline{x}_3 \vee x_2 x_3 x_4$ $f_{1\_d} = x_2 \overline{x}_3$ (11)

Thus, the characteristic function of this function is given as follows:

[Equation 12]

$\chi = \{\overline{y}_0(\overline{x}_1\overline{x}_2 x_3 \vee x_1\overline{x}_2\overline{x}_3) \vee y_0(\overline{x}_1 x_2 x_3 \vee x_1\overline{x}_2 x_3 \vee x_1 x_2\overline{x}_3) \vee (\overline{x}_1\overline{x}_3 \vee x_1 x_2 x_3)\} \cdot \{\overline{y}_1(\overline{x}_1\overline{x}_2 x_3 \vee x_1\overline{x}_2 x_3 \vee x_2 x_3\overline{x}_4) \vee y_1(\overline{x}_2\overline{x}_3 \vee x_2 x_3 x_4) \vee (x_2\overline{x}_3)\}$ (12)

[End of Example]

[Definition 10] (Binary Decision Diagram for Characteristic Function)

The Binary Decision Diagram for Characteristic Function (BDD_for_CF) for a multiple-output logic function $F(X)=(f_0(X), f_1(X), \ldots, f_{m-1}(X))$ is the binary decision diagram (BDD) that represents the characteristic function $\chi(X,Y)$ for the multiple-output logic function $F(X)$, where the root node is in the highest position, and the variable $y_j$ is in the lower position than the support variables $x_i \in \text{supp}(f_j)$. Note that $\text{supp}(f_j)$ denotes the set of variables that influence $f_j$ (See non-patent literature 13, 14).

[End of Definition]

EXAMPLE 3

FIG. 1(b) is the BDD_for_CF that represents the multiple-output logic function in the truth table of FIG. 1(a). Where, a circle denotes a variable node, while a square denotes a terminal node that shows the value of the characteristic function.

[End of Example]

[Definition 11] (Deletion by Shorting)

In a BDD_for_CF, among the edges that go out from the the nodes $y_j (\in Y)$ for the outputs, remove the edges that are incident to the constant 0, and from the parent node of $y_j$, connect direct by an edge to the child node of $y_j$ that is non-constant 0 node. Apply this operation to all the nodes that represent $y_j$. This operation is the removal of the output variable $y_i$ by shorting.

[End of Definition]

Figure 2:
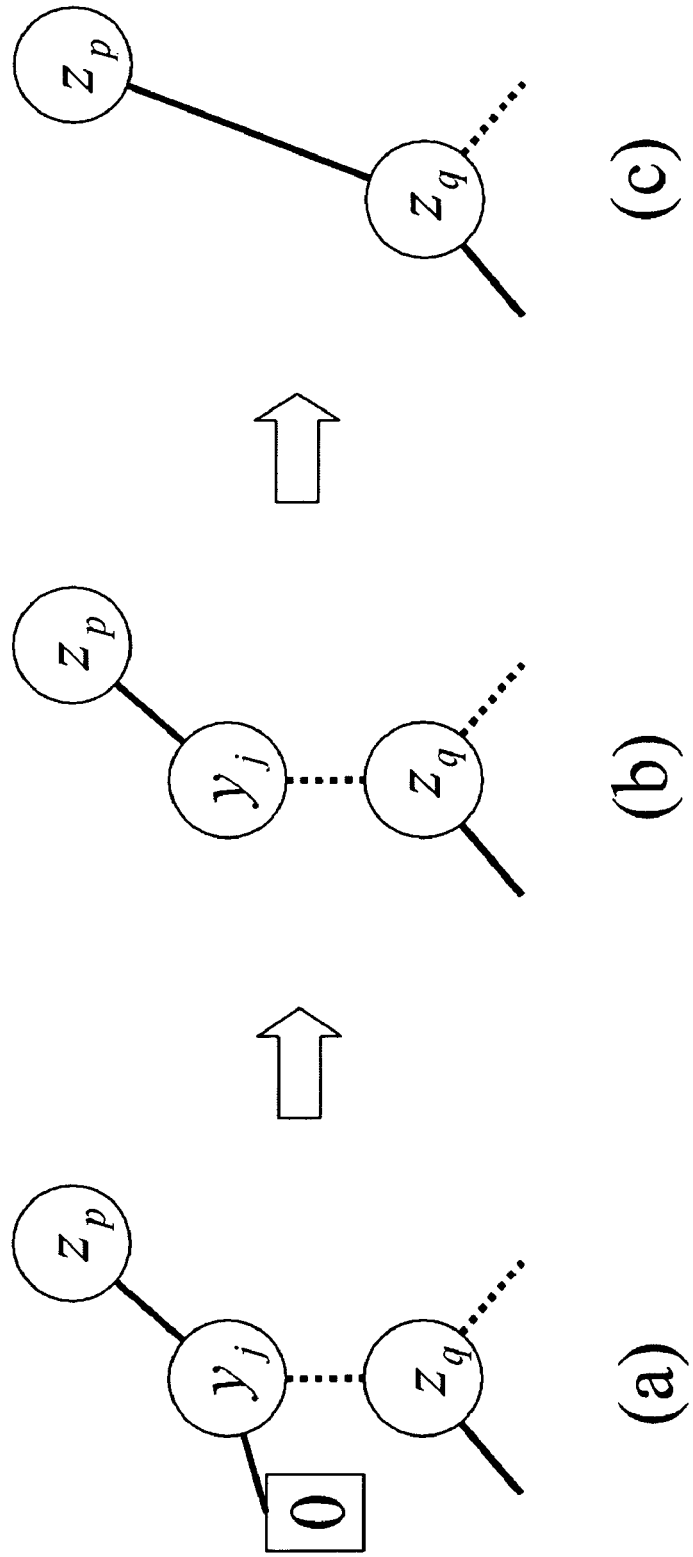
FIG. 2 is the explanation drawings of shorting operation.

We will explain the deletion by shorting operation by using FIG. 2. As shown in FIG. 2(a), consider the node representing the output $y_j(\in Y)$. Let $z_p$ be the parent node of $y_j$, and $z_q$ be a child node of $y_j$. First, delete the node that is connected to the constant 0 terminal node of the characteristic function. Then, we have a diagram as shown in FIG. 2(b). Next, by connecting directly from the parent node $z_p$ of $y_j$ to a child node $z_q$ by an edge, we have the graph shown in FIG. 2(c). The deletion by shorting for the node $y_j$, we perform such operations for all the output nodes that represent $y_j$ in the BDD_for_CF.

[Definition 12] (Width of a BDD_for_CF)

Let $(z_{n+m}, z_{n+m-1}, \ldots, z_1)$ be the variable ordering of the BDD_for_CF, where $z_{n+m}$ corresponds to the root node. The width of the BDD_for_CF at height k is the number of edges between variable $z_k$ and variable $z_{k+1}$. Where the edges that point the same nodes are counted as one, and ignore the edges that connect to the constant 0. We also define that the width of a BDD_for_CF at height 0 be one.

[End of Definition]

The height of the node for the variable $z_i$ is the order of the variables counted from the terminal nodes, where the height of the terminal node is 0. That is, in the binary decision diagram that has n+m variables $\{z_i; i=1, \ldots, n+m\}$. Let the variable ordering from the root nodes to the terminal node be $P=(z_{n+m}, z_{n+m-1}, \ldots, z_1)$. Then the height of the node of the variable $z_i$ is i. In this case, for variables $z_i$ and $z_j$, if i>j, then the variable $z_i$ is in the higher position than the variable $z_j$. Or, the variable $z_j$ is in the lower position than the variable $z_i$. Also, the width of the BDD at the height i is the number of edges between variable $z_i$ and variable $z_{i+1}$. In this case, the edges pointing to the same nodes are counted as one, and the edges pointing the constant 0 are ignored.

EXAMPLE 4

In the BDD_for_CF in FIG. 1(b), the heights of the terminal nodes (i.e., the nodes with the value of the characteristic function) are 0, the height of the variable $y_2$ is 1, the height of the variable $y_1$ is 2, the height of the variable $x_4$ is 3, . . . , and the height of the variable $x_1$ is 7. Also, the width at the height 1 is 2, since the number of edges from the nodes of the variable $y_1$ to the node for the variable $y_2$ is 2. (Note that the edges that are incident to the terminal node 0 are ignored). Also, width at the height 2 is 4, since the number of edges from the nodes for the variable $x_4$ to the nodes for the variable $y_1$ is 4.

[End of Example]

In the functional decomposition using BDDs, the width of the BDD is equal to the column multiplicity μ. ([Note] When we consider the column multiplicity, we consider the column multiplicity of the original multiple-output function (See the the decomposition chart in Table 3). When we consider the BDD, we use the characteristic function for the multiple-output function. In the case of a single-output logic function, the output variables is always in the bottom of the BDD. The upper part of the BDD that leads to the constant 1 is almost the same as the BDD of the original function.) In a partition of variables $(X_1, X_2)$, the nodes for the variables $X_2$ that are directly connected to the nodes for the variable $X_1$, correspond to the column patterns of the decomposition chart.

In the functional decomposition, we represent it as $f(X_1, X_2) = g(h(X_1), X_2)$.

Figure 3:
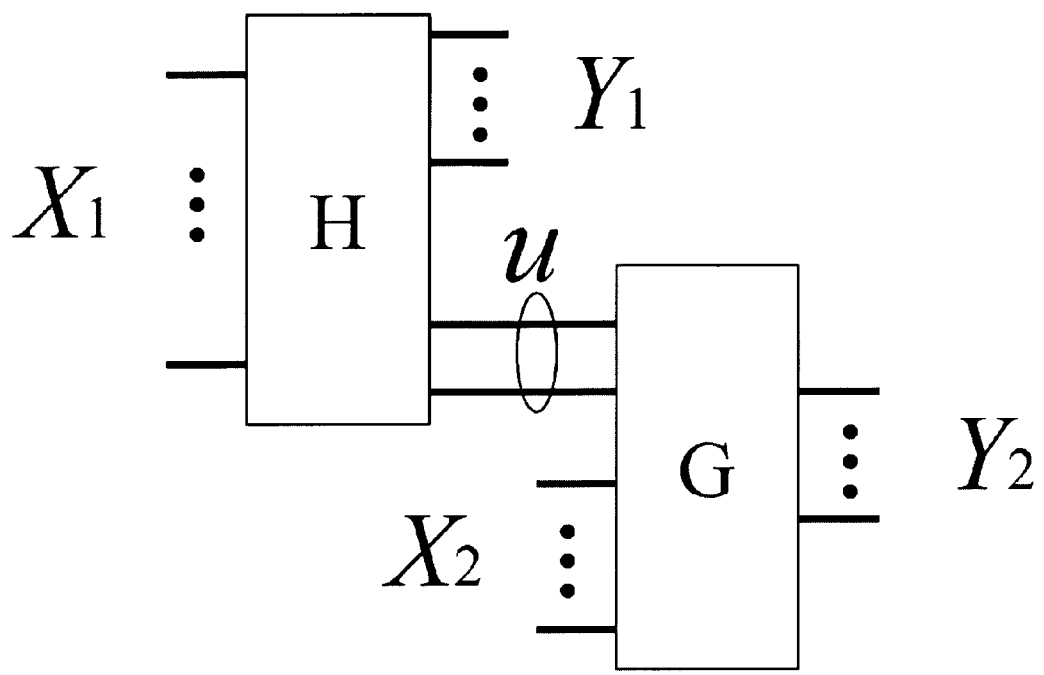
FIG. 3 is the structure diagram of logic circuit obtained by decomposing a multiple-output logic function into two.

[Equation 13]

$$\lceil \log_2 \mu \rceil < |X_1| \qquad (13)$$

we implement the network that generate $h(X_1)$ where $X_1$ are inputs and the codes for column functions are outputs, and the network for $g(h,X_2)$, independently (see FIG. 3). The fewer the total number of inputs of the circuit after decomposition, the more effective the decomposition is. By reducing the width of the BDD, we can reduce the column multiplicity, and increase the effectiveness of the functional decomposition.

[Definition 13] (Assignment of Constant Values to the don't Care(s))

Let $F^{(1)} = (f_0^{(1)}, f_1^{(1)}, \ldots, f_{m-1}^{(1)})$ and $F^{(2)} = (f_0^{(2)}, f_1^{(2)}, \ldots, f_{m-1}^{(2)})$ be two incompletely specified column functions. In this case, for each element of $F^{(1)}$ and $F^{(2)}$, where $f_i^{(1)} = d$ or $f_i^{(2)} = d$, doing the following logical operation $f_i^{(1)} \cdot f_i^{(2)}$ is the assignment of constant values to the don't care(s).

[Equation 14]

$$f_i^{(1)} \cdot f_i^{(2)} = \begin{cases} 1 & (\text{if } [f_i^{(1)} = 1 \land f_i^{(2)} = d] \lor [f_i^{(1)} = d \land f_i^{(2)} = 1]) \\ 0 & (\text{if } [f_i^{(1)} = 0 \land f_i^{(2)} = d] \lor [f_i^{(1)} = d \land f_i^{(2)} = 0]) \\ d & (\text{if } f_i^{(1)} = d \land f_i^{(2)} = d) \end{cases} \qquad (14)$$

[End of Definition]

[Definition 14] (Compatibility of Functions)

Two incompletely specified function $f_a$ and $f_b$ are compatible if they can be the same function by assigning the constants to don't care(s). And, it is denoted by $f_a \sim f_b$.

[End of Definition]

[Lemma 1]

Let the characteristic functions of three incompletely specified functions be $\chi_a, \chi_b,$ and $\chi_c$. If $\chi_a \sim \chi_b$ and $\chi_c = \chi_a \chi_b$, then $\chi_c \sim \chi_a$ and $\chi_c \sim \chi_b$ holds.

[End of Lemma]

EXAMPLE 5

In the decomposition chart in Table 1, the pair of column functions $\{\Phi_1, \Phi_2\}, \{\Phi_1, \Phi_3\}, \{\Phi_3, \Phi_4\}$ are compatible. By making the logical product of columns $\Phi_1$ and $\Phi_2$, and replace them with $\Phi_1^*$ and $\Phi_2^*$, respectively. Also, by making the logical product of columns $\Phi_3$ and $\Phi_4$, and replace them with $\Phi_3^*$ and $\Phi_4^*$, we have Table 3, and the column multiplicity of μ=2.

[End of Example]

TABLE 3

|  |  | $X_1 = \{x_1, x_2\}$ | | | |
|---|---|---|---|---|---|
|  |  | 00 | 01 | 10 | 11 |
| $X_2 = \{x_3, x_4\}$ | 00 | 0 | 0 | 1 | 1 |
|  | 01 | 1 | 1 | d | d |
|  | 10 | 1 | 1 | 0 | 0 |
|  | 11 | 0 | 0 | 0 | 0 |
|  |  | $\Phi_1^*$ | $\Phi_2^*$ | $\Phi_3^*$ | $\Phi_4^*$ |

[Definition 15] (Compatible Graph)

The graph where each node corresponds to the function, and an edge denotes a pair of compatible functions is the compatible graph.

[End of Definition]

[2] The Basic Principle of Present Invention (1) Reduction of Width for the BDD_for_CF Representing an Incompletely Specified Multiple-Output Logic Function First, we explain the method to reduce the width of the BDD_for_CF representing an incompletely specified multiple-output logic function. A method is to consider one node of the BDD_for_CF, if the two child are compatible, then merge the children. We can repeat this procedure to reduce the number of nodes. Algorithm 1 is a description of this method.

[Algorithm 1]

From the root node of the BDD_for_CF, do the following process recursively:

(1) If the node v do not involve the don't care, then terminate;

(2) Check if two child nodes $v_0$ and $v_1$ of v are compatible; If they are incompatible, recurse for $v_0$ and $v_1$; If they are compatible, replace $v_0$ and $v_1$ with $v_{new}$.

Recurse the operation to $v_{new}$. Let $\chi_0, \chi_1,$ and $\chi_{new}$ be characteristic functions for the nodes, $v_0, v_1,$ and $v_{new}$, respectively. Then, we have the relation $\chi_{new} = \chi_0 \chi_1$.

EXAMPLE 6

Table 4 shows the truth table of a 4-input 2-output incompletely specified function.

TABLE 4

| $x_1$ | $x_2$ | $x_3$ | $x_4$ | $f_0$ | $f_1$ |
|---|---|---|---|---|---|
| 0 | 0 | 0 | 0 | d | 1 |
| 0 | 0 | 0 | 1 | d | 1 |
| 0 | 0 | 1 | 0 | 0 | 0 |
| 0 | 0 | 1 | 1 | 0 | 0 |
| 0 | 1 | 0 | 0 | d | d |
| 0 | 1 | 0 | 1 | d | d |
| 0 | 1 | 1 | 0 | 1 | 0 |
| 0 | 1 | 1 | 1 | 1 | 1 |
| 1 | 0 | 0 | 0 | 0 | 1 |
| 1 | 0 | 0 | 1 | 0 | 1 |
| 1 | 0 | 1 | 0 | 1 | 0 |
| 1 | 0 | 1 | 1 | 1 | 0 |
| 1 | 1 | 0 | 0 | 1 | d |
| 1 | 1 | 0 | 1 | 1 | d |
| 1 | 1 | 1 | 0 | d | 0 |
| 1 | 1 | 1 | 1 | d | 1 |

Figure 4:
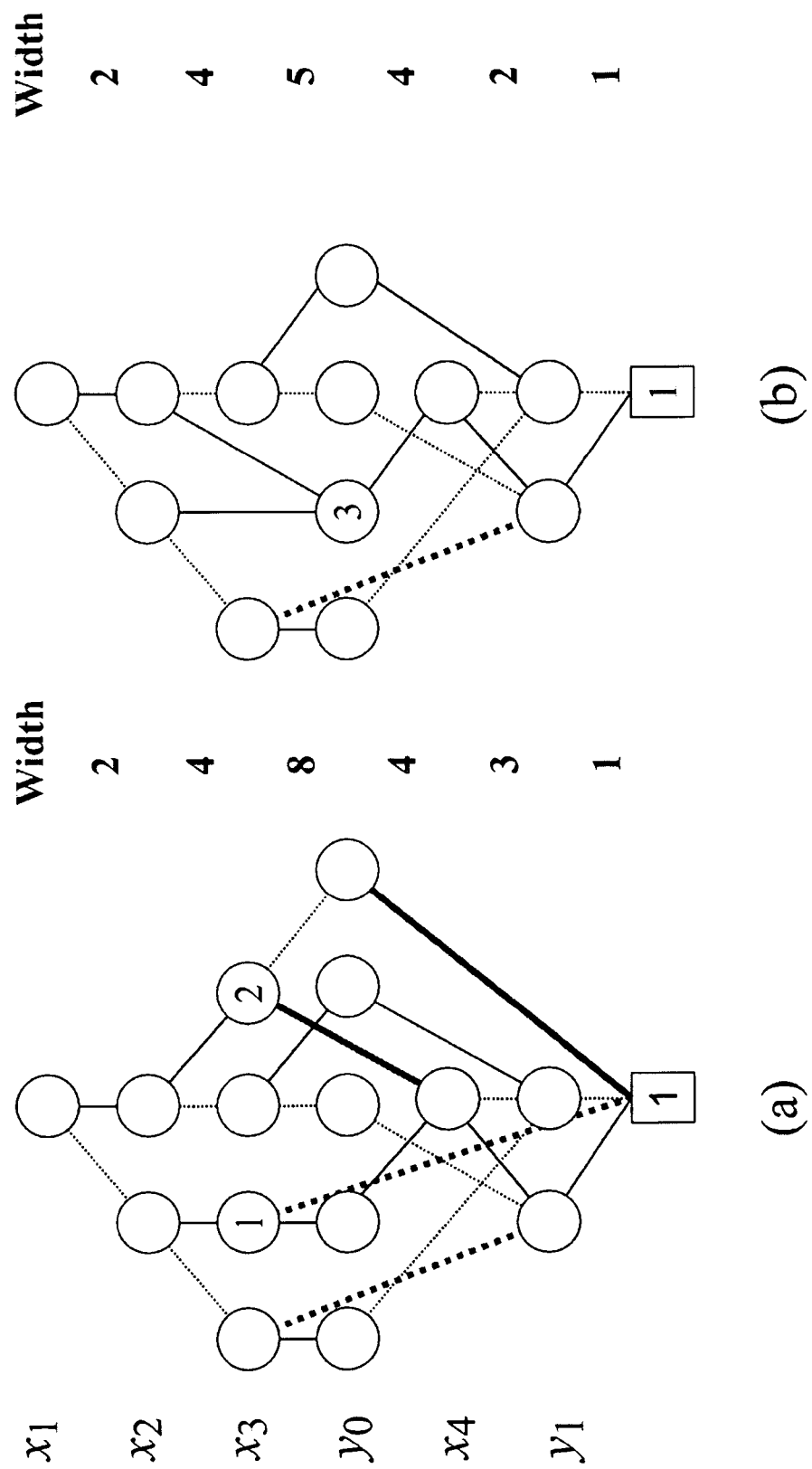
FIG. 4 is one example of reduction in width by algorithm 1 to BDD_for_CF of the incompletely specified multiple-output function representing the truth table in Table 4.

FIG. 4(a) shows the BDD_for_CF of the incompletely specified multiple-output function representing the truth table in Table 4. In FIG. 4(a), nodes 1 and 2 have compatible child nodes. By applying Algorithm 1 to the BDD_for_CF, we have the BDD shown in FIG. 4(b). In this function, the node that replace node 1, and the node that replace nodes 2 will be the same, the nodes 1 and 2 are replaced with node 3 in FIG. 4(*b*). In FIG. 4, the column headed width that are located in the right-hand side of the BDD_for_CF, shows the width of each height. After the operation, the maximum width is reduced from 8 to 5, and the number of non-terminal nodes is reduced from 15 to 12.

[End of Example]

The method to reduce the width of graph in Algorithm 1 has an effective to reduce the number of nodes locally. However, this method only consider the compatibility of child nodes of a node, and not so effectively for global reduction of the width of BDD_for_CFs. Thus, in the next we will show a method directly reduce the width of graphs, that considers all the compatibility of the sub-functions corresponding to the width of the BDD_for_CF, and then perform matching.

In a functional decomposition, by checking the compatibility of all the pairs of column functions, and then by making the compatible graph, and finally by covering nodes with the minimum complete subgraphs (cliques), we can minimize the column multiplicity $\mu$. However, this node covering problem is known to be NP-hard (See non-patent literature 16). Thus, we are going to use the following heuristic method represented by Algorithm 2:

[Algorithm 2] (Node Covering by Clique Set)

Let $S_a$ be a set of all the nodes in the given compatible graph. Let C be the set of node sets. From $S_a$, remove the nodes that are not connected with any edge, and make a set of nodes (clique) with one element, and let it be an element of C.

While $S_a \neq \phi$, iterate the following operations (1)~(3):

(1) Find the nodes that have the smallest edges in $S_a$. Let $v_i$ be such node. Let $S_i \rightarrow \{v_i\}$. Among $S_a$, let $S_b$ be the set of nodes that are connected to $v_i$;

(2) While $S_b \neq \phi$, iterate the following operations (a), (b);
   (a) $S_b$ Find the node $v_j$ that has the minimum number of edges, and let $S_i \rightarrow S_i \cup \{v_j\}$, and $S_b \rightarrow S_b - \{v_j\}$;
   (b) From $S_b$, remove the nodes that are not connected to $v_j$;

(3) Let $C \rightarrow C \cup \{S_i\}$ and $S_a \rightarrow S_a - S_i$.

By using the node cover of clique set on the compatible graph, we can reduce the width of the BDD_for_CF with the following Algorithm 3.

[Algorithm 3] (Reduction of Width of the BDD_for_CF)

Let t be the height of the given BDD_for_CF, let the height of the constant nodes be 0. For the height from t−1 to 1, iterate the following operations:

(1) Make the set of all the column functions for each height;

(2) Make the compatible graph from the set of column functions;

(3) Perform the node covering by a clique set (for example, Algorithm 2);

(4) For each clique, assign constants to the don't care(s) in the column functions corresponding to the nodes that are covered by the clique, and make a single column function;

(5) Replace all the column functions by the assigned column function produced in (4), re-construct the BDD_for_CF.

By using this method to reduce the width of graph, we can find the assignment to the constants to the don't care(s) optimally, by evaluating globally the compatibility of sub functions of the characteristic function. Thus, we can efficiently reduce the width of the BDD_for_CF.

(2) Functional Decomposition of the Objective Logic Function, and Generation of LUT Networks Next, we will explain the principle of the method to synthesis the LUT logic circuit from the BDD_for_CF. The synthesis of the LUT logic circuit in present invention uses partition of the BDD_for_CF and the deletion by shorting. When two networks are realized by partitioning the BDD_for_CF, the number of lines that connect two networks can be derived from Theorem 1:

[Theorem 1]

Let $X_1$ and $X_2$ be the set of the input variables, and $Y_1$ and $Y_2$ be the set of output variables. Let $(X_1, Y_1, X_2, Y_2)$ be the variable ordering of the BDD_for_CF, and let W be the width of the BDD_for_CF at the height $|X_2|+|Y_2|$. Where, edges to constant 0 from the nodes representing outputs are ignored. When we realize the multiple-output logic function by the network in FIG. 3, the necessary and sufficient number u of connections between two networks H and G is give by Eq. (15).

[Equation 15]

$$u = \lceil \log_2 W \rceil \qquad (15)$$

[End of Theorem]

(Proof)

From the method of realization for the BDD_for_CF, it is clear that the output functions $Y_1$ and $Y_2$ are represented by network in FIG. 3. In the BDD_for_CF, the deletion by shorting of the node for the output $Y_1$, will make the BDD_for_CF represent the function other than $Y_1$. With this operation, the width of the BDD_for_CF does not increase. Let W be the width of BDD at the height $|X_2|+|Y_2|$. In the decomposition chart of $g(h(X_1), X_2)$, the column multiplicity is equal to W. Thus, the sufficient number of interconnections between networks H and G is

[Equation 16]

$$\lceil \log_2 W \rceil \qquad (16)$$

On the other hand, since the column multiplicity of the decomposition chart is W, we need at least the number given by Eq. (16) for interconnections between two blocks.

(Q.E.D.)

By using the partition of the BDD_for_CF, and the deletion by shorting, and the above-mentioned [Theorem 1], we can decompose the objective logic function as follows:

First, let $(X_1, Y_1, X_2, Y_2)$, $Y_1=(y_0, y_1, \ldots, y_{k-1})$, $Y_2=(y_k, y_{k+1}, \ldots, y_{m-1})$ be the ordering of the variables for the BDD_for_CF representing the objective logic function $F=(f_0, f_1, \ldots, f_{m-1})$. In this case, $y_j=f_j(X_1)$ (j=0, 1, . . . , k−1) can be directly implemented by the network H shown in FIG. 3.

Figure 5:
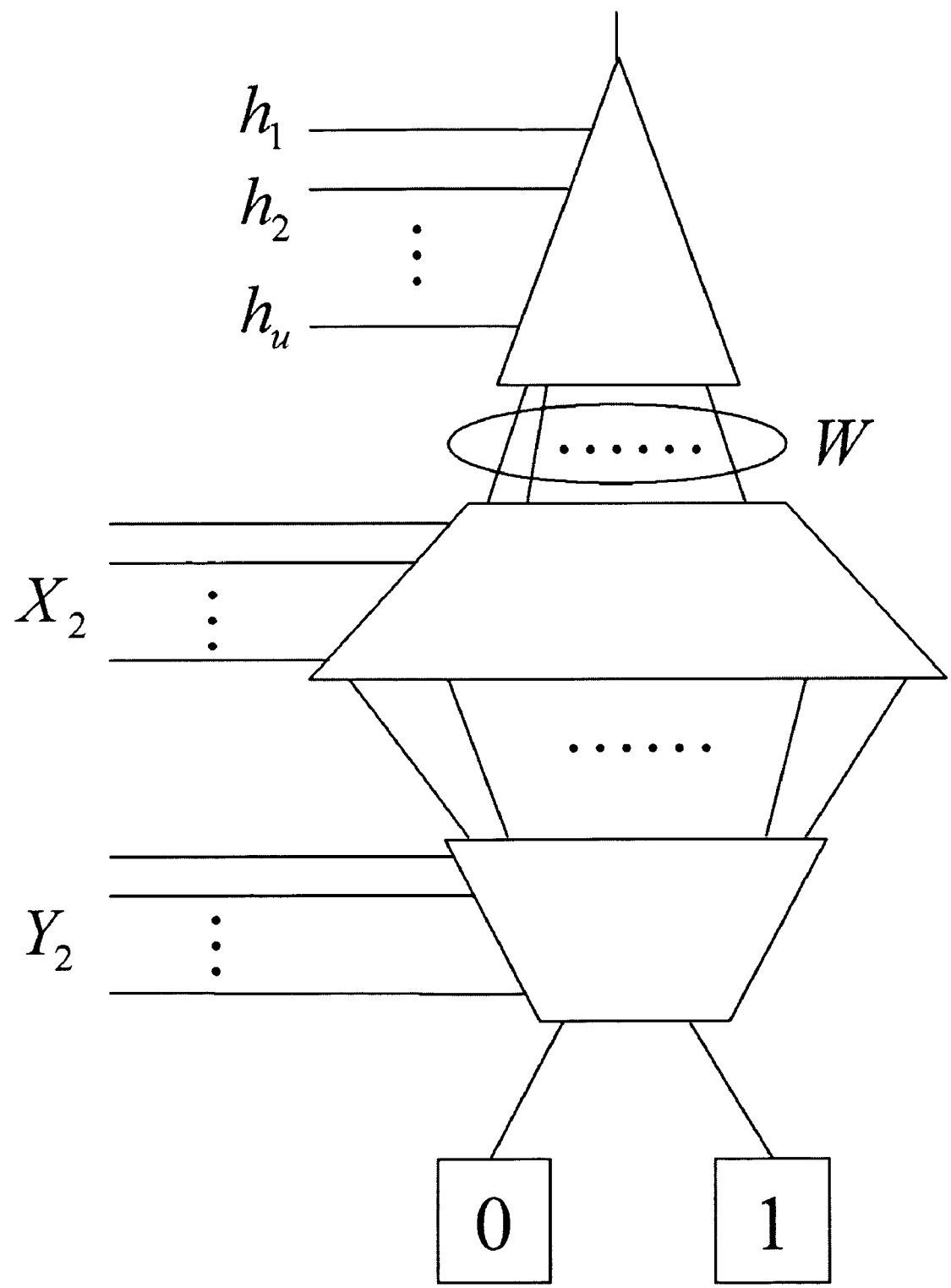
FIG. 5 is the structure diagram of BDD_for_CF after the deletion by shorting.

Let W be the width of the BDD_for_CF at the height $|X_2|+|Y_2|$. Assign the different binary numbers of u bits (u is given by Eq. (15)) to W edges. Let $h_1, h_2, \ldots, h_u$ be the functions realized by the edges connecting two blocks H and G. The output $Y_2$ of block G can be represented as a logic function of $(h_1, h_2, \ldots, h_u, X_2)$, and the BDD_for_CF can be represented as FIG. 5.

EXAMPLE 7

Figure 6:
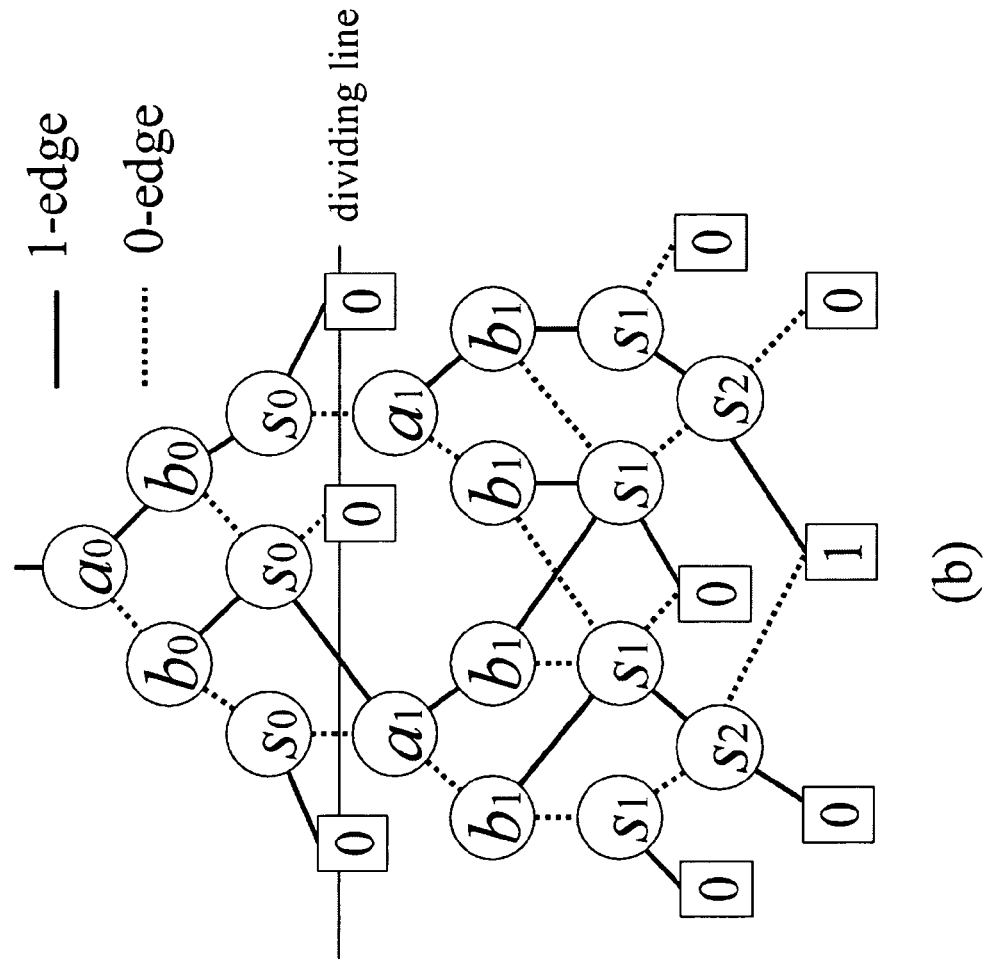
FIG. 6 is the truth table and the BDD_for_CF of ADR2.

In This Example, we illustrate the design of binary adder (ADR2) that adds two 2-bit binary numbers, by using the functional decomposition with intermediate outputs. The input-output relation of ADR2 can be defined as Eq. (17). Thus, $s_0, s_1, s_2$ can be represented by Eq. (18). And the truth table is shown in FIG. 6(*a*).

[Equation 17]

$$\begin{array}{r}a_1\ a_0\\ +)\ \underline{b_1\ b_0}\\ s_2\ s_1\ s_0\end{array} \quad (17)$$

[Equation 18]

$$s_0 = a_0 \oplus b_0$$

$$s_1 = a_0 b_0 \oplus (a_1 \oplus b_1)$$

$$s_2 = a_0 b_0 (a_1 \vee b_1) \vee a_1 b_1 \quad (18)$$

Let $X_1=(a_0, b_0), Y_1=(s_0), X_2=(a_1, b_1),$ and $Y_2=(s_1, s_2)$ be the partition of the variables. In this case, the variable ordering is $(X_1, Y_1, X_2, Y_2)=(a_0, b_0, s_0, a_1, b_1, s_1, s_2)$. So, we have the BDD_for_CF of the ADR2 shown in FIG. 6(b). Partition the variables as $Z=(Z_A, Z_B), Z_A=(X_1, Y_1), Z_B=(X_2, Y_2),$ realize $Z_A$ by the network H in FIG. 3, realize $Z_B$ by the network G in FIG. 3. Then, the width W of the BDD_for_CF at the height $|Z_B|$ is two. Thus, by Eq. (15), only one line is sufficient between networks H and G. The output $s_0$ can be represented as the function of $X_1$.

Figure 7:
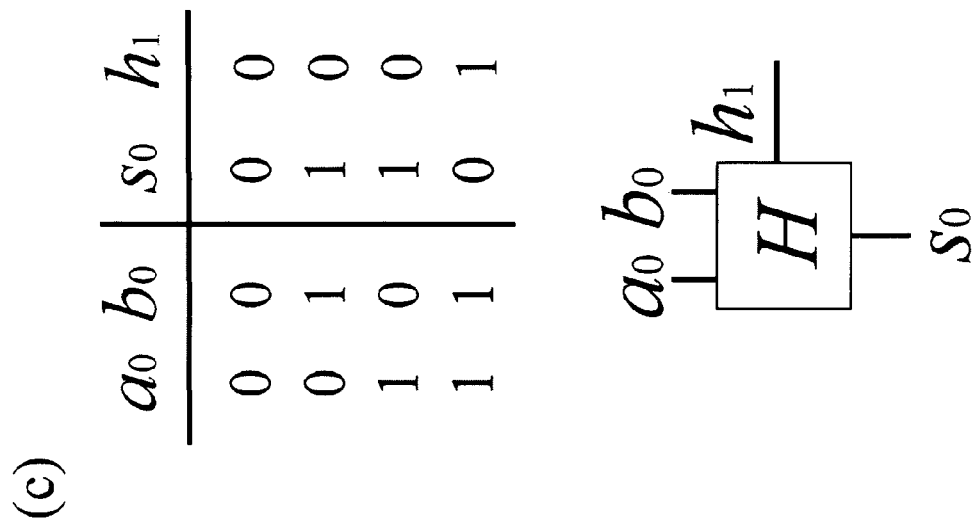
FIG. 7 is the explanation drawings of the process that transforms the sub-graph including the root node into an LUT, when the BDD for characteristic function representing ADR2 are partitioned into two.
Figure 7:
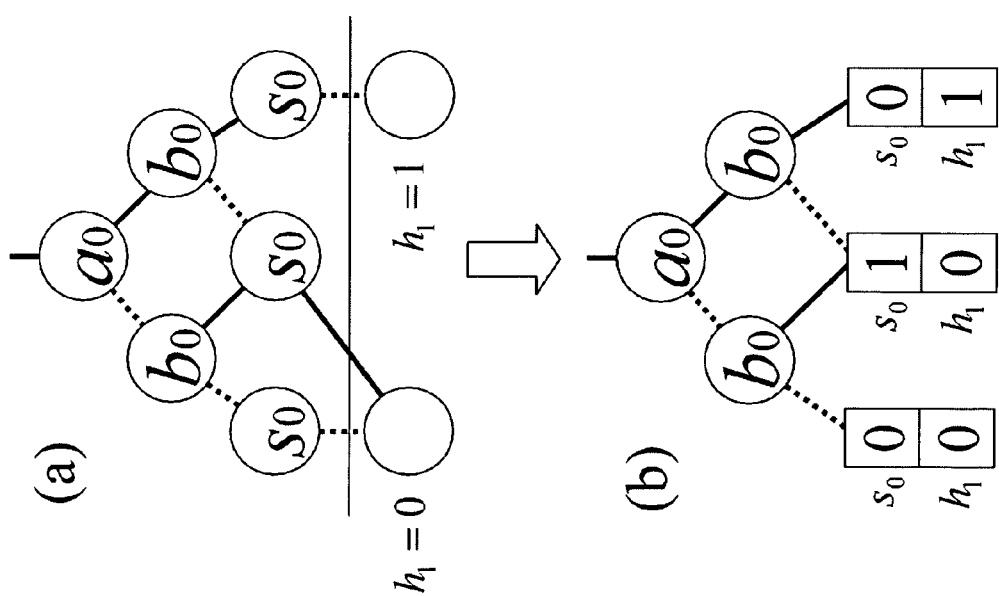

Also, the BDD_for_CF realized by the tuple $Z_A$ can be represented as FIG. 7(a). This BDD is obtained by removing the root node side (upper part) above the partition line of the BDD_for_CF in FIG. 6. In FIG. 7(a), the edges connecting to the constant 0 of the characteristic function are omitted. Since only one line connects two networks H and G, in the terminal nodes of graph in FIG. 7(a), we introduce an intermediate variable $h_1$, and assign 1 bit to each terminal node. Note that we can assign an arbitrary 1-bit code to the variable $h_1$. This BDD_for_CF can be easily converted to the multi terminal binary decision diagram (MTBDD).

The graph in FIG. 7(a) can be transformed in the MTBDD shown in FIG. 7(b). From the MTBDD in FIG. 7(b), we can generate the LUT that corresponds to the network H as shown in FIG. 7(c).

Figure 8:
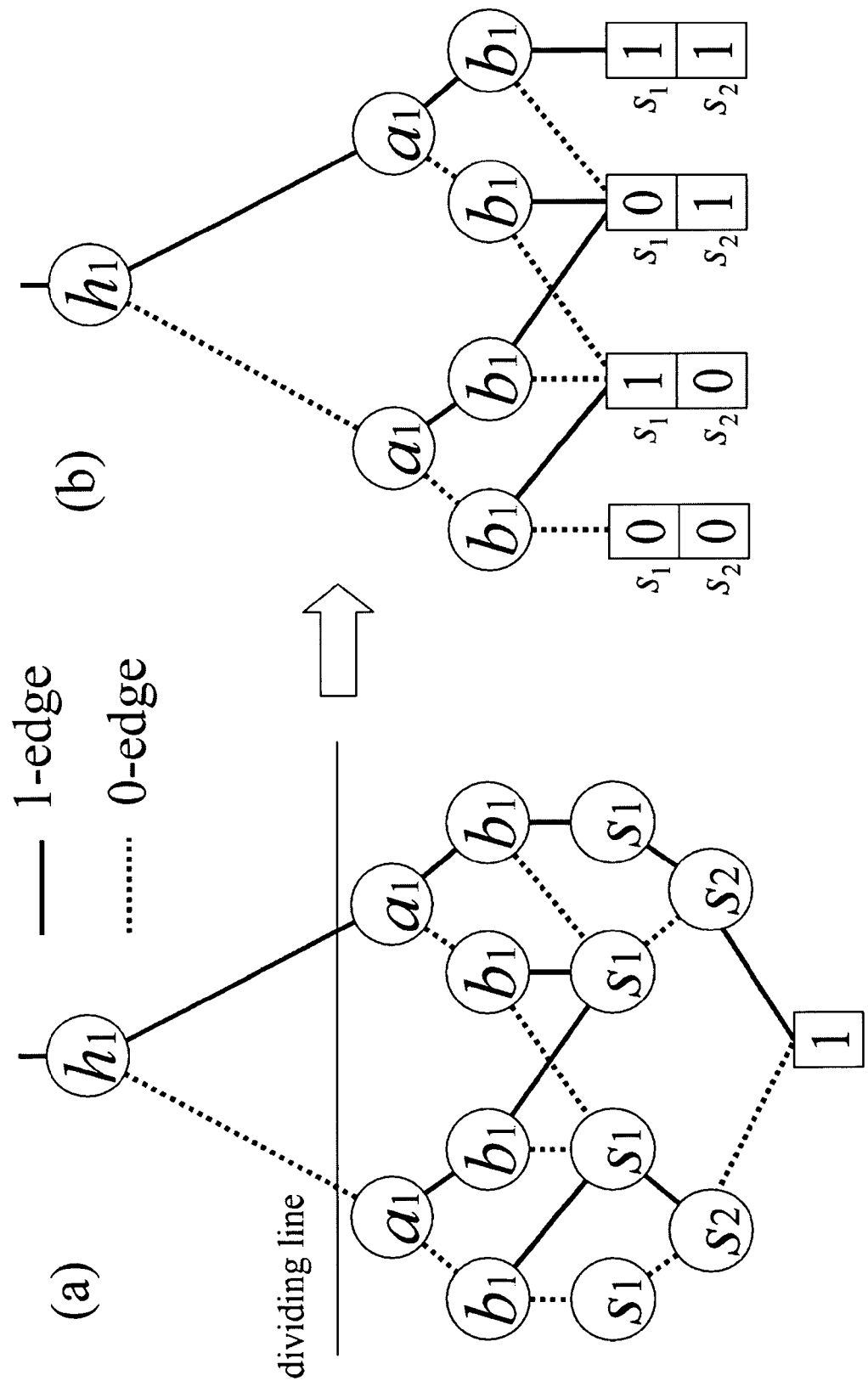
FIG. 8 is the explanation drawings of deletion by shorting of BDD_for_CF of ADR2 and transformation process into LUT.
Figure 9:
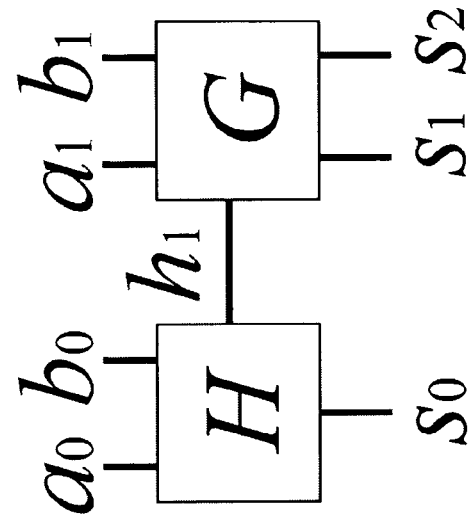
FIG. 9 is the explanation drawings of deletion by shorting of BDD_for_CF of ADR2 and transformation process into LUT.

Next, in the BDD_for_CF shown in FIG. 6, by using the intermediate variable $h_1$ introduced before, replace the upper part of the partition line of the BDD_for_CF shown in FIG. 6(b), with the decision tree having the input variables $h_1$. With this operation, the BDD_for_CF can be transformed into FIG. 8(a). In FIG. 8(a), the edges to constant 0 of the characteristic function are omitted. This BDD_for_CF can be easily converted into the MTBDD. FIG. 8(b) is the MTBDD obtained from FIG. 8(a) by transforming the graph. Furthermore, from the MTBDD shown in FIG. 8(b), we can generate the LUT as FIG. 9(a), which corresponds to G. Thus, finally, we have the LUT cascade shown in FIG. 9(b).

[End of Example]

[3] Realization and Operation of this Invention

The first construction of the Device for Reducing the Width of Graph in accordance with the present invention is a "Device for Reducing the Width of Graph" which reduces the width of the Binary Decision Diagram for Characteristic Function (BDD_for_CF), where BDD_for_CF is a characteristic function $\chi(X,Y)$ defined in Eq. (19), $X=(x_1, \ldots, x_n)$ (n∈N, N is a set of natural numbers) denotes input variables, $Y=(y_0, \ldots, y_{m-1})$ (m≧2, m∈N) denotes the output variables of a multiple-output logic function F(X), and $F(X)=(f_0(X), \ldots, f_{m-1}(X))$ is an incompletely specified function to the output including don't care, comprising:

(A) "Means to Store Node Table" storing the node table which is the table of node data that consists of the labels of variables and pairs of edges $e_0(v_i)$ and $e_1(v_i)$, where the labels of variables are labels given to the variables $z_i(z_i \in (X \cup Y))$ corresponding to said each non-terminal node $v_i$ in the BDD_for_CF of the multiple-output logic function F(X), and a pair of edges $e_0(v_i)$ and $e_1(v_i)$ that points the next transition child node(s) when the input values of $z_i(z_i \in (X \cup Y))$ are 0 and 1;

(B) "Means to Find the Dividing Lines" setting the height lev of the partition which partitions BDD_for_CF represented by said node table stored in said "Means to Store Node Table";

(C) "Means to Generate Column Functions" generating a column function which represents the column of the decomposition chart derived by the functional decomposition from said node table stored in said "Means to Store Node Table", where the decomposition is obtained by partitioning said BDD_for_CF by said height lev of the partition set by said "Means to Find the Dividing Lines";

and (D) "Means to Reconstruct Assigned BDD" which assigns the constants to the don't care in the compatible column functions of column function generated by said "Means to Generate Column Functions", and consequently makes these compatible column functions to the identical column functions (hereafter, assigned column functions), and reconstructs said BDD_for_CF using the new assigned column function, and finally updates the node table in said "Means to Store Node Table".

[Equation 19]

$$\chi(X, Y) = \bigwedge_{i=0}^{m-1} \{\overline{y}_i f_{i\_0} \vee y_i f_{i\_1} \vee f_{i\_d}\} \quad (19)$$

where $f_{i\_0}, f_{i\_1}, f_{i\_d}$ are OFF function, ON function and DC function defined as Eq. (20) each other.

[Equation 20]

$$f_{i\_0}(X) = \begin{cases} 1 & (X \in f_i^{-1}(0)) \\ 0 & (\text{otherwise}) \end{cases}, \quad (20)$$

$$f_{i\_1}(X) = \begin{cases} 1 & (X \in f_i^{-1}(1)) \\ 0 & (\text{otherwise}) \end{cases},$$

$$f_{i\_d}(X) = \begin{cases} 1 & (X \in f_i^{-1}(d)) \\ 0 & (\text{otherwise}) \end{cases}$$

With this construction, when the "Means to Find the Dividing Lines" set the height lev of the partition, the "Means to Generate Column Functions" generates the column functions that are obtained by decomposing the BDD_for_CF using the partition by the height lev. And, the "Means to Reconstruct Assigned BDD" make the compatible column functions identical by assigning the constants to the don't care(s). At the same time, by using the new assigned column function, the "Means to Reconstruct Assigned BDD" reconstruct the BDD_for_CF and updates the node table of the "Means to Store Node Table". With this operation, the width of the BDD_for_CF at the height lev is reduced.

In general, in the functional decomposition by using a binary decision diagram, the smaller the width of the binary decision diagram, the smaller the circuit after functional decomposition becomes. Thus, as shown in the previous statement, by assigning the constants to the don't care(s), we can reduce the width of the binary decision diagram and also reduce the size of logic circuit after functional decomposition.

The second construction of the Device for Reducing the Width of Graph in accordance with the present invention is characterized in that in the first construction, wherein:

the device comprises;

(E) "Means to Store Compatible Graphs" storing the compatible graph as a table of function node data, that is a table of column function labels of said each function node and the data of compatible edges connected to the function node, where compatible graph is a graph which has said column functions as nodes (function nodes), and wherein a pair function nodes corresponding to the column functions compatible each other are connected by an edge (compatible edge);

(F) "Means to Generate Compatible Edges" which selects the pair of compatible column function from the set of column functions corresponding to said each function node data, stored in said "Means to Store Compatible Graphs", and then adds a compatible edge which connects these function nodes with function node data corresponding to these compatible column functions, and finally updates the function node data stored in said "Means to Store Compatible Graphs";

and (G) "Means to Generate Cliques" covering nodes with the minimum number of complete subgraphs (cliques) for all nodes in said compatible graph, and then generating clique data of function node set contained within the clique;

and said "Means to Generate Column Functions" generates column functions corresponding to each edge of nodes at said height lev of the partition set by said "Means to Find the Dividing Lines" from said node table stored in "Means to Store Node Table", and then generates said function node data having column function labels corresponding to these column functions, and then stores in said "Means to Store Compatible Graphs", and said "Means to Reconstruct Assigned BDD" reconstructs said BDD_for_CF by making some column functions to the identical assigned column functions by assigning the constants to don't care of the column functions corresponding to each function node contained in the clique data produced by said "Means to Generate Cliques", and updates said node table in said "Means to Store Node Table".

In this construction, the "Means to Generate Column Functions" produces column functions corresponding to the each edge of the nodes at the height lev of the partition from the node table stored in the "Means to Store Node Table". Then, it generates said function node data corresponding to each column function with column function labels and stores into said "Means to Store Compatible Graphs".

The "Means to Generate Compatible Edges" select a set of compatible column functions from the column functions corresponding to the node data stored in "Means to Store Compatible Graphs".

And, it appends the compatible edges that connect compatible function nodes to the nodes corresponding to the selected compatible column functions to update the node data for the function.

Next, the "Means to Generate Cliques" do the node covering, and generates the clique data that covers the all the nodes in the compatible graph by using the minimum number of cliques.

Finally, for each clique data, the "Means to Reconstruct Assigned BDD" assigns the constant to the don't care(s) in the column function corresponding the node in the clique data to make identical assigned column functions.

And it reconstruct the BDD_for_CF by the assigned column functions to update the node table.

As shown above, by performing steps (1)~(5) in the above mentioned Algorithm 3, we can reduce the width of the BDD_for_CF by finding the clique cover of the compatible graph for the column functions.

In present invention, the reduction of the width of the BDD_for_CF are very effective, since the assignments of constants to the don't care(s) are determined globally by considering the compatibility of all the sub functions.

In this case, it is desirable that the "Means to Generate Cliques" covers all the nodes in the compatible graph by using the minimum number of cliques. However, as mentioned before, the problem to find the node cover by using the minimum number of cliques is NP-hard, and impractical to obtain the exact minimum. Thus, in practice, the "Means to Generate Cliques" is constructed so that it generates as few cliques as possible to cover nodes by using a heuristic method.

The third construction of the Device for Reducing the Width of Graph in accordance with the present invention is characterized in that in the first or second construction, wherein:

said "Means to Find the Dividing Lines" sets the height lev of the partition sequentially from the height of the child node of the root node in BDD_for_CF represented by said node table stored in said "Means to Store Node Table", towards the low height, and said "Means to Reconstruct Assigned BDD" reconstructs sequentially in said each height lev of the partition set by said "Means to Find the Dividing Lines".

In this construction, width reduction of BDD_for_CF is performed according to above-mentioned algorithm 3 from the height t−1 of the child node of the root node existing in the height t in BDD_for_CF to the height 1 of the node being upon the constant node.

Therefore effective width reduction of BDD_for_CF becomes possible for all support variables in the multiple-output logic function.

The first construction of the Device for Logic Synthesis in accordance with the present invention is, a "Device for Logic Synthesis" which generates look-up tables (LUTs) of the data for constructing logic circuits corresponding to said multiple-output logic function $F(X)$ from the BDD_for_CF of the multiple-output logic function $F(X)=(f_0(X), \ldots, f_{m-1}(X))$ with input variables $X=(x_1, \ldots, x_n)$ (n∈N), comprising:

(A) "Means to Store Node Table" storing BDD_for_CF representing the characteristic function $\chi(X, Y)$ (where $Y=(y_0, \ldots, y_{m-1})$ (m≧2, m∈N) denotes output variables of $F(X)$) defined in Eq. (21), as the node table which is the table of node data that consists of the labels of variables and pairs of edges $e_0(v_i)$ and $e_1(v_i)$, where said multiple-output logic function $F(X)=(f_0(X), \ldots, f_{m-1}(X))$ is a completely specified function, the labels of variables are labels given to the variables $z_i(z_i \in (X \cup Y))$ corresponding to said each non-terminal node $v_i$ in the BDD_for_CF, and a pair of edges $e_0(v_i)$ and $e_1(v_i)$ that points the next transition child nodes when the input values of $z_i(z_i \in (X \cup Y))$ are 0 and 1;

(B) "Means to Store LUTs" storing said LUTs;

(C) "Means to Find the Dividing Lines" setting the height lev of the partition which partitions BDD_for_CF represented by said node table stored in said "Means to Store Node Table";

(D) "Means to Reduce by Shorting" performing shorten-processing that is the processing to replace the edge $e_c(v_k)$ that points the node $v_j$ among two edges $e_0(v_k)$ and $e_1(v_k)$ of the parent node $v_k$ of the node $v_j$, by the edge $e_b(v_j)$ other than the edge $e_a(v_j)$ of the node $v_j$, in the case that the terminal node related to $\chi(X,Y)=0$ pointed by the edge $e_a(v_j)$ of either the edges $e_0(v_j)$ or $e_1(v_j)$ of the node $v_j$, about the node data of the node $v_j$ related to the variable $y_r(\in Y)$ representing output and the parent node $v_k$ of the node $v_j$, where the nodes $v_j$ and $v_k$ are contained in the subgraph $B_0$ including the root node among the node data of non-terminal nodes stored in said "Means to Store Node Table", in the case of partitioning BDD_for_CF to the two subgraphs $B_0$ and $B_1$ at the partition line in said height lev of the partition;

(E) "Means to Measure the Width of BDDs" which counts the number of the edges that point the child nodes of the non-terminal nodes, whose height is smaller than said height lev of the partition, among the edges which are the non-terminal nodes in BDD_for_CF to which said shorten-processing by said "Means to Reduce by Shorting" is applied and which belong to the non-terminal nodes whose height is larger than said the height lev of the partition (where the edges pointing the same node is counted as one, and the edge to point the constant 0 is disregarded), and produces the number at the partition line in said height lev of the partition as the width W;

(F) "Means to Compute the Intermediate Variables" counting the number of the intermediate variables u following Eq. (22), using the width W produced by said "Mean to Measure the Width of BDDs";

(G) "Means to Generate LUTs" which generates LUTs from the node data and stores said LUTs in said "Means to Store LUTs", for the non-terminal nodes which belong to the subgraph $B_0$ including the root node, among the non-terminal nodes stored in said "Means to Store Node Table", in the case of partitioning said BDD_for_CF into two subgraphs at the partition line in said height lev of the partition;

and (H) "Means to Re-construct BDDs" which generates a binary tree which has the same number of the control inputs as the number of the intermediate variables u which is counted by said "Means to Compute the Intermediate Variables", and reconstructs the BDD_for_CF by replacing the node data of non-terminal nodes in subgraph $B_0$ of BDD_for_CF stored in said "Means to Store Node Table" with the node data representing said binary tree, and updates the node table stored in said "Means to Store Node Table" by the node data of the non-terminal nodes in said reconstructed BDD_for_CF.

[Equation 21]

$$\chi(X, Y) = \bigwedge_{i=0}^{m-1} (y_i \equiv f_i(X)) \quad (21)$$

[Equation 22]

$$u = \lceil \log_2 W \rceil \quad (22)$$

In this construction, (a) First, node data of BDD_for_CF of the objective logic function performing logic circuit synthesis are stored in the "Means to Store Node Table". Means to Reduce by Shorting performs deletion by shorting process for the sub-graph $B_0$ including the root node at the partition line of the height lev, where the BDD_for_CF is constructed by the node data stored in the "Means to Store Node Table". The deletion by shorting process is expounded in the section of above-mentioned "[2] basic principle of present invention". The "Means to Measure the Width of BDDs" measures the width W on above-mentioned partition line, in BDD_for_CF obtained by above-mentioned deletion by shorting process. And, the "Means to Compute the Intermediate Variables" counts the number of the intermediate variables u by Eq. (22).

(b) Next, the "Means to Generate LUTs" generates LUTs of the sub-graph $B_0$ including the root node, where the sub-graph $B_0$ is the one of sub-graphs obtained by partitioning of the BDD_for_CF by the partition line of the height lev, and the BDD_for_CF is constructed by the node data stored in the "Means to Store Node Table". The principle of the generating method is explained already in the section of above-mentioned "[1] basic principle of present invention". The outputs of this LUTs are output variables $Y_0 = (y_0, \ldots, y_{k-1})$ including the sub-graph $B_0$ and u intermediate variables $H = (h_1, \ldots, h_u)$. The data of the generated LUT stores in the "Means to Store LUTs". Appropriate codes can be assigned to the nodes of the intermediate variables H.

(c) Finally, the "Means to Reconstruct BDDs" generates a binary tree including u control inputs, and above-mentioned intermediate variable $H = (h_1, \ldots, h_u)$ is made to correspond to each control input. And the "Means to Reconstruct BDDs" stores node data of each node including re-construct BDD_for_CF by this process in the "Means to Store Node Table", so BDD_for_CF stored in the "Means to Store Node Table" is updated.

The above processes (a)~(c) are repeated to decompose objective logic function into plural sub-functions and to realize an LUT cascade logic circuit. Also, we realize an LUT network logic circuit by transforming the look-up table generated by "Means to Generate LUTs" into a BDD_for_CF and decomposing functions using similar process.

In the "Device for Logic Synthesis" of the present construction, we can prevent the excessive increase of the column multiplicity of the decomposition chart wherein a bound variable is used as a variable relating to the sub-graph $B_0$, by setting the position of the partition line to an appropriate height so that the size of the sub-graph $B_0$ does not become too large. Therefore, we can realize a "Device for Logic Synthesis" using relatively small amount of memory. Since the column multiplicity of the decomposition chart can be reduced, we can reduce the amount of computation and Memory Access, and the operation of the decomposition of logic function can be faster.

In the deletion by shorting process by said "Means to Reduce by Shorting", we may implement the deletion by shorting process by actually rewriting the structure of the node table. However, we can also assume that deletion by shorting is implemented by changing the evaluation program of BDD_for_CF without changing the structure of the node table. For example, for the nodes of the output variables to which shorting process is implemented, we rewrite the nodes label to a specific value. We can decide whether the variable is an output variables or not by checking the nodes label, and we can consider that deletion by shorting is virtually implemented.

The second construction of the Device for Logic Synthesis in accordance with the present invention is, characterized in that in the first construction, said "Means to Store Node Table" stores the BDD_for_CF as a node table, where said BDD_for_CF is a graph that represents the characteristic function $\chi(X,Y)$ (where $Y = (y_0, \ldots, y_{m-1})$ ($m \geq 2$, $m \in N$) denotes the output variables of F(X)) defined in Eq. (19), with said multiple-output logic function $F(X) = (f_0(X), \ldots, f_{m-1}(X))$ of an incompletely specified function that includes don't cares in outputs, said node table is the table of the node data that consists of the labels of variables and pairs of edges $e_0(v_i)$ and $e_1(v_i)$, said labels of variables are labels given to the variables $z_i(z_i \in (X \cup Y))$ corresponding to said each non-terminal node $v_i$ in the BDD_for_CF, and said pair of edges $e_0(v_i)$ and $e_1(v_i)$ that points the next transition child nodes when the values of $z_i(z_i \in (X \cup Y))$ are 0 and 1;

With this construction, we can implement LUT cascades and LUT network logic circuits not only for completely specified multiple-output functions but also for incompletely specified multiple-output functions.

The third construction of the Device for Logic Synthesis in accordance with the present invention is, characterized in that in the second construction, wherein the device comprises the "Device for Reducing the Width of Graph" according to any one of Claims 1 to 3, and said "Means to Reduce by Shorting" reduces the width of BDD_for_CF represented by said node table stored in said "Means to Store Node Table" by said "Device for Reducing the Width of Graph", and then performs said shorten-processing on the updated node table.

With this construction, since synthesis of LUT cascade is implemented after reducing the width of BDD_for_CF of the incompletely specified function, the redundancy of the incompletely specified multiple-output function is reduced and we can improve memory use efficiency of LUT cascade.

The fourth construction of the Device for Logic Synthesis in accordance with the present invention is characterized by that in any of the first to third constructions, wherein the device comprises:

Means to Decide the Ordering of Output Variables deciding the order $\pi$ of elements of said multiple-output logic function F(X) to minimize the value of T represented in Eq. (23), where $\pi=(\pi[0], \ldots, \pi[m-1])$ ($\pi[i]=j$ represents that $f_j$ is the i'th element) is the order of the logic functions $f_0(X), \ldots, f_{m-1}(X)$ that are elements of said multiple-output logic function F(X), and supp($f_j$) is the set of the input variables that influence the logic function $f_j(\in F(X))$;

Means to Decide the Ordering of all the Variables deciding the order of the variables $y_j(\in Y)$ representing the outputs and input variables $x_i(\in X)$ in the order P that satisfies Eq. (24);

and "Means to Generate BDDs" which generates node data of the BDD_for_CF according to the order P decided in said "Means to Decide the Ordering of all the Variables", and then stores in said "Means to Generate BDDs".

[Equation 23]

$$T = \sum_{k=0}^{m-1} \left| \bigcup_{l=0}^{k} supp(f_{\pi[l]}) \right| \quad (23)$$

[Equation 24]

$$P = \left( supp(f_{\pi[0]}), y_{\pi[0]}, supp(f_{\pi[1]}) - supp(f_{\pi[0]}), y_{\pi[1]}, \right.$$
$$supp(f_{\pi[2]}) - \left( \sum_{k=0}^{1} supp(f_{\pi[k]}) \right), y_{\pi[2]}, \ldots,$$
$$\left. supp(f_{\pi[m-1]}) - \left( \sum_{k=0}^{m-2} supp(f_{\pi[k]}) \right), y_{\pi[m-1]} \right) \quad (24)$$

The BDD_for_CF of the practical multiple-output logic function is a considerable size usually. Therefore, the method to partition the outputs is necessary. So, according to above-mentioned construction, the "Means to Decide the Ordering of Output Variables" decides the order of logic functions $f_0(X), \ldots, f_{m-1}(X)$ to minimize the value T represented by Eq. (23). So the number of the node data of BDD_for_CF generated by the "Means to Generate BDDs" is reduced.

In the BDD_for_CF, for each output variable $y_j=f_j(X)$, input variables on which the output variables depends, are put on the higher level than the level of the output variables $y_j$. So these variables are arranged in the order that these dependent variables do not increase as much as possible. And BDD_for_CF is generates while adding one output one by one. Thus, the outputs are optimally partitioned. The processing time required for logic circuit synthesis can be shortened and a high-speed logic circuit can be synthesized.

The first construction of the Method for Reducing the Width of Graph in accordance with the present invention is a Method to Reduce the Width of Graph which reduces the width of the BDD_for_CF, in the system comprising "Means to Store Node Table" which stores the node table which is the table of node data that consists of the labels of variables and pairs of edges $e_0(v_i)$ and $e_1(v_i)$, where BDD_for_CF is a characteristic function $\chi(X,Y)$ defined in Eq. (19), $X=(x_1, \ldots, x_n)$ (n$\in$N, N is a set of natural numbers) are input variables, $Y=(y_0, \ldots, y_{m-1})$ (m$\geq$2, m$\in$N) denotes the output variables of a multiple-output logic function F(X), F(X)=($f_0(X), \ldots, f_{m-1}(X)$) is an incompletely specified function to the output including don't care, the labels of variables are labels given to the variables $z_i(z_i\in(X\cup Y))$ corresponding to said non-terminal node $v_i$ in the BDD_for_CF of the multiple-output logic function F(X), and a pair of edges $e_0(v_i)$ and $e_1(v_i)$ that points the next transition child nodes when the input values of $z_i(z_i\in(X\cup Y))$ are 0 and 1, comprising the steps of:

a) a "Step to Find Dividing Lines" setting the height lev of the partition which partitions BDD_for_CF represented by said node table stored in said "Means to Store Node Table";

b) a "Step to Generate Column Functions" generating a column function which represents the column of the decomposition chart derived by the functional decomposition from said node table stored in said node table in said "Means to Store Node Table", where the decomposition is obtained by partitioning said BDD_for_CF by said height lev of the partition set in said "Step to Find Dividing Lines";

c) an "Step to Reconstruct Assigned BDD" assigning the constants to the don't care in the compatible column functions of the column function generated in said "Step to Generate Column Functions", and consequently making these compatible column functions to the identical column functions (hereafter, assigned column functions), and reconstructing said BDD_for_CF using a new assigned column function, new assigned column functions, and finally updating the node table in said "Means to Store Node Table".

The second construction of the Method for Reducing the Width of Graph in accordance with the present invention is characterized in that in the first construction, wherein:

said system comprising "Means to Store Compatible Graphs" storing the compatible graph as a table of function node data, that is a table of column function labels of said each function node and the data of compatible edges connected to the function node, where the compatible graph is a graph that has nodes of column functions (function nodes), and wherein a pair of function nodes corresponding to column functions compatible each other with an edge or edges (compatible edges), and comprising:

said "Step to Generate Column Functions" in which, generates column functions corresponding to each edge of nodes at said height lev of the partition set in said "Step to Find Dividing Lines" from said node table stored in "Means to Store Node Table", and then generates said function node data labeled by column function labels corresponding to these column functions, and then stores in said "Means to Store Compatible Graphs";

a "Step to Generate Compatible Edges" which selects the pair of compatible column functions from the set of column functions corresponding to said each function node data, stored in said "Means to Store Compatible Graphs", and then adds compatible edge which connects function node data corresponding to these compatible column functions and these function node, and finally updates the function node data stored in said "Means to Store Compatible Graphs";

a "Step to Generate Cliques" covering all nodes in said compatible graph with the minimum number of complete subgraphs (cliques) and then generating clique data of the function node set contained in the clique; and said "Step to Reconstruct Assigned BDD" which reconstructs said BDD_for_CF by making some column functions to the identically assigned column functions by assigning constants to the don't care(s) of the column functions corresponding to each function node contained in the clique data produced by said "Means to Generate Cliques", and updates said node table in said "Means to Store Node Table".

The third construction of the Method for Reducing the Width of Graph in accordance with the present invention is characterized in that in the first or second construction, wherein:

said "Step to Find Dividing Lines" to said "Step to Reconstruct Assigned BDD" is performed while changing said height lev of the partition sequentially from the height of the child node of the root node in BDD_for_CF represented by said node table stored in said "Means to Store Node Table", towards the lower height.

The first construction of the Method for Logic Synthesis in accordance with the present invention is a Method for Logic Synthesis which generates look-up tables (LUTs) of the data for constructing logic circuits corresponding to said multiple-output logic function $F(X)$ from the BDD_for_CF of the multiple-output logic function $F(X)=(f_0(X), \ldots, f_{m-1}(X))$ with input variables $X=(x_1, \ldots, x_n)$ ($n \in N$), in the system comprising:

"Means to Store Node Table" storing BDD_for_CF representing the characteristic function $\chi(X, Y)$ (where $Y=(y_0, \ldots, y_{m-1})$ ($m \geq 2$, $m \in N$) denotes the output variables of $F(X)$) defined in Equation (21), as the node table which is the table of the node data that consists of the labels of variables and pairs of edges $e_0(v_i)$ and $e_1(v_i)$, where said multiple-output logic function $F(X)=(f_0(X), \ldots, f_{m-1}(X))$ is a completely specified function, the labels of variables are labels given to the variables $z_i(z_i \in (X \cup Y))$ corresponding to said non-terminal node $v_i$ in the BDD_for_CF, and a pair of edges $e_0(v_i)$ and $e_1(v_i)$ that points the next transition child node(s) when the input values of $z_i(z_i \in (X \cup Y))$ are 0 and 1; and "Means to Store LUTs" storing said LUTs, and comprising:

a "Step to Find Dividing Lines" setting the height lev of the partition which partitions BDD_for_CF represented by said node table stored in said "Means to Store Node Table";

a "Step to Reduce by Shorting" performing shorten-processing that is the processing to replace the edge $e_c(v_k)$ that points the node $v_j$ among two edges $e_0(v_k)$ and $e_1(v_k)$ of the parent node $v_k$ of the node $v_j$, by the edge $e_b(v_j)$ other than the edge $e_a(v_j)$ of the node $v_j$, in the case that the terminal node related to $\chi(X,Y)=0$ pointed by the edge $e_a(v_j)$ of either edge $e_0(v_j)$ or $e_1(v_j)$ of the node $v_j$, about the node data of the node $v_j$ related to the variable $y_r(\in Y)$ representing the output and the parent node $v_k$ of the node $v_j$, where the nodes $v_j$ and $v_k$ are contained in the subgraph $B_0$ including the root node among the node data of non-terminal nodes stored in said "Means to Store Node Table", in the case of partitioning BDD_for_CF to the two subgraphs $B_0$ and $B_1$ at the partition line in said height lev of the partition;

a "Step to Measure the Width of BDDs" which counts the number of the edges that point the child nodes of the non-terminal nodes, whose height is smaller than said height lev of the partition, among the edges which are the non-terminal nodes in BDD_for_CF to which said shorten-processing by said "Means to Reduce by Shorting" is applied, and which belong to the non-terminal nodes whose height is larger than said height lev of the partition (where the edges pointing the same node is counted as one, and the edges pointing the constant 0 are ignored), and produces the number at the partition line in said height lev of the partition as the width W;

a "Step to Count the Intermediate Variables" counting the number of the intermediate variables u by Eq. (22), using the width W;

a "Step to form LUT" which generates LUTs from the node data and stores said LUTs in said "Means to Store LUTs", for the non-terminal nodes which belong to the subgraph $B_0$ including the root node, among the non-terminal nodes stored in said "Means to Store Node Table", in the case of partitioning said height a "Step to Reconstruct BDD" which generates a binary tree which has the same number of control inputs as the number of intermediate variables u which is counted by said "Means to Compute the Intermediate Variables", and reconstructs the BDD_for_CF by replacing the node data of non-terminal nodes in subgraph $B_0$ of BDD_for_CF stored in said "Means to Store Node Table" with the node data representing said binary tree, and updates the node table stored in said "Means to Store Node Table" by the node data of the non-terminal nodes in said reconstructed BDD_for_CF.

The second construction of the Method for Logic Synthesis in accordance with the present invention is characterized in that in the first construction, wherein said "Means to Store Node Table" stores the BDD_for_CF as a node table, where said BDD_for_CF is a graph that represents the characteristic function $\chi(X,Y)$ (where $Y=(y_0, \ldots, y_{m-1})$ ($m \geq 2$, $m \in N$) denotes the output variables of $F(X)$) defined in Eq. (19), with said multiple-output logic function $F(X)=(f_0(X), \ldots, f_{m-1}(X))$ of an incompletely specified function including don't care in outputs, said node table is the table of the node data that consists of the labels of variables and pairs of edges $e_0(v_i)$ and $e_1(v_i)$, said labels of variables are labels given to the variables $z_i(z_i \in (X \cup Y))$ corresponding to said non-terminal node $v_i$ in the BDD_for_CF, and said pair of edges $e_0(v_i)$ and $e_1(v_i)$ points the next transition child node(s) when the values of $z_i(z_i \in (X \cup Y))$ are 0 and 1.

The third construction of the Method for Logic Synthesis in accordance with the present invention is characterized in that in the second construction, which reduces the width of BDD_for_CF represented by said node table stored in said "Means to Store Node Table", by the Method to Reduce the Width of Graph according to any one of Claims 8 to 10, and then updates said node table stored in said "Means to Store Node Table", and then performs from said "Step to Find Dividing Lines" to said "Step to Reconstruct BDD".

The fourth construction of the Method for Logic Synthesis in accordance with the present invention is characterized by that in any of the first to the third constructions, wherein; performing the following three steps after performing from said "Step to Find Dividing Lines" to said "Step to Reconstruct BDD";

a "Step to Decide Ordering of Output Variables" deciding the order $\pi$ of elements of said multiple-output logic function F(X) to minimize the value of T represented in Eq. (23), where $\pi=(\pi[0], \ldots, \pi[m-1])$ ($\pi[i]=j$ represents that $f_j$ is the i'th element) is the order of the logic functions $f_0(X), \ldots, f_{m-1}(X)$ that are elements of said multiple-output logic function F(X), and supp($f_j$) is the set of the input variables that influence the logic function $f_j(\in F(X))$;

an "Step to Decide Ordering of all the Variables" deciding the order of the variables $y_j(\in Y)$ representing the outputs and input variables $x_i(\in X)$ in the order P that satisfies Eq. (24); and a "Step to Generate BDDs" which generates node data of the BDD_for_CF according to the order P decided in said "Means to Decide the Ordering of all the Variables", and then stores in said "Means to Generate BDDs".

The first construction of the program in accordance with the present invention is a computer program that implements the Method to Reduce the Width of Graph according to any one of the first to the third construction.

The second construction of the program in accordance with the present invention is a computer program that implements the Method for Logic Synthesis according to any one of the first to the fourth construction.

The construction of the programmable logic circuit in accordance with the present invention is a programmable logical circuit synthesized by the Method for Logic Synthesis according to any one of the first to the fourth construction.

EFFECT OF THE INVENTION

As shown above, according to the "Device for Reducing the Width of Graph" or a "Method to Reduce the Width of Graph" in accordance with present invention, we can check all the compatibility of the sub-functions corresponding to the width of the BDD_for_CF, and then perform matching. So the width of the BDD_for_CF can be effectively reduced.

According to present invention in accordance with a "Device for Logic Synthesis" and a "Method for Logic Synthesis", the position of the partition line partitioning the BDD_for_CF can be decided to reasonable height so that the size of the sub-graph $B_0$ doesn't broaden in excess. So it is possible to avoid that the column multiplicity of the decomposition chart having variable of sub-graph $B_0$ as bound variables increases extremely. Therefore, the logic circuit synthesis is achieved using comparatively lower-capacity memory. And the operation process speed of the logic function decomposition process becomes faster. Therefore, we can implement generation of the LUT logic circuit, wherein the effective method of logic circuit synthesis was not known earlier, using the decomposition of the the multiple-output logic function in short time using realistic size hardware.

Hereinafter, preferred embodiments of the present invention will be described with reference to the drawings.

Embodiment 1

Figure 10:
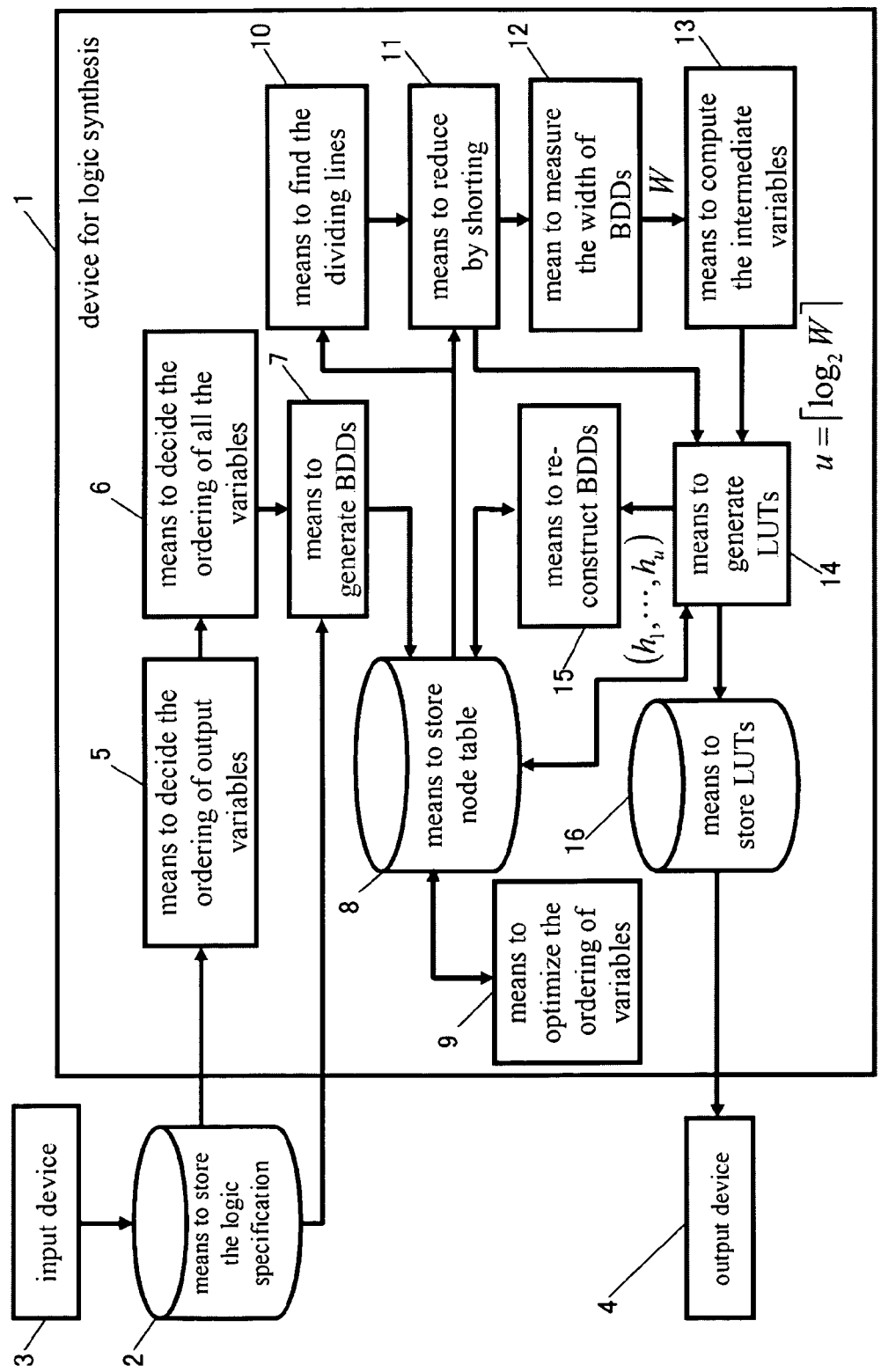
FIG. 10 is the structure diagram of the "Device for Logic Synthesis" and the peripheral equipment according to Embodiment 1 of the present invention.

FIG. 10 is the structure diagram of the "Device for Logic Synthesis" and its peripheral equipment according to Embodiment 1 of the present invention. The "Device for Logic Synthesis" 1 according to Embodiment 1 synthesizes the LUT logic circuit(s) from the logic specification stored in the "Means to Store the Logic Specification" 2, and outputs to the output device 4. The logic specification 2 stores the logic specification data of the net-lists etc. of objective logic functions by the input device 3.

In this embodiment, we assume the case where the "Device for Logic Synthesis" 1 is used in the CAD device for the logical circuit design. The "Device for Logic Synthesis" 1 is supplied as a computer program, and the program is stored in a computer to implement the function composition of the "Device for Logic Synthesis" 1 shown in FIG. 10.

In FIG. 10, various data input device such as a keyboard, a mouse, a CD-ROM drive, etc. The output device 4 denotes various output devices such as a display, a printer, a magnetic recoding device, etc. Moreover, the output device 4 can be a program writer that directly write the LUT logic circuit into the programmable logic circuit.

The "Device for Logic Synthesis" 1 includes "Means to Decide the Ordering of Output Variables" 5, "Means to Decide the Ordering of All the Variables" 6, "Means to Generate BDDs" 7, "Means to Store Node Table" 8, "Means to Optimize the Ordering of Variables" 9, "Means to Find the Dividing Lines" 10, "Means to Reduce by Shorting" 11, "Means to Measure the Width of BDDs" 12, "Means to Compute the InterMediate Variables" 13, "Means to Generate LUTs" 14, "Means to Re-construct BDDs" 15, and "Means to Store LUTs" 16.

The "Means to Decide the Ordering of Output Variables" 5, decides the ordering of the output variables $\pi=(\pi[0], \ldots, \pi[m-1])$ of the multiple-output logic function $f(X)$. The "Means to Decide the Ordering of All the Variables" 6, decides the ordering P of the input variables $x_i(\in X)$ as well as the output variables $y_j(\in Y)$. The "Means to Generate BDDs" 7, generates the node table of the BDD_for_CF, according to the order P decided by "Means to Decide the Ordering of All the Variables" 6. The generated node table is stored in "Means to Store Node Table" 8. The "Means to Optimize the Ordering of Variables" 9, further optimizes the variable ordering of the node table stored in "Means to Store Node Table" 8.

The "Means to Find the Dividing Lines" 10, decide the height lev of the partition line that partition the BDD_for_CF, for the node data of the BDD_for_CF, stored in "Means to Store Node Table" 8.

The "Means to Reduce by Shorting" 11, reduces the sub-graph that is the upper part of the partition line with the height lev, for the BDD_for_CF stored in "Means to Store Node Table" 8.

The "Means to Measure the Width of BDDs" 12, calculates the width W at the partition line in the BDD_for_CF that are reduced by the deletion by shorting process.

The "Means to Compute the InterMediate Variables" 13, counts u, the number of intermediate variables, according to the width W produced by "Means to Measure the Width of BDDs" 12.

The means to generate an LUT 14, first generates the LUT for the sub-graph $B_0$ that contains the root node, when the BDD is partitioned into two sub-graphs $B_0$ and $B_1$ by the partition line, and then store them to means to store the LUT 16.

The means to reconstruct BDDs 15, first reconstruct the BDD_for_CF by replacing the sub-graph $B_0$ with the binary tree that has the same number of the control inputs as that of the intermediate variables u, and then updates "Means to Store Node Table" 8.

Figure 11:
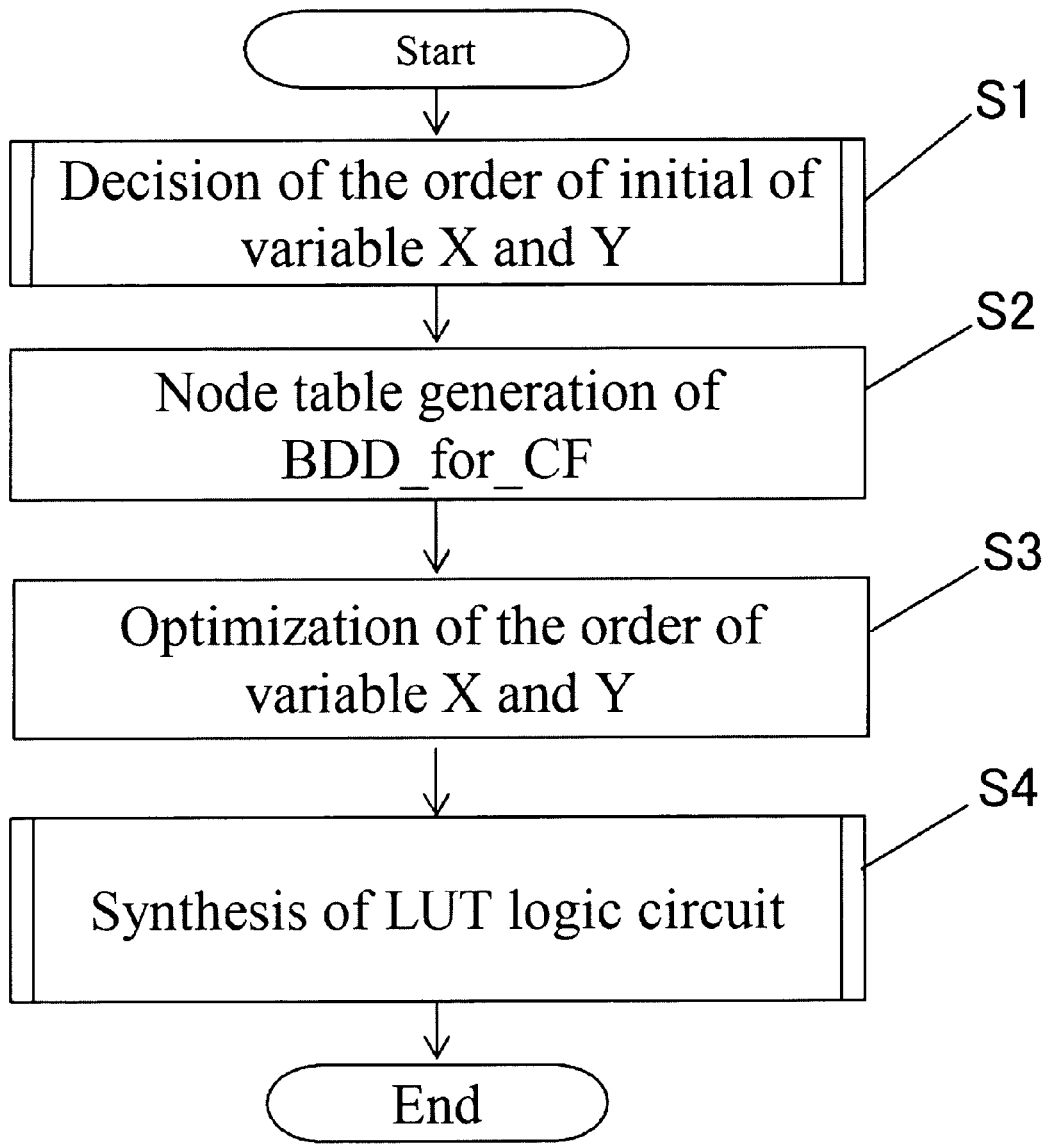
FIG. 11 is the flowchart showing the whole flow of the method for logic synthesis according to Embodiment 1.

With respect to the "Device for Logic Synthesis" 1 realized as above in present Embodiment, we will explain the operation as follows:

FIG. 11 is the flowchart showing the whole flow of the method for logic synthesis according to Embodiment 1. In the global flow of the process, first "Means to Decide the Ordering of Output Variables" 5 and "Means to Decide the Ordering of All the Variables" 6, read out the logic specification stored in "Means to Store the Logic Specification" 2 store.

Then, they decide the initial position of each variable, by extracting the input variables X and the output variables Y (S1).

Next, "Means to Generate BDDs" 7, first reads out the logic specification data from "Means to Store the Logic Specification" 2, and then generates the node table representing the BDD_for_CF, according to the initial order of the variable decided in the above.

The generated node table is stored in "Means to Store Node Table" 8 (S2).

Next, "Means to Optimize the Ordering of Variables" 9, further optimize the ordering of the variables to reduce the sum of widths of BDD_for_CF, in the node table stored in "Means to Store Node Table" 8 (S3).

In this case, the exchange of the variables is done under the condition when the input variable $x_i(\in supp(f_j))$ that influences the output variable $y_j$ is always in the higher position than the output variables $y_j$, in the ordered set $Y=(y_0, y_1, \ldots, y_{m-1})$ of the output variables $y_j$ (j=0, 1, ..., m-1).

Finally, the logic synthesis of the LUT circuit is done by using the node table of the BDD_for_CF stored in "Means to Store Node Table" 8. (S4).

In the following, we will describe the detail of each process of the above-mentioned stage.

(1) Decision of Initial Variables Orders of X and Y

Figure 12:
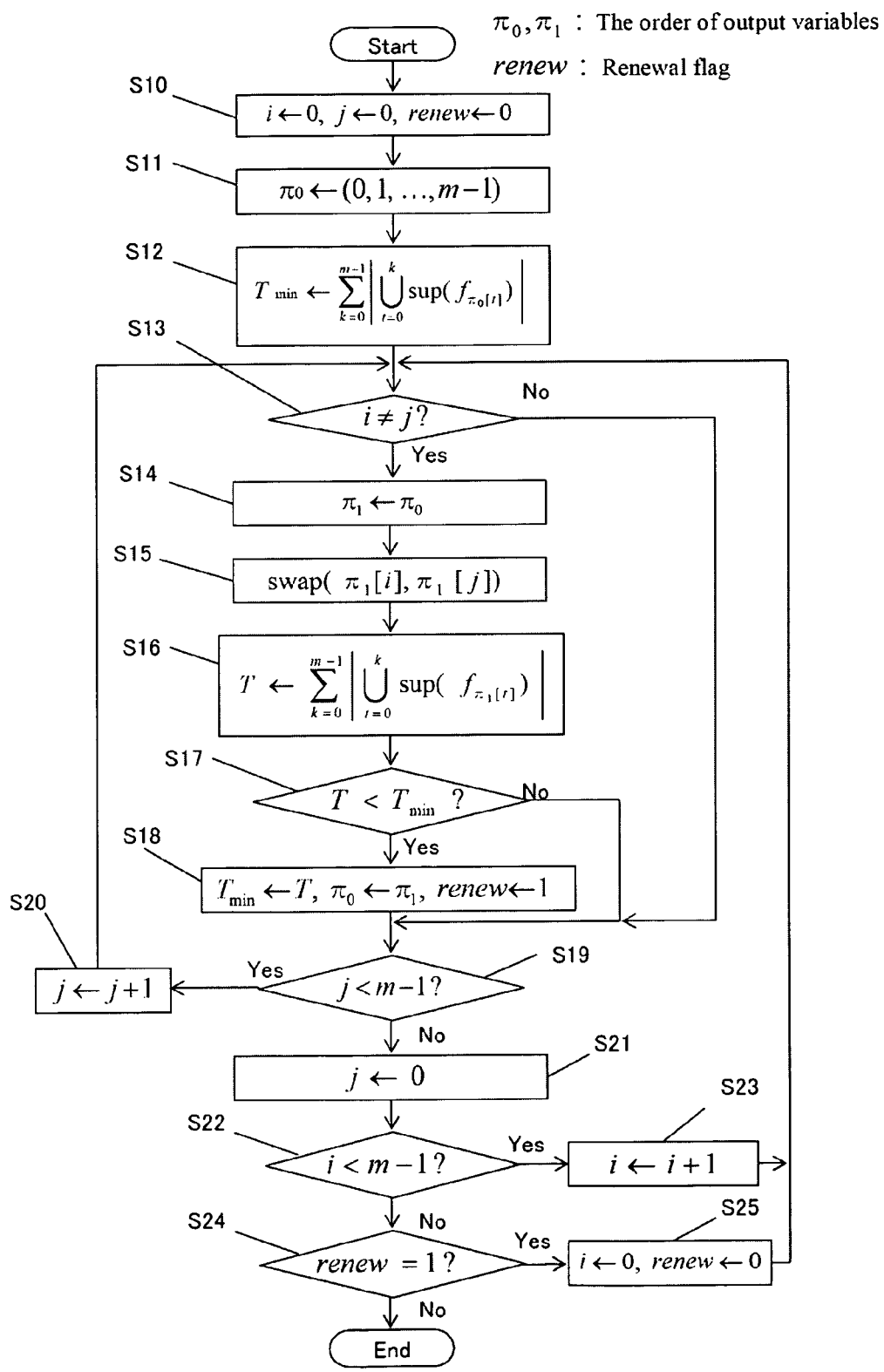
FIG. 12 is the flowchart representing the decision process of the variable orderings.

FIG. 12 is the flowchart representing the decision process of the variable orderings.

First, "Means to Decide the Ordering of Output Variables" 5, initializes the internal variables i,j, and renew to 0 (S10).

i and j are variables representing the indices of the variables permutated, and renew is a flag that shows the permeation of the ordering is done.

Also, "Means to Decide the Ordering of Output Variables" 5, initializes the order $\pi_0=(\pi_0[0], \pi_0[1], \ldots, \pi_0[m-1])$ that represent the ordering of m variables in Y to (0,1, ..., m-1), (S2).

The order $\pi_0$ is an array representing the ordering of the output variables Y.

The cording of the output variables is decided as shown in Eq. (25) by the order $\pi_0$.

[Equation 25]

$$Y=(y_{\pi_0}[0], y_{\pi_0}[1], \ldots, y_{\pi_0}[m-1]) \quad (25)$$

Next, "Means to Decide the Ordering of Output Variables" 5, computes the figure-of-merit function of the ordering of the output variables with respect to the order $\pi_0$ by doing the operation of Eq. (26), and stores the result into the variable $T_{min}$ (S12).

In this case, the figure-of-merit function of the ordering of the output variables is shown in the right-hand side of the Eq. (26).

Note that the figure-of-merit function of the ordering of the output variables $\pi_0$ of Y takes its minimum when the variables are positioned in the increasing order of the number of dependent variables.

Thus, the minimization of the figure-of-merit function of the ordering of the output variables will optimize the order of the output variables Y.

Note that $supp(f_j)$ represents the set of the input variables that influences the logic function $f_j(\in f(X))$.

For example, if $f_j=f_j(x_1,x_2,x_5,x_{10})$, then $|supp(f_j)|=4$.

Note that $|supp(f_j)|$ represents the number of variables in $supp(f_j)$ (See [Definition 4]).

[Equation 26]

$$T_{min} = \sum_{k=0}^{m-1} \left| \bigcup_{l=0}^{k} supp(f_{\pi_0[l]}) \right| \quad (26)$$

Next, "Means to Decide the Ordering of Output Variables" 5, checks whether i≠j or not (S13).

If i=j, then go to Step S19. This is because we have to eliminate the case, since no permutation is done for the case of i=j.

In Step S13, if i≠j, then first initialize the order $\pi_1$ after the variable permutation to order $\pi_0$ (S14), and then exchange the element $\pi_1[i]$ with element $\pi_1[j]$ in the order $\pi_1$ (S15).

And, by doing the operation in Eq. (27), "Means to Decide the Ordering of Output Variables" 5, computes the figure-of-merit function T of the ordering of the output variables with respect to the order $\pi_1$ (S16).

[Equation 27]

$$T = \sum_{k=0}^{m-1} \left| \bigcup_{l=0}^{k} supp(f_{\pi_1[l]}) \right| \quad (27)$$

In this case, if the figure-of-merit function T of the ordering of the output variables after the permutation is smaller than the figure-of-merit function $T_{min}$ of the ordering of the output variables before the permutation (S17), "Means to Decide the Ordering of Output Variables" 5, updates the order to $\pi_1$, and set $T_{min}$ to T, since the order $\pi_1$ is the better than $\pi_0$ as the order of the output variables. And, set the flag renew to 1 to show the order $\pi_0$ has been updated. (S18).

Next, if j<m−1 (S19), then increment j by 1 (S20), and return to Step S13, and iterate the optimization process of the above-mentioned ordering of the output variables.

In Step S18, if j=m−1 then initialize j to 0, since the evaluations for all the permutations where the position of the i-th output variable is fixed (S21).

Next, if i<m−1 (S22), then increment i by one (S23) to do the evaluations for the permutations where the position of the next output is fixed, and return to Step S13.

In Step S22, when j=m−1, all the evaluations for the permutations where the position of the i-th output variable is fixed.

Note that only m×(m−1) permutations are evaluated in this step out of m! permutations, the total numbers of permutations.

Thus, to decide whether do evaluate or not for the rest of the cases, we check whether the order $\pi_0$ has been updated or not in the above-mentioned m×(m−1) different evaluations.

That is, to check whether the variable renew is 1 or not (S24). If renew=1, then initialize i to 0, and renew to 0 (S25), and return to Step S13. Note that in Step S24, if renew=0 then terminate.

As shown above, the order $\pi_0$ of the output variables Y, is optimized so that the figure-of-merit function for the ordering of the output variables $T_{min}$ is minimized.

The "Means to Decide the Ordering of Output Variables" 5, permutes the order of the output variables Y to $\pi_0$, and send to the next step.

Note that in the above-mentioned process, since the evaluations for the permutations of ordering are not necessary done in m! times, the figure-of-merit function for the ordering of the output variable ordering is not necessary to minimized to its exact minimum $T_{min}$.

The reason why not to perform all the evaluations for all m! permutations it to shorten the computation time.

However, the above-mentioned algorithm for the permutation of variables is just an example. When the computation is sufficiently fast, or when the number of the output variables and the input variables is relatively small, we can optimize the ordering by evaluating all m! different permutations by the exhaustive method, so that the figure-of-merit function of the ordering for the output variables is minimized to $T_{min}$.

After the ordering of the output variables is decided, "Means to Decide the Ordering of All the Variables" 6, decide the position of the input variables X and output variables Y according the order P in Eq. (28).

[Equation 28]

$$P = \left( supp(f_{\pi[0]}), y_{\pi[0]}, supp(f_{\pi[1]}) - supp(f_{\pi[0]}), y_{\pi[1]}, \right.$$
$$supp(f_{\pi[2]}) - \left( \sum_{k=0}^{1} supp(f_{\pi[k]}) \right), y_{\pi[2]}, \ldots ,$$
$$\left. supp(f_{\pi[m-1]}) - \left( \sum_{k=0}^{m-2} supp(f_{\pi[k]}) \right), y_{\pi[m-1]} \right) \quad (28)$$

Where, the ordering of the input variables X can be decided arbitrarily, as long as the conditions of Eq. (28) are satisfied.

Thus, here, for the output variables

[Equation 29]

$$y_{\pi[j]} (j=0, 1, \ldots, m-1) \quad (29)$$

and the set of the input variable that precede the output variables

[Equation 30]

$$(x_{\theta[p]}, x_{\theta[p+1]}, \ldots , x_{\theta[p+q-1]}) = supp(f_{\pi[j]}) - \left( \sum_{k=0}^{j-1} supp(f_{\pi[k]}) \right) \quad (30)$$

the elements are ordered so that the indices i of $x_i$ are increasing.

In Eq. (30), ($\theta[1]$, $\theta[2]$, . . . , $\theta[p]$, $\theta[p+1]$, . . . , $\theta[p+q-1]$, . . . , $\theta[n]$) denotes the order of the input variables X, and $\theta[k]=i$ denotes that $x_i$ is in the k-th position of the input variables.

(2) Construction of the Node Table of the BDD_for_CF

After the initial order P of the variables X and Y are decided, means to generate BDD 7 generates the node table of the BDD_for_CF, according to the logic specification stored in "Means to Store the Logic Specification" 2 from the initial order P. This node table is stored in "Means to Store Node Table" 8.

As for the algorithm to generate the BDD_for_CF from the logic specification, various algorithm are known. So, we omit the explanation.

FIG. 13 represents the data structure of the node table. The node data corresponding to a node consists of triple of data (label of the variable, the address for the 0-edge child, the address for the 1-edge child). The label of the variable stores the code that specifies the input variable or the output variable corresponding to the node. Usually, for the sake of computation process, binary codes are used to represent m+n variables $x_1, \ldots, x_n, y_0, \ldots, y_{m-1}$. However, for the sake explanation, we use the symbols for the variables $x_1, \ldots, x_n, y_0, \ldots, y_{m-1}$. The 0-edge is the edge representing the transition of the nodes when the value for the corresponding variable to the node is 0, and the 1-edge is the edge representing the transition of the nodes when the value for the corresponding variable to the node is 1. The child node for the 0 edge (1 edge) is the node that arrives after the transition through the 0 edge (1 edge). The address of the node is the logic address of the memory device that stores the node data, in "Means to Store Node Table" 8.

Therefore, when a value of the corresponding variable is given for a node, we can reference the node after the transition according to the values of the variables. And, we can traverse the path of the BDD_for_CF by referencing the addresses of the child nodes, either the address of the child node of the 0 edge or the address of the child node of the 1 edge, according to the values of variables.

EXAMPLE 8

For the multiple-output logic function $f(X)$ represented by Eq. (31) with the input variable $X=(x_1,x_2,x_3)$, the variable ordering P is obtained as $P=(x_1,x_2,y_0,x_3,y_1)$ by using above-mentioned algorithm.

[Equation 31]

$$F(X) = (f_0(X), f_1(X)) \quad (31)$$
$$= (x_1 x_2, x_1 \vee x_3)$$
$$X = (x_1, x_2, x_3)$$

Here the BDD_for_CF of the multiple-output logic function $f(X)$ in Eq. (31), is represented by FIG. 14(*b*).

Figure 14:
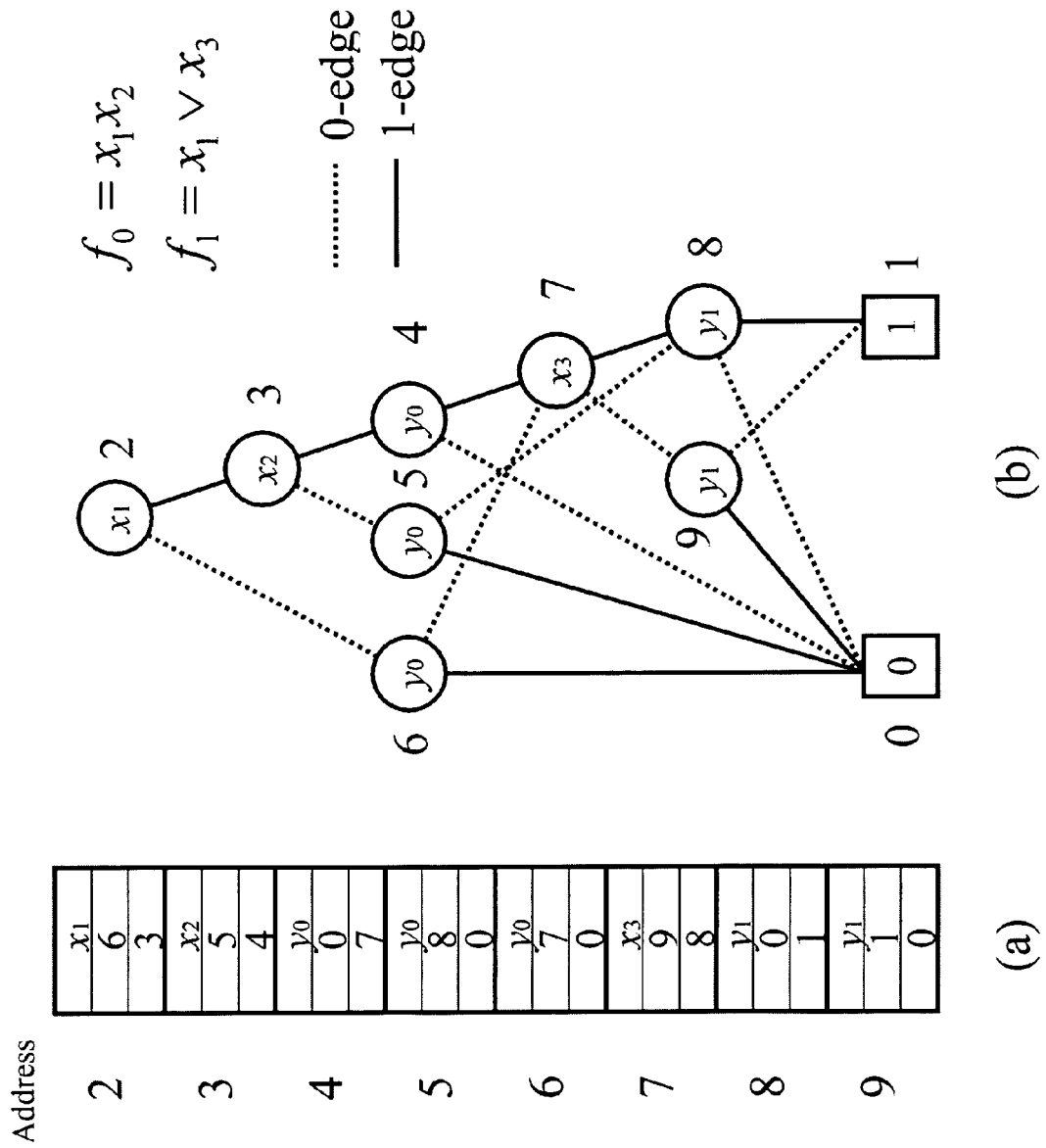
FIG. 14 is the reduced BDD_for_CF of the multiple-output logic function f(X) in Eq. (31) and the node table corresponding to the BDD_for_CF.

Thus, the node table corresponding to the BDD_for_CF in FIG. 14(*b*) is shown FIG. 14(*a*).

Here, the terminal node that corresponds to the value 0 of the characteristic function has address 0, and the terminal node that corresponds to the value 1 of the characteristic function has address 1.

[End of Example]

(3) Optimization of Order of the Variables X and Y

Next, when the node table representing the BDD_for_CF, where the variables X and Y are ordered by the initial order, is stored in "Means to Store Node Table" 8, "Means to Optimize the Ordering of Variables" 9, optimizes the order of the variables X and Y, by changing the orders of variables X and Y. In this case, the permutations of the variable X are done under the condition of (32), that is "the input variable $x_i$ in the set supp($f_j$) is in the upper position than the variable $y_j$."

[Equation 32]

$$x_i > y_j (\forall x_i \in supp(f_j)) \quad (32)$$

(where $z_p > z_q$ denote that the height of variable $z_p$ is higher than the height of variable $z_q$ ($z_p$ is high-order than $z_q$).)

EXAMPLE 9

Suppose that for the logic specification represented by the multiple-output logic function F(X) in Eq. (31), the node table of the BDD_for_CF with the variable ordering P=($x_1$, $x_2,y_0,x_3,y_1$) mentioned above, is generated as FIG. 14, and stored in "Means to Store Node Table" 8. The "Means to Optimize the Ordering of Variables" 9, permutes the variable ordering P in the node table, under the above-mentioned condition. And, it reconstructs the BDD_for_CF, with the variable ordering P' after the permutation, and then, only when the total sum of the widths of the BDD_for_CF, the content of "Means to Store Node Table" 8 is reduced, it updates with the node table of the variable ordering P'.

Figure 15:
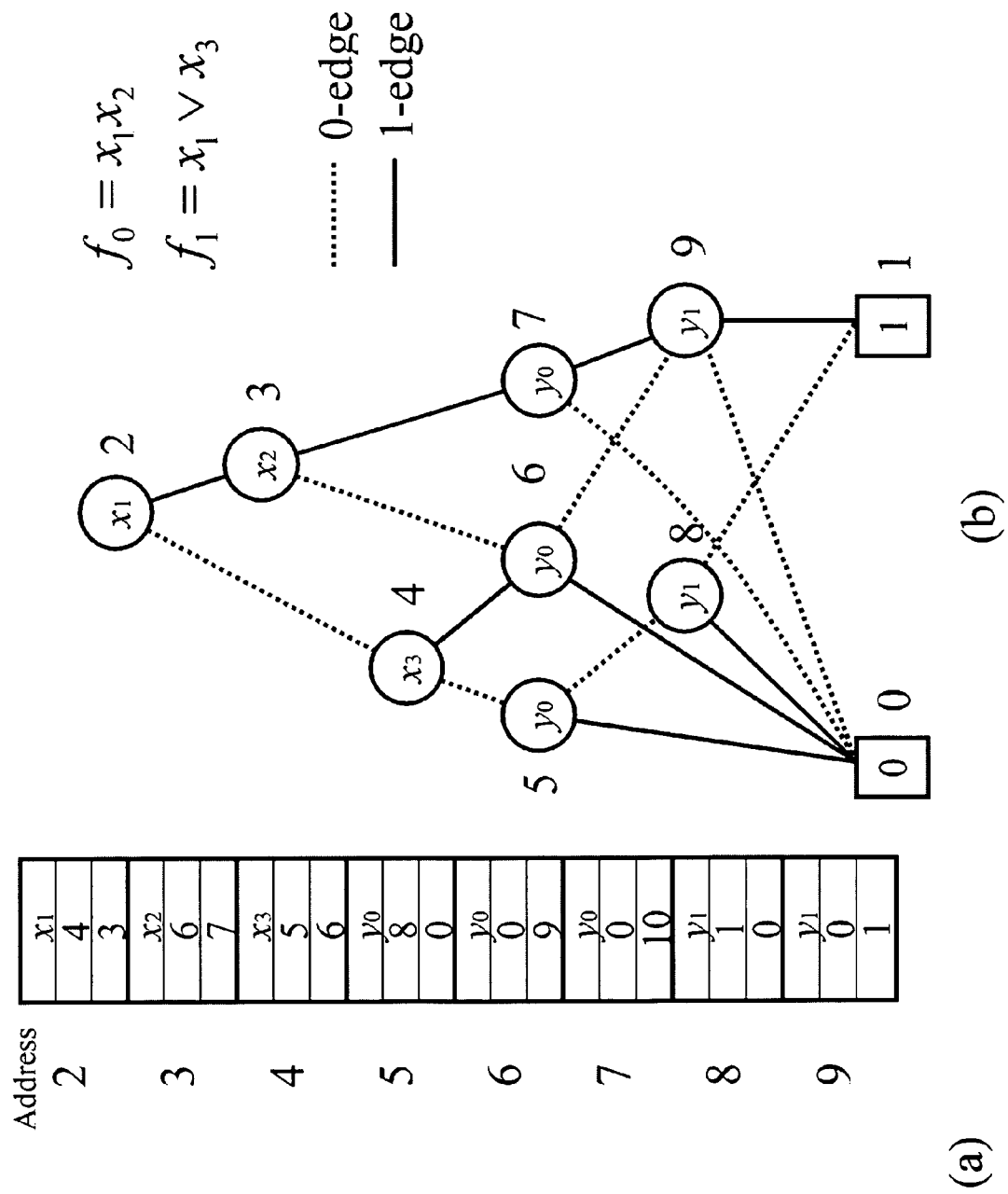
FIG. 15 is the BDD_for_CF of the multiple-output logic function f(X) in Eq. (31) and the node table corresponding to the BDD_for_CF.

For example, when "Means to Optimize the Ordering of Variables" 9, permutes the above-mentioned variable ordering P to the order P'=($x_1$, $x_2$, $x_3$, $y_0$, $y_1$), the BDD_for_CF is represented as FIG. 15(b).

And the corresponding node table to this BDD_for_CF is given as FIG. 15(b). The sizes for the node tables in FIG. 15(a) and FIG. 14(a) are the same. Thus, in this case, "Means to Store Node Table" 8 is not updated.

The ordering of the variables are optimized by reconstruction of the node table using the exhaustive (or trial with an appropriate conditions) method.

Note that in the case of the multiple-output logic function of Eq. (31), since the BDD_for_CF shown in FIG. 14 is the minimum, the node table in "Means to Store Node Table" 8 is not update.

[End of Example]

(4) The Synthesis of an LUT Cascade

After the node table of the optimized BDD_for_CF is stored into "Means to Store Node Table" 8, as shown before, then the synthesis of the LUT cascade will be done.

Thus, we will explain the synthesis process of the LUT cascade logic circuit.

Figure 16:
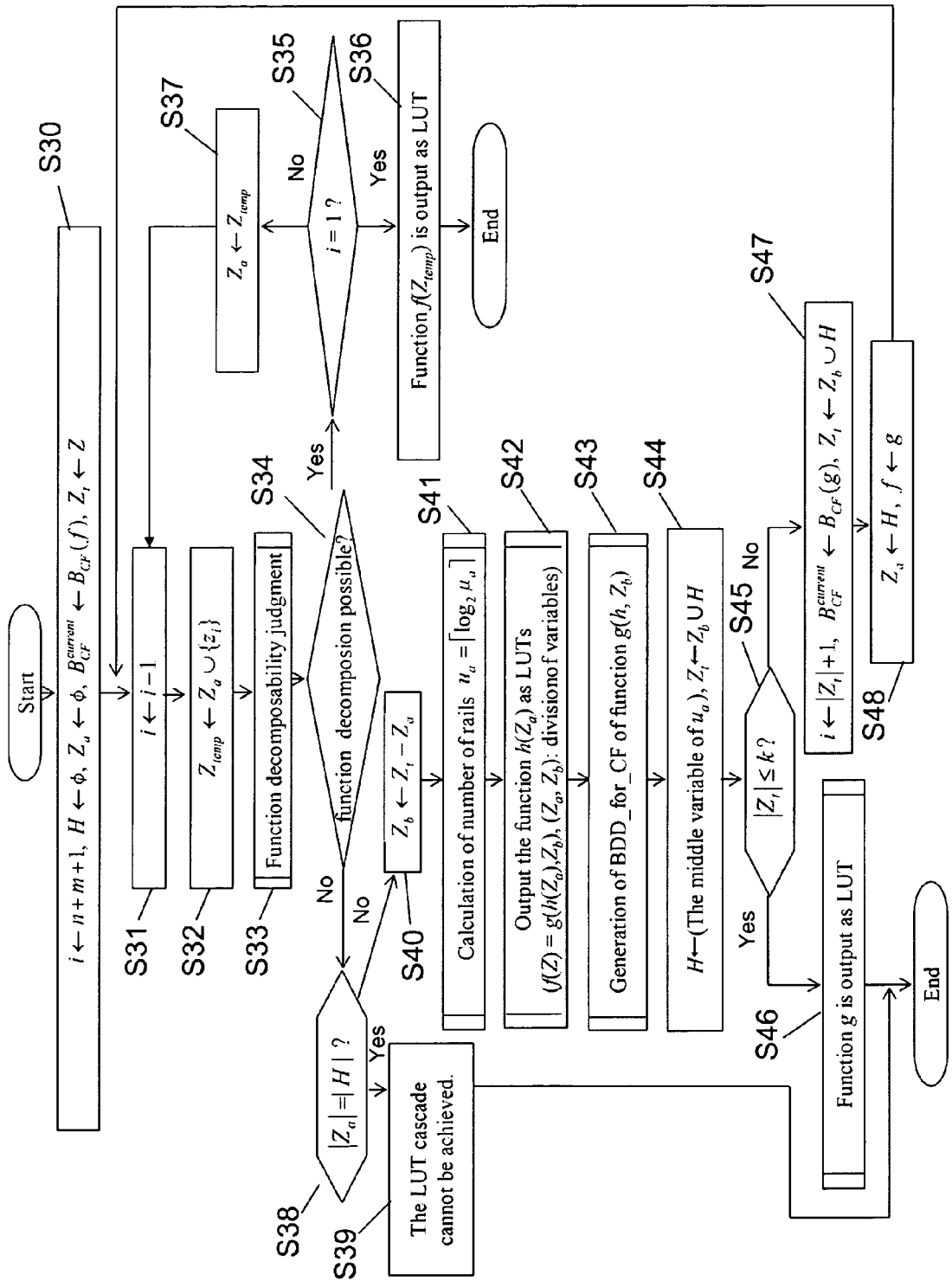
FIG. 16 is the flowchart representing the synthesis process of the LUT cascade logic circuit.

FIG. 16 is the flowchart representing the synthesis process of the LUT cascade logic circuit.

The "Device for Logic Synthesis" 1 set the internal variable i representing the height of the partition line to n+m+1, (where i−1 denotes the height of the partition line, n denotes the number of the input variables in X, i.e., (n=|X|), and m denotes the number of the output variables in Y, i.e., (m=|Y|).).

Also, it initializes the set H of the intermediate variables to the null set ϕ. Also, it initializes the set $Z_a$ of the variables that are above the partitioned line to the null set ϕ.

Also, it initializes the BDD_for_CF $B_{CF}^{current}$ to the BDD_for_CF $B_{CF}(f)$, for the function to be decomposed, and it initializes the set $Z_t$ of variables that are contained in $B_{CF}^{current}$, to the set Z(=X∪Y) (S30).

Next, "Means to Find the Dividing Lines" 10, decrement the variable i by one (S31). That is, to reduce the height of the partition by one.

And let the set $Z_{temp}$ be $Z_a \cup \{z_i\}$ (S32).

Where, $\{z_i\}$ represents the set $z_i$ of variables that are in the height i. In other words, since we lowered the partition line by one, append the set $\{z_i\}$ to the set $Z_{temp}$ representing the variables that are in the above the partition line.

Next, "Means to Find the Dividing Lines" 10 checks whether the functional decomposition is possible or not (S33).

The functional decomposability is decided by comparing the column multiplicity μ when the BDD is partitioned by the partition line, and the number of elements in the set $Z_{temp}$, with the maximum value k of number of the inputs of the LUTs.

That is, the condition for the functional decomposability is represented by Eq. (33).

Thus, the functional decomposability is decided with the condition Eq. (33) is satisfied or not.

[Equation 33]

$$\lceil \log_2 \mu \rceil < k \; \lceil |Z_{temp}| \leq k \tag{33}$$

In the above-mentioned Step S34, if the functional decomposition is possible, then it check whether the variable i is 1 or not (S35). If i=1, then "Means to Generate LUTs" 14, generate the LUT for the function $f(Z_{temp})$, and store it to "Means to Store LUTs" 16, and finally terminate (S36), since further functional decomposition is impossible.

In Step S35, when the height i of the partition line is greater than 1, "Means to Find the Dividing Lines" 10, update the set $Z_a$ to the set $Z_{temp}$(S37), and returns to Step S31.

On the other hand, in Step S34, if the functional decomposition is impossible, "Means to Find the Dividing Lines" 10 checks whether the size of $Z_a$ satisfies the condition $|Z_a|=|H|$ (S38). If $|Z_a|=|H|$, then there exists no possibility for the functional decomposition by lowering the partition line.

Thus, in such a case, "Means to Find the Dividing Lines" 10, terminate the process after producing the message reporting to the output device 4 that the LUT logic circuit cannot be realized (S39).

In Step S38, if $|Z_a|>|H|$, "Means to Reduce by Shorting" 11, assign $Z_t - Z_a$ to the set $Z_b$ of variables that are on the partition line or lower than the partitioned line (S40).

Next, "Means to Reduce by Shorting" 11, performs the deletion by shorting to the sub-graph that are in the upper position than the partition line.

Next, "Means to Measure the Width of BDDs" 12, measures the width $\mu_a$ on the partition line, with respect to the BDD_for_CF after the deletion by shorting.

Next, "Means to Compute the InterMediate Variables" 13, computes the number of rails $u_a$ by using Eq. (34) (S41).

[Equation 34]

$$u_a = \lceil \log_2 \mu_a \rceil \tag{34}$$

Next, "Means to Generate LUTs" 14, generates the LUT for the function $h(Z_a)$ that are obtained by the functional decomposition $f(Z)=g(h(Z_a),Z_b)$, when the partition of the variables is $(Z_a,Z_b)$, and store them to the "Means to Store LUTs" 16 (S42).

That is, with respect to the BDD_for_CF that the above-mentioned deletion by shorting process S41 has not been done yet, let $B_a$ be the sub-graph that are related to variables $Z_a$, and let $B_b$ be the sub-graph that are related to variables. $Z_b$.

Also, in the BDD_for_CF that are modified by the deletion by shorting in Step S41, let $B_a'$ be the sub-graph that are related to the variables $X_a (\subseteq Z_a)$, and let $B_b$ be the sub-graph that are related to the variables $Z_b$.

The "Means to Generate LUTs" 14, generates the LUT, where the inputs are the input variables $x_i(\in Z_a)$ that belong to the set $Z_a$, and the output variables are $y_j(\in Z_a)$ that belongs to the set $Z_a$, from the sub-graph $B_a$.

Next "Means to Generate LUTs" 14, assigns the code $(h_1, \ldots, h_{ua})$ of $u_a$ bits to each node in the sub-graph $B_b$, that is directly connected to the node in the sub-graph $B_a'$, in the BDD_for_CF where the deletion by shorting was performed in Step S41.

From the code $(h_1, \ldots, h_{ua})$, we have the intermediate variables.

And it generates the LUT, where the inputs are variables $X_a(\in Z_a)$ that belongs to set $Z_a$, and the outputs are intermediate variable $(h_1, \ldots, h_{ua})$, from the sub-graph $B_a'$. And, it stores these LUT to "Means to Store LUTs" 16.

Next, the means to reconstruct BDDs 15 generates the BDD_for_CF (S44) representing the function $g(h,Z_b)$, when the function is decomposed as $f(Z)=g(h(Z_a),Z_b)$ with the partition of the variables $(Z_a,Z_b)$.

That is, means to reconstruct BDDs 15, in Step S41, in the BDD_for_CF after performing the deletion by shorting, replaces the sub-graph concerning to $X_a(\subseteq Z_a)$ by the binary tree where the control inputs are the intermediate variable $(h_1, \ldots, h_{ua})$.

Next, update the set H of the intermediate variables with $u_a$ intermediate variables $(h_1, \ldots, h_{ua})$. And, let the set $Z_t$ be $Z_b \cup H$, the union of the set $Z_b$ and the set H (S44).

Next, check whether $|Z_t|$ is equal to or less than k (S45). If $|Z_t| \leq k$, generate the LUT for the function g, and store it to "Means to Store LUTs" 16 (S46), and terminate the process.

In Step S44, if $|Z_t|>k$, then the first, let the height of the partition line be $|Z_t|+1$, and let $B_{CF}^{current}$ be $B_{CF}(g)$, and let the set $Z_t$ be $Z_b \cup H$, the union of the set $Z_b$ and the set H (S47), and the second, let the set $Z_a$ be set H, and the function $f$ be function g (S48), and return to Step S31.

With the above process, the function is decomposed, and the LUT cascade is realized.

As shown above, using the "Device for Logic Synthesis" 1 in this embodiment, by using relatively small amount of memory, we can realize the synthesis of LUT circuits. Also, the operation of the decomposition process of the logic function can be made to faster.

Also, we can generate the LUT logic circuits with intermediate outputs for the multiple-output logic function with realistic hardware in a short time, where no efficient design method were known before.

(5) Experimental Results

Finally, FIG. 17 shows synthesis results of LUT cascades using several benchmark functions to show the effect of present invention. They are implemented by the algorithm in the above-mentioned Embodiment 11, written in C programming language, and applied to the MCNC89 benchmark functions. FIG. 17 shows the results for the case when the number of inputs of the cell is set to k=10.

In FIG. 17, 'Name' denotes the function name, 'In' denotes the number of inputs, 'Out' denotes the number of outputs, 'LUT' denotes the total number of LUTs generated, 'Cas' denotes the number of cascades, number of levels' denotes the number of levels in the cascade. The environment of the implementations are an IBM PC/AT compatible machine, Pentium 4 (trademark) 2.0 GHz, with 512 Mega bytes of memory, the OS is Windows 2000 (trademark), compiled by using gcc in cygwin. In this algorithm, to do the grouping of the outputs, one output is added to a group, and its BDD_for_CF is constructed, and then the ordering of the input variables is optimized. With the increase of k, the size of the BDD_for_CF corresponding to the LUT cascade also increases. In this algorithm, we optimize the ordering of the input variables for a BDD by increasing the number of outputs in a group while the function is realizable by an LUT cascade. This increase the number of ordering optimization of a large BDD_for_CF. Thus, when the value of k is large, great amount of implementation time is necessary. Note that the most of the implementation time is spent for the optimization of variables ordering of a BDD_for_CF.

To confirm the effect of present invention, we compared our method with the method shown in the non-patent literature 15. The method of the non-patent literature 15 is based on the MTBDD. It partitions the outputs of the multiple-output logic function into several groups, and then represents the functions by MTBDDs, and realize them by LUT cascades. When the decomposition is impossible due to the excessive width of the MTBDD, the cascade is partitioned into several by using the OR partition. In FIG. 17, the method in the non-patent literature 15, the outputs are partitioned, where the number of outputs in each group is 8.

The method in the non-patent literature 15, fixes the number of outputs in each group in partition, without considering the number of LUTs or the number of levels in the realized LUT cascade, so the number of cascades tends to be large and the number of levels tends to to be small.

On the other hands, the method in present invention, in the LUT cascade, try to increase the number of outputs in a group as much as possible, the number of levels tends to be large, and the number of cascades tends to be small.

Embodiment 2

Figure 18:
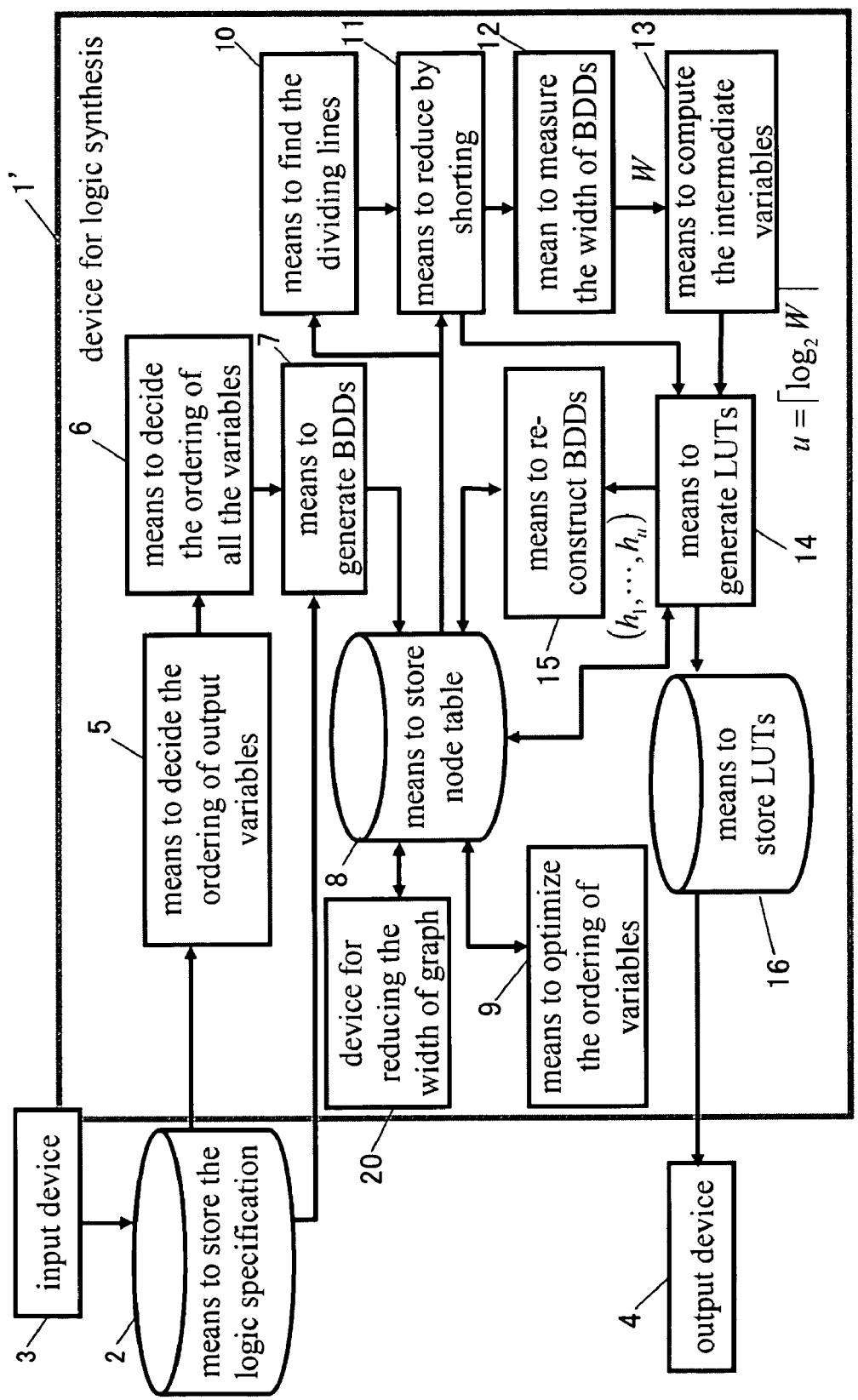
FIG. 18 is the structure diagram of a "Device for Logic Synthesis" and its peripheral device of Embodiment 2 with respect to present invention.

FIG. 18 shows the structure of a "Device for Logic Synthesis" and its peripheral device of Embodiment 2 with respect to present invention. In FIG. 18, "Means to Store the Logic Specification" 2, input device 3, output device 4, "Means to Decide the Ordering of Output Variables" 5, "Means to Decide the Ordering of All the Variables" 6, "Means to Generate BDDs" 7, "Means to Store Node Table" 8, "Means to Optimize the Ordering of Variables" 9, "Means to Find the Dividing Lines" 10, "Means to Reduce by Shorting" 11, "Means to Measure the Width of BDDs" 12, "Means to Compute the InterMediate Variables" 13, "Means to Generate LUTs" 14, means to reconstruct BDDs 15, and "Means to Store LUTs" 16 are similar to those in Embodiment 1. The feature of a "Device for Logic Synthesis" 1' in this embodiment is that it has a "Device for Reducing the Width of Graph" 20.

In this embodiment, it is assumed that the "Device for Logic Synthesis" 1' is used in the CAD device for logic circuit design like in Embodiment 1. The "Device for Logic Synthesis" 1' is provided as a program and function realization of the "Device for Logic Synthesis" 1' shown in FIG. 18 is achieved by loading the program into the computer and implementing the program.

The "Device for Reducing the Width of Graph" 20 reduces the width of BDD_for_CF in the case that the characteristic function represented by the node table stored in "Means to Store Node Table" 8 is an incompletely specified function.

Figure 19:
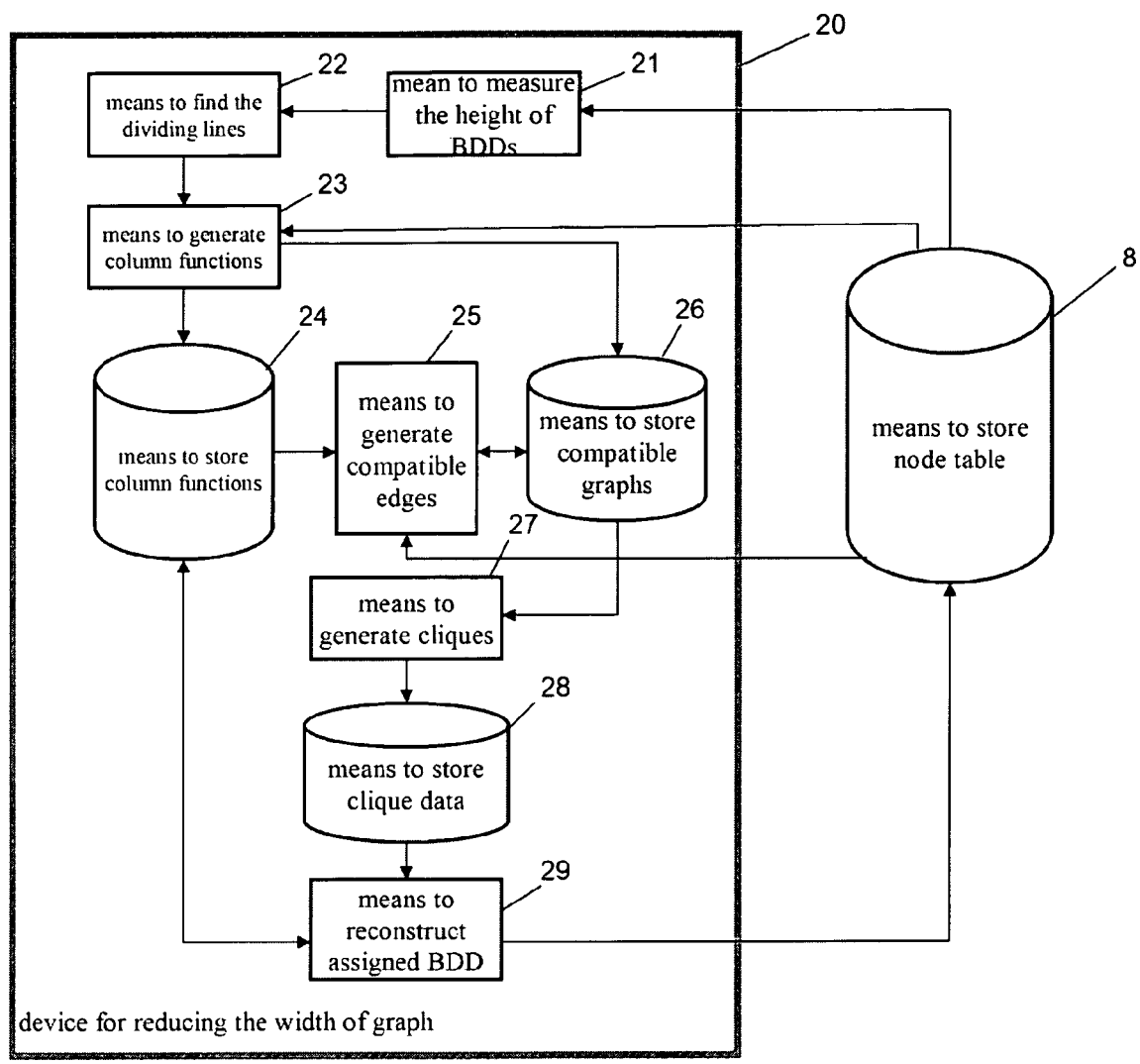
FIG. 19 is the structure diagram of the "Device for Reducing the Width of Graph" 20 in FIG. 18.

FIG. 19 shows the structure of the "Device for Reducing the Width of Graph" 20 in FIG. 18. The "Device for Reducing the Width of Graph" 20 comprises "Means to Measure the Height of BDDs" 21, "Means to Find the Dividing Lines" 22, "Means to Generate Column Functions" 23, "Means to Store Column Functions" 24, "Means to Generate Compatible Edges" 25, "Means to Store Compatible Graphs" 26, "Means to Generate Cliques" 27, "Means to Store Clique Data" 28, and "Means to Reconstruct Assigned BDD" 29.

The "Means to Measure the Height of BDDs" 21 measures the height t of the root nodes in the BDD_for_CF represented by the node table stored in "Means to Store Node Table" 8. The "Means to Find the Dividing Lines" 22 set the height lev of the partition sequentially from height of t−1 towards 1.

The "Means to Generate Column Functions" 23 generates column functions corresponding to the respective edge of the height lev of the partition from the node table stored in "Means to Store Node Table" 8, generates function node data having column function labels corresponding to the respective column functions, and store them in "Means to Store Compatible Graphs" 26. The "Means to Store Column Functions" 24 temporarily stores column functions generated by "Means to Generate Column Functions" 23.

The "Means to Generate Compatible Edges" 25 selects the pair of the compatible column functions from the set of the column functions corresponding to the function node data stored in "Means to Store Compatible Graphs" 26, adds compatible edges which connect function nodes with function node data corresponding to the compatible column function, and updates function data stored in "Means to Store Compatible Graphs" 26.

"The means to generate cliques 27" covers all the nodes of the compatible graph stored in the means to store compatible graphs 26 with complete subgraphs (cliques), generates clique data which is the set of function nodes and stores in the means to store clique data 28.

The "Means to Reconstruct Assigned BDD" 29 assigns constants to the don't care(s) of the column functions corresponding to the function nodes contained in the clique data stored in "Means to Store Clique Data" 28 to generate identically assigned column functions, reconstructs the BDD_for_CF by constants to changing the column function of the function nodes contained in the clique data by assigning column functions, and updates the node table of "Means to Store Node Table" 8. The "Means to Reconstruct Assigned BDD" 29 may synthesize column functions from the node table in "Means to Store Node Table" 8, or may refer column function temporarily stored in "Means to Store Column Functions" 24 when referring column functions corresponding to the function nodes.

As for the "Device for Logic Synthesis" 1 of this embodiment shown above, we will explain the operation process.

First, the node table of the BDD_for_CF of an incompletely specified function is stored in means to store node data 8 in the process of Steps S1~S3 in FIG. 11. Next, the width reduction process of the BDD_for_CF is implemented by the "Device for Reducing the Width of Graph" 20. And finally, the synthesis of the LUT logic circuit of Step S4 in FIG. 11 is implemented. Here, as for the "Device for Logic Synthesis" 1' of this embodiment, the operation process other than the width reduction process of BDD_for_CF by the "Device for Reducing the Width of Graph" 20 is similar to that of Embodiment 1. Therefore, we will explain only the operation process of the "Device for Reducing the Width of Graph" 20.

Figure 20:
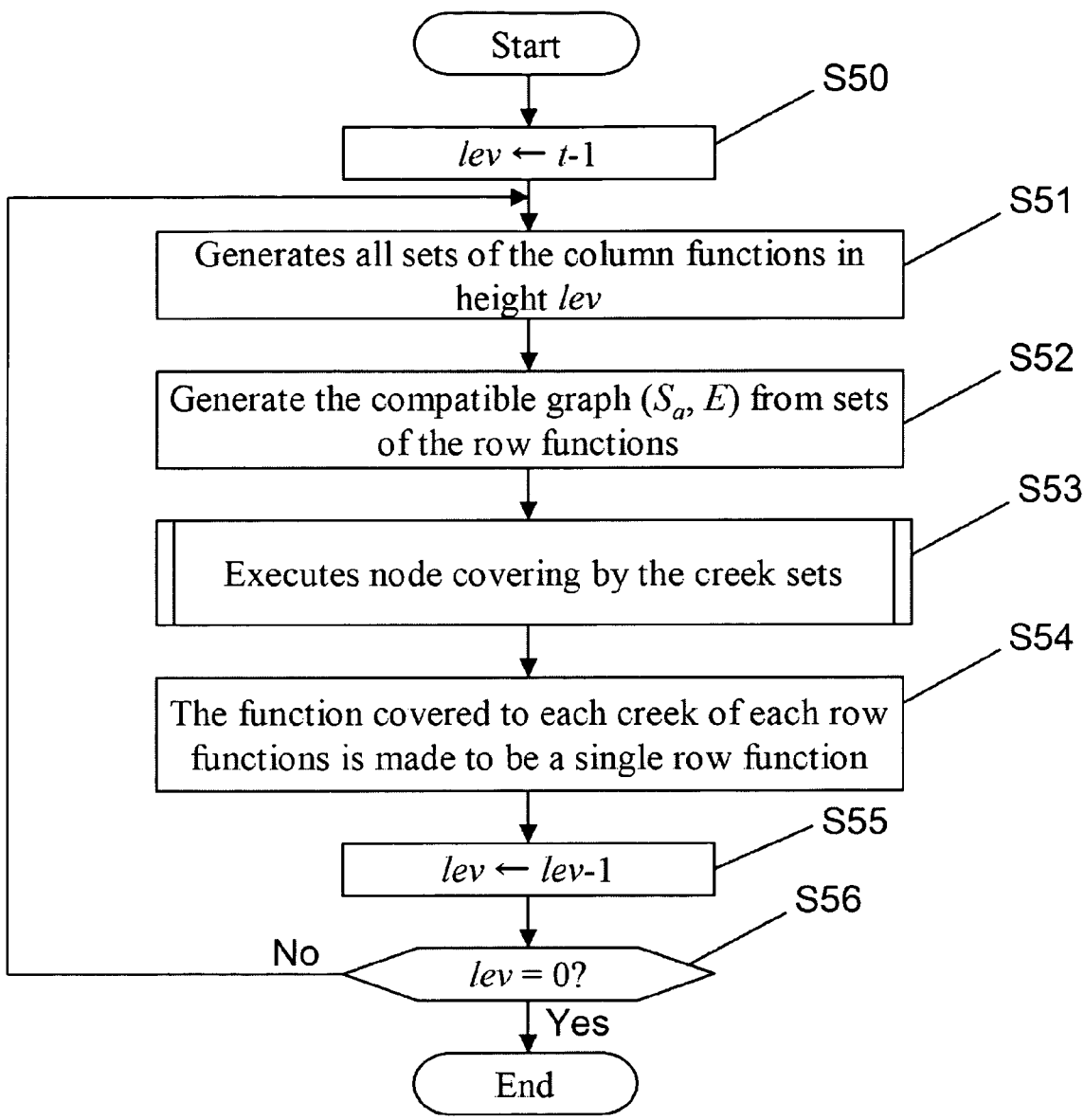
FIG. 20 is a flowchart representing the whole flow of the graph width reduction process of the "Device for Reducing the Width of Graph" 20.

FIG. 20 is a flowchart representing the whole flow of the graph width reduction process of the "Device for Reducing the Width of Graph" 20. First, "Means to Measure the Height of BDDs" 21 searches the node table stored in "Means to Store Node Table" 8 to decide the height t of the root nodes of the BDD_for_CF. After the height t of the root nodes is decided, "Means to Find the Dividing Lines" 22 sets the height lev of the partition to t−1 (S50).

Next, "Means to Generate Column Functions" 23 generates the set for all the column functions at the height lev of the partition (S51). Nodes labels of the function nodes are given to the column functions generated and stored in "Means to Store Compatible Graphs" 26 as the function node data. When the BDD_for_CF is small, the column functions generated by "Means to Generate Column Functions" 23 may be stored in "Means to Store Column Functions" 24 in order to increase computation speed.

Next, "Means to Generate Compatible Edges" 25 selects the pair of compatible column functions from respective column functions generated by "Means to Generate Column Functions" 23, and adds the compatible edge connecting these function nodes together to function node data corresponding to these compatible column functions stored in "Means to Store Compatible Graphs" 26. The function node data to which the compatible edge is added is stored in "Means to Store Compatible Graphs" 26 and function node data is updated (S52). This process will be implemented to all the column functions generated by "Means to Generate Column Functions" 23 for all combinations of pairs of two column functions. The table of function node data representing compatible graph is generated in "Means to Store Compatible Graphs" 26.

Next, "Means to Generate Cliques" 27 implements node covering process by a clique set for the compatible graph represented by the table of the function node data stored in "Means to Store Compatible Graphs" 26 (S53). The details of this process will be explained later. Node covering with complete subgraphs (cliques) is implemented for all the nodes of the compatible graphs, and clique data is generated. The clique data generated is stored in "Means to Store Clique Data" 28.

Note that "a complete subgraph (clique)" is a sub-graph of a compatible graph, where each node of the sub-graph is connected to all other nodes in the sub-graph by edges. The "clique data" denotes the data for the set of function nodes contained in the clique.

Next, "Means to Reconstruct Assigned BDD" 29 generates column functions corresponding to function nodes contained in the clique data, for a clique data stored in "Means to Store Clique Data" 28, based on node table stored in "Means to Store Node Table" 8, and store the column functions temporarily in "Means to Store Column Functions" 24. Then, "Means to Reconstruct Assigned BDD" 29 assigns constants to the don't care(s) for the column functions corresponding to all the function nodes which belong to the clique data and generate identical assignment column function. And then, "Means to Reconstruct Assigned BDD" 29 rewrites node table in "Means to Store Node Table" 8 so that the column functions corresponding to all the function nodes which belong to the clique data becomes the BDD_for_CF changed by the assignment column function generated. We reconstruct the BDD_for_CF by implementing this rewrite process of the node table using assigned column functions to all the clique data (S54).

Next, "Means to Find the Dividing Lines" 22 decrement the height lev by one (S55). If the height lev is greater than or equal to one (S56), return to Step S51. In case the height lev is 0, graph width reduction process is terminated.

The above mentioned Algorithm 3 is implemented by such graph width reduction process, and an effective reduction of width of BDD_for_CF is implemented.

Figure 21:
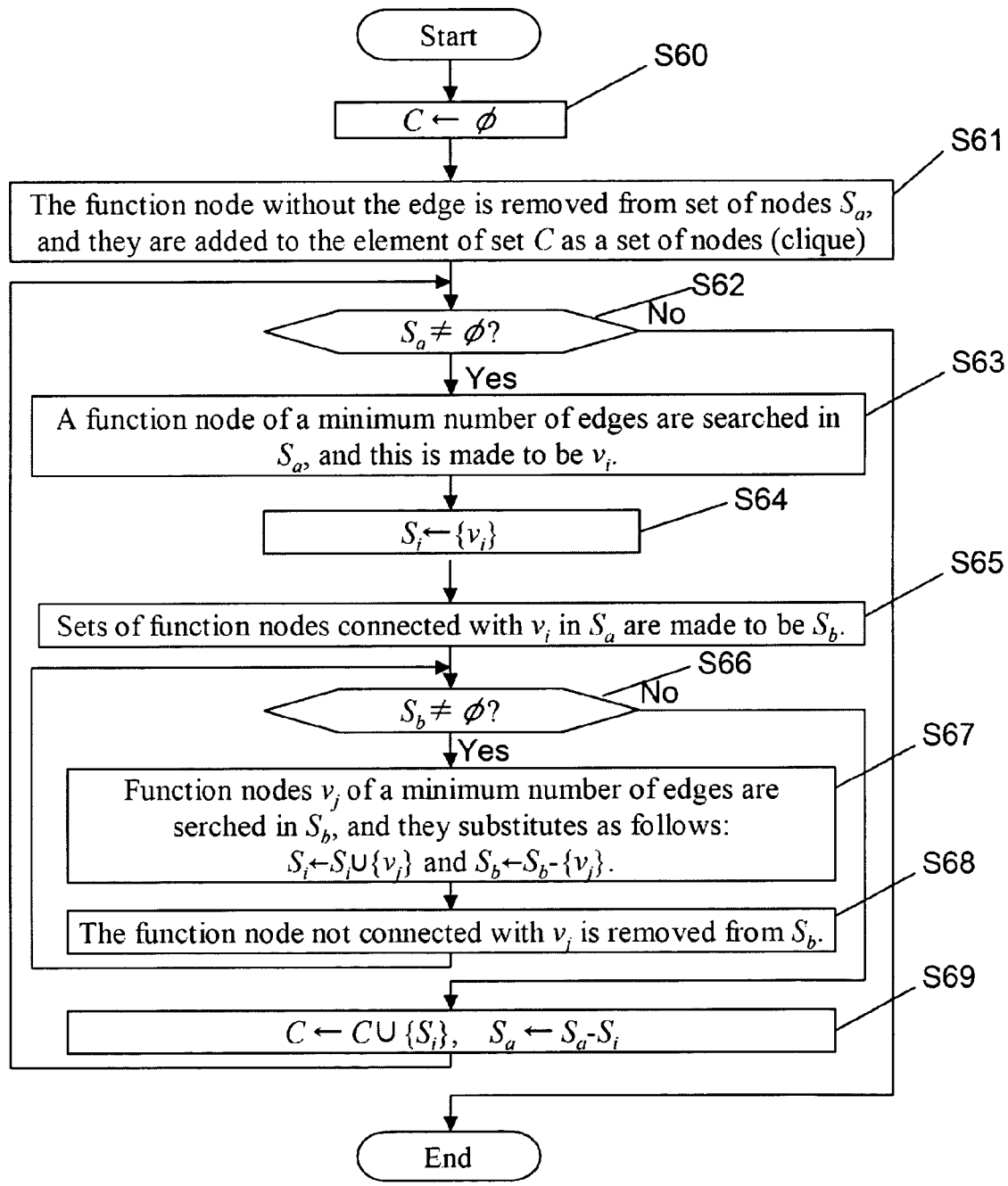
FIG. 21 is a flowchart representing the flow of the node covering process of the compatible graph by clique set.

Next, node covering process of compatible graph by clique set in the above-mentioned Step S53 will be explained. FIG. 21 is a flowchart representing the flow of the node covering process of the compatible graph by clique set.

Means to generate cliques 27 comprises variable C (set C) representing the list of clique data, variable $S_a$ (node set $S_a$) representing the list of function nodes for which clique cover is not implemented, variable $S_i$ (node set $S_i$) representing the list of function nodes contained in one clique, and the variable $S_b$ (node set $S_b$) representing the list of candidate for function nodes to be added to the clique variable.

First, "Means to Generate Cliques" 27 initializes set C of clique data to the null set (S60). After initialization adding all function nodes of the compatible graph to node set $S_a$, function nodes which do not have edges are deleted from node set $S_a$ and these function nodes are added to the element of set C as the clique set of element 1 (S61).

Next, "Means to Generate Cliques" 27 decides whether node set $S_a$ is a null set or not (S62).

When the node set $S_a$ is not a null set, "Means to Generate Cliques" 27 searches function nodes that has the minimum number of the edges and let this be the "function node $v_i$" (S63). Next, "Means to Generate Cliques" 27 initializes node set $S_i$ to $\{v_i\}$ (S64), searches function nodes connecting to the function nodes $v_i$ in the node set $S_a$ and we call this "node set $S_b$," (S65).

Next, "Means to Generate Cliques" 27 decides whether node set $S_b$ is a null set or not (S66). If the node set $S_b$ is not a null set, the function nodes with the minimum number of edges is searched among the function nodes which belong to node set $S_b$, and we call this "function nodes $v_j$". Then, $\{v_j\}$ is added to node set $S_i$ and function nodes $v_j$ is deleted from node set $S_b$ (S67). And then, among the function nodes which belong to node set $S_b$, the function nodes which do not connect to function nodes $v_j$ are deleted from the node set $S_b$ (S68), and return to Step S66.

In Step S66, node set $S_i$ is added to the element of the set C as a clique and node set $S_i$ is deleted from the uncovered node set $S_a$ when the node set $S_b$ is a null set (S69), and return to Step S62.

In Step S62, the set C is stored in "Means to Store Clique Data" 28 as clique data when the uncovered node set $S_a$ becomes a null set, and the node covering process of compatible graph by clique set is terminated.

With the above process, all the function nodes in the compatible graph are covered by cliques, and the clique data are generated.

EXAMPLE 10

For 4-input 2-output incompletely specified function where the truth value is represented by Table 4 of Example 6, the width of the BDD_for_CF is reduced. The BDD_for_CF of 4-input 2-output incompletely specified function represented by Table 4 is shown in FIG. 4(a). The height t of the BDD_for_CF is 6. Reduction process of the width of BDD_for_CF is implemented by the "Device for Reducing the Width of Graph" 20 of this embodiment.

First, the height lev of the partition is set to t−1=5, that is, the height of variable $x_2$. In case lev=5, the decomposition chart is shown as Table 5. As the column functions in Table 5 are incompatible, the constant is not assigned to the don't care(s).

TABLE 5

| | $X_1 = \{x_1\}$ | |
|---|---|---|
| | 0 | 1 |
| $X_2 = \{x_2, x_3, x_4\}$ 000 | d1 | 01 |
| 001 | d1 | 01 |
| 010 | 00 | 10 |
| 011 | 00 | 10 |
| 100 | dd | 1d |
| 101 | dd | 1d |
| 110 | 10 | d0 |
| 111 | 11 | d1 |
| | $\Phi_1$ | $\Phi_2$ |

Figure 22:
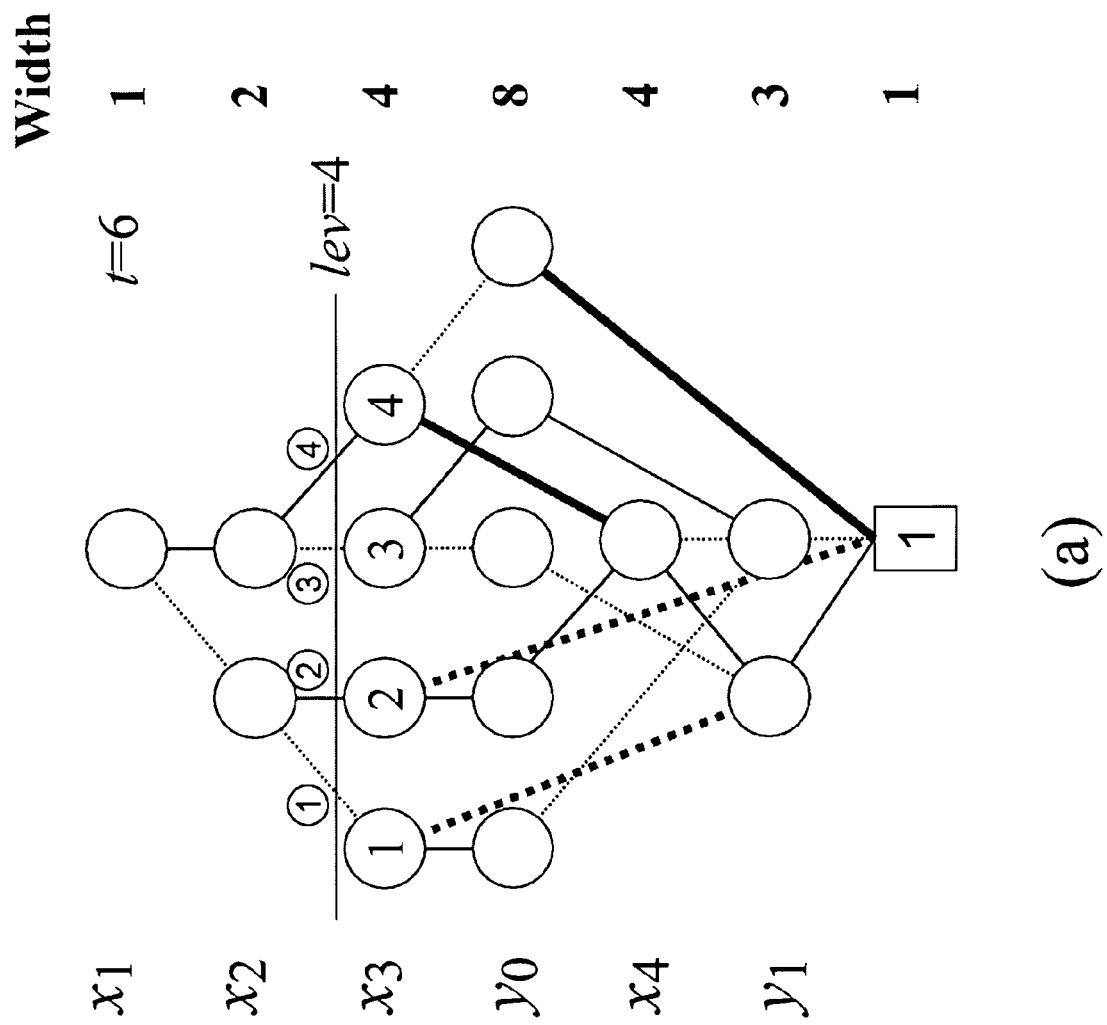
FIG. 22 is the explanation drawings of the graph width reduction process of the BDD_for_CF of the incompletely specified function of Example 10.

Next, the height of the partition is set to lev=4 (see FIG. 22(a)). In case lev=4, the decomposition chart is shown as Table 6.

TABLE 6

| | $X_1 = \{x_1\}$ | | | |
|---|---|---|---|---|
| | 00 | 01 | 10 | 11 |
| $X_2 = \{x_2, x_3, x_4\}$ 00 | d1 | dd | 01 | 1d |
| 01 | d1 | dd | 01 | 1d |

TABLE 6-continued

| | $X_1 = \{x_1\}$ | | | |
|---|---|---|---|---|
| | 00 | 01 | 10 | 11 |
| 10 | 00 | 10 | 10 | d0 |
| 11 | 00 | 11 | 10 | d1 |
| | ① $\Phi_1$ | ② $\Phi_2$ | ③ $\Phi_3$ | ④ $\Phi_4$ |

From Table 6, we have four column functions: $\Phi_1 \sim \Phi_4$. Since the column function $\Phi_2$ and the column function $\Phi_4$ are compatible, the compatible graph can be represented as FIG. 22(b). For the compatible graph in FIG. 22(b), by performing the node covering by cliques, we can generate three cliques $S_1$, $S_2$, and $S_3$ shown by dotted lines in FIG. 22(b). Then, by assigning constants to two column functions $\Phi_2$ and $\Phi_4$ contained in the clique $S_3$, we have Table 7. From the column functions, we can generate the BDD_for_CF shown in FIG. 23(a). Note that the nodes 2 and 4 in the graph of FIG. 22(a) are replaced by the node 11 in FIG. 23(a).

TABLE 7

| | | $X_1 = \{x_1\}$ | | | |
|---|---|---|---|---|---|
| | | 00 | 01 | 10 | 11 |
| $X_2 = \{x_2, x_3, x_4\}$ | 00 | d1 | 1d | 01 | 1d |
| | 01 | d1 | 1d | 01 | 1d |
| | 10 | 00 | 10 | 10 | 10 |
| | 11 | 00 | 11 | 10 | 11 |
| | | ① $\Phi_1$ | ② $\Phi_2'$ | ③ $\Phi_3$ | ④ $\Phi_4'$ |

Figure 23:
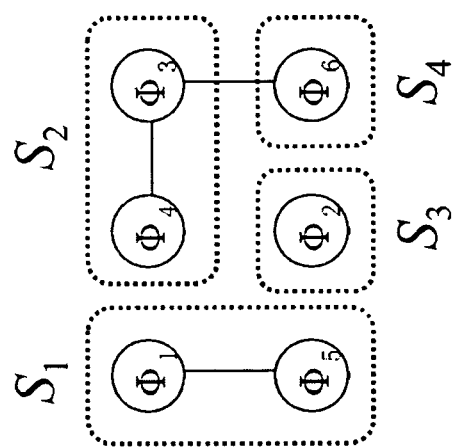
FIG. 23 is the explanation drawings of the graph width reduction process of the BDD_for_CF of the incompletely specified function of Example 10.
Figure 23:
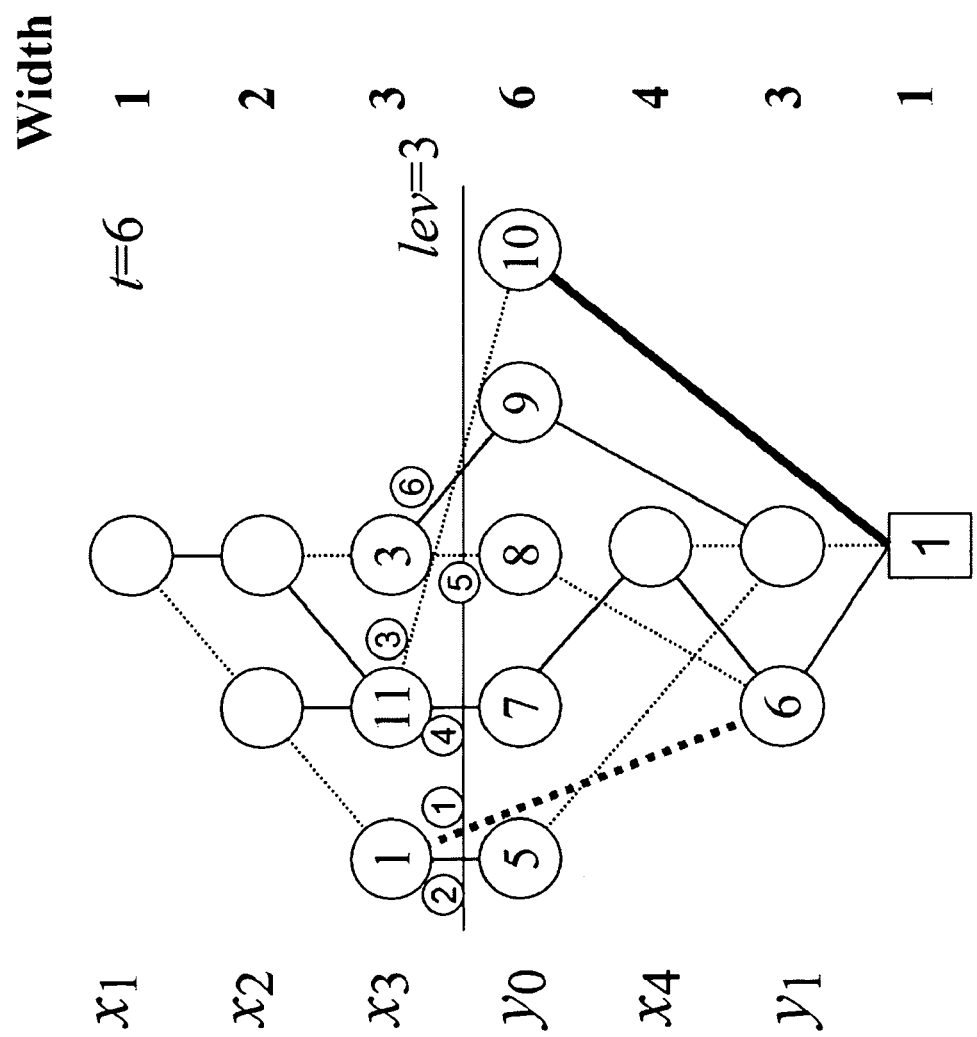

Next, the height of the partition is set to lev=3 (i.e., the height of the variable $y_1$) (See FIG. 23(a)). From FIG. 23(a), we have six column functions $\Phi_1 \sim \Phi_6$, corresponding edges that traverse the height lev=3 of the partition. In FIG. 23(a), each edge has a number that corresponds to the subscript of the corresponding column function $\Phi_1 \sim \Phi_6$. The column functions $\Phi_1$ and $\Phi_5$ are compatible, and the column functions $\Phi_3$, $\Phi_4$, and $\Phi_6$ are compatible each other. Thus, we have the the compatible graph in FIG. 23(b). In the compatible graph FIG. 23(b), a node covering by cliques produces, for example, four cliques $S_1$, $S_2$, $S_3$, and $S_4$, that are shown in dotted lines in FIG. 23(b). Thus, in clique $S_1$, for two column functions $\Phi_1$, $\Phi_5$, we assign constants, and in clique $S_2$, for two column functions $\Phi_3$, $\Phi_4$, we assign constants. After the reconstruction of the BDD_for_CF using resulting assigned column functions, we have the graph having the structure in FIG. 24. Note that two pairs of the nodes (6,8), and (7,10) in FIG. 23(a) are replaced by the nodes 12 and 13 in FIG. 24, respectively.

In the partitions with heights lev=2, and 1, column functions are incompatible. Thus, the BDD_for_CFs are not reconstructed anymore.

Figure 24:
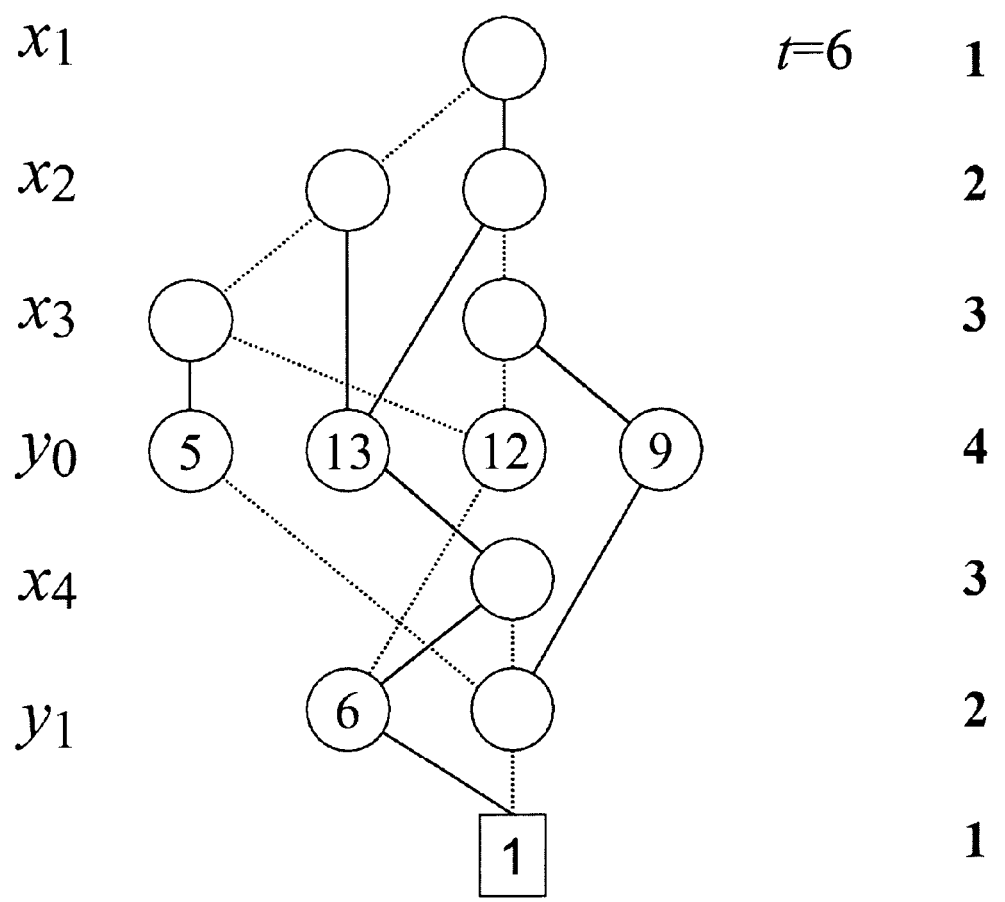
FIG. 24 is the explanation drawings of the graph width reduction process of the BDD_for_CF of the incompletely specified function of Example 10.

The comparison of FIG. 22(a) with FIG. 24 shows that the graph width reduction process reduces the maximum width from 8 to 4, and the number of non-terminal nodes from 15 to 12. If we compare this with the result of above mentioned Algorithm 1, the width is further reduced than the results obtained by Algorithm 1 (See FIG. 4(b)).

Finally, we explain the experimental results for the performance of the "Device for Logic Synthesis" 1' in this embodiment, using several benchmark functions. Table 8 shows the results of the LUT cascade logic circuits synthesized by the "Device for Logic Synthesis" 1' of this embodiment for benchmark functions.

TABLE 8

| Name | DC = 0 | | | Alg. 3 | | |
|---|---|---|---|---|---|---|
| | # Cells | # LUTs | # Cas | # Cells | # LUTs | # Cas |
| 5-7-11-13 RNS | 6 | 35 | 3 | 4 | 29 | 2 |
| 7-11-13-17 RNS | 9 | 53 | 3 | 8 | 52 | 3 |
| 11-13-15-17 RNS | 19 | 118 | 5 | 18 | 108 | 5 |
| 4-digit 11-nary to binary | 4 | 29 | 2 | 4 | 28 | 2 |
| 4-digit 13-nary to binary | 4 | 31 | 2 | 4 | 30 | 2 |
| 5-digit decimal to binary | 8 | 50 | 3 | 7 | 48 | 2 |
| 6-digit 5-nary to binary | 6 | 44 | 2 | 5 | 36 | 2 |
| 6-digit 6-nary to binary | 5 | 38 | 2 | 5 | 29 | 2 |
| 6-digit 7-nary to binary | 10 | 68 | 3 | 9 | 58 | 3 |
| 10-digit ternary to binary | 9 | 59 | 3 | 6 | 48 | 2 |
| 3-digit decimal adder | 7 | 37 | 2 | 3 | 17 | 1 |
| 4-digit decimal adder | 10 | 64 | 2 | 4 | 24 | 1 |
| 2-digit decimal multiplier | 8 | 51 | 3 | 7 | 48 | 3 |
| Total | 105 | 677 | 35 | 84 | 555 | 30 |
| Ratio | 1.00 | 1.00 | 1.00 | 0.80 | 0.82 | 0.86 |

Benchmark functions are defined as follows:

(1) A circuit that converts a Residue Number System (RNS) to a binary representation (Residue Number to Binary Number Converters)

5-7-11-13RNS (14-input 13-output, DC 69.5%: 4-digit RNS number, where the moduli are 5, 7, 11, and 13)

7-11-13-17 RNS (16-input 15-output, DC 74.0%)

11-13-15-17 RNS (17-input 16-output, DC 72.2%)

(2) A circuit that converts an i-digit k-nary number into a binary number (k-nary to Binary Converter)

4-digit 11-nary to binary (16-input 14-output, DC 77.7%)

4-digit 13-nary to binary (16-input 15-output, DC 56.4%)

5-digit decimal to binary (20-input 17-output, DC 90.5%)

6-digit 5-nary to binary (18-input 14-output, DC 94.0%)

6-digit 6-nary to binary (18-input 16-output, DC 82.2%)

6-digit 7-nary to binary (18-input 17-output, DC 55.1%)

10-digit ternary to binary (20-input 16-output, DC 94.4%)

(3) i-digit decimal number adder and multiplier (Decimal Adders and a Multiplier)

3-digit decimal adder (24-input 16-output, DC 94.0%)

4-digit decimal adder (32-input 20-output, DC 97.7%)

2-digit decimal multiplier (16-input 16-output, DC 84.7%)

In Table 8, "DC=0" denotes the case where constant 0 is assigned to all the don't care(s), Alg. 3 denotes the case where Algorithm 3 of the "Device for Logic Synthesis" 1' in this embodiment. The column headed with "# Cells" denotes the number of cells in the cascade. The column headed with "# LUTs" denotes the sum of the numbers of outputs of the LUTs. The column headed with "# Cas" denotes the number of cascades. From Table 8, with the "Device for Logic Synthesis" 1' in this embodiment, we can efficiently reduce the number of cells in the LUTs, and the sum of the numbers of outputs of the LUTs.

For example, consider the case for 5-7-11-13 RNS. In this function, 69.5% of the input combinations are don't care(s). We realize the LUT cascade for this function. We assume that each cell has at most 12 inputs.

Figure 25:
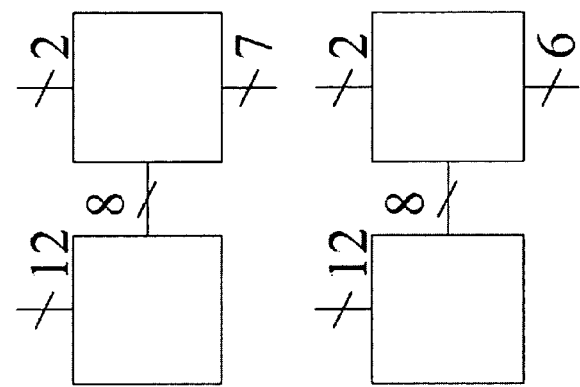
FIG. 25 is the comparative diagram of synthesis results of LUT cascades using the benchmark functions 5-7-11-13 RNS.
Figure 25:
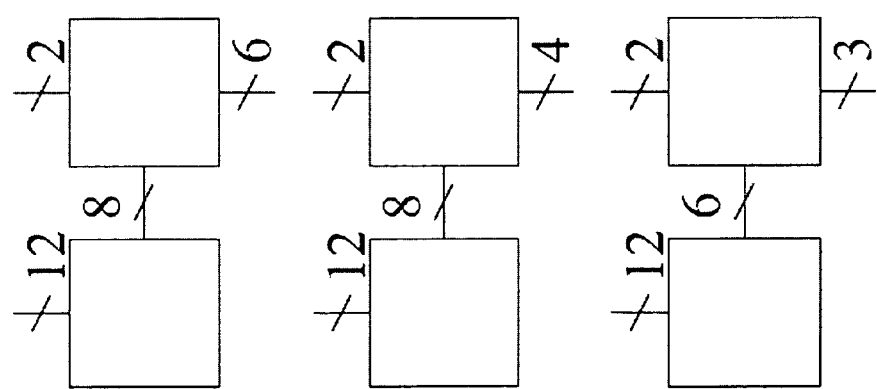

If we assign 0 to the don't care(s), and realize the LUT cascade, we have the circuit shown in FIG. 25($a$). On the other hand, if we apply the "Device for Logic Synthesis" 1 in this embodiment, and realize the cascade, we have the circuit shown in FIG. 25($b$). Clearly, the "Device for Logic Synthesis" 1' in this embodiment produces LUT cascade logic circuits with smaller sized.

INDUSTRIAL APPLICABILITY

This invention is applicable to a CAD system that automatically synthesizes LUT-type logic circuits, or a logic synthesis tool for LUT-type FPGAs.

What is claimed is:

1. A "Device for Reducing a Width of Graph" which reduces a width of a Binary Decision Diagram for Characteristic Function (BDD_for_CF), where BDD_for_CF is a characteristic function $\chi(X,Y)$ defined in Equation (1), $X=(x_1, \ldots, x_n)$ (n$\in$N, N is a set of natural numbers) denotes input variables, $Y=(y_0, \ldots, y_{m-1})$ (m$\geq$2, m$\in$N) denotes output variables of a multiple-output logic function F(X), and $F(X)=(f_0(X), \ldots, f_{m-1}(X))$ is an incompletely specified function to an output including don't care, said device comprising:

(A) "Means to Store Node Table" storing the node table which is a table of node data that consists of labels of variables and pairs of edges $e_0(v_i)$ and $e_1(v_i)$, where the labels of variables are labels given to variables $z_i$ ($z_i \in (X \cup Y)$) corresponding to each non-terminal node $v_i$ in the BDD_for_CF of the multiple-output logic function F(X), and a pair of edges $e_0(v_i)$ and $e_1(v_i)$ that points to next transition child node(s) when input values of $z_i$($z_i \in (X \cup Y)$) are 0 and 1;

(B) "Means to Find Dividing Lines" setting a height of the partition lev which partitions BDD_for_CF represented by said node table stored in said "Means to Store Node Table";

(C) "Means to Generate Column Functions" generating a column function which represents a column of a decomposition chart derived by a functional decomposition from said node table stored in said "Means to Store Node Table", where the decomposition is obtained by partitioning said BDD_for_CF by said height of the partition lev set by said "Means to Find the Dividing Lines"; and (D) "Means to Reconstruct Assigned BDD" which assigns constants to don't care in compatible column functions of column function generated by said "Means to Generate Column Functions", and consequently assigns these compatible column functions to the identical column functions, and reconstructs said BDD_for_CF using new assigned column function, and finally updates the node table in said "Means to Store Node Table", wherein Equation (1) is defined as follows:

[Equation 1]

$$\chi(X, Y) = \bigwedge_{i=0}^{m-1} \{\bar{y}_i f_{i\_0} \vee y_i f_{i\_1} \vee f_{i\_d}\} \qquad (1)$$

where $f_{i\_0}, f_{i\_1}, f_{i\_d}$ are OFF function, the ON function and DC function defined in Equation (2), respectively, wherein Equation (2) is defined as follows:

[Equation 2]

$$f_{i\_0}(X) = \begin{cases} 1 & (X \in f_i^{-1}(0)) \\ 0 & \text{(otherwise)} \end{cases}, \quad (2)$$

$$f_{i\_1}(X) = \begin{cases} 1 & (X \in f_i^{-1}(1)) \\ 0 & \text{(otherwise)} \end{cases},$$

$$f_{i\_d}(X) = \begin{cases} 1 & (X \in f_i^{-1}(d)) \\ 0 & \text{(otherwise)} \end{cases}.$$

2. The "Device for Reducing a Width of Graph" according to claim 1, wherein:
the device further comprises;
(E) "Means to Store Compatible Graphs" storing compatible graph as a table of function node data, which is a table of column function labels of each function node and data of compatible edges connected to the function node, where the compatible graph is a graph which has said column functions as nodes (function nodes), and wherein a pair of function nodes corresponding to the column functions compatible with each other are connected by an edge (compatible edge);
(F) "Means to Generate Compatible Edges" which selects a pair of compatible column function from a set of column functions corresponding to said each function node data, stored in said "Means to Store Compatible Graphs", and then adds a compatible edge which connects these function nodes with function node data corresponding to these compatible column functions, and finally updates the function node data stored in said "Means to Store Compatible Graphs"; and
(G) "Means to Generate Cliques" covering nodes with a minimum number of complete subgraphs (cliques) for all nodes in said compatible graph, and then generating clique data of function node set contained within the clique; and
wherein said "Means to Generate Column Functions" further generates column functions corresponding to each edge of nodes at said height of the partition lev set by said "Means to Find the Dividing Lines" from said node table stored in "Means to Store Node Table", and then generates said function node data having column function labels corresponding to these column functions, and then stores in said "Means to Store Compatible Graphs", and
wherein said "Means to Reconstruct Assigned BDD" further reconstructs said BDD_for_CF by making some column functions into the identical assigned column functions by assigning the constants to don't care of the column functions corresponding to each function node contained in the clique data produced by said "Means to Generate Cliques", and updates said node table in said "Means to Store Node Table".

3. The "Device for Reducing a Width of Graph" according to claim 1, wherein:
said "Means to Find the Dividing Lines" further sets the height of the partition lev sequentially from the height of the child node of a root node in BDD_for_CF represented by said node table stored in said "Means to Store Node Table", towards a low height, and
said "Means to Reconstruct Assigned BDD" further reconstructs sequentially in said each height of the partition lev set by said "Means to Find the Dividing Lines".

4. A "Device for Logic Synthesis" which generates look-up tables (LUTs) of data for constructing logic circuits corresponding to a multiple-output logic function F(X) from the BDD_for_CF (Binary Decision Diagram for Characteristic Function) of the multiple-output logic function F(X)=$(f_0(X), \ldots, f_{m-1}(X))$ with input variables $X=(x_1, \ldots, x_n)$ (n∈N), said device comprising:
(A) "Means to Store Node Table" storing BDD_for_CF representing a characteristic function $\chi(X, Y)$ (where $Y=(y_o, \ldots, y_{m-1})$ (m≧2, m∈N) denotes output variables of F(X)) defined in Equation (3), as a node table which is a table of node data that consists of labels of variables and pairs of edges $e_0(v_i)$ and $e_1(v_i)$, where said multiple-output logic function $F(X)=(f_0(X), \ldots, f_{m-1}(X))$ is a completely specified function, the labels of variables are labels given to variables $z_i$ ($z_i \in (X \cup Y)$) corresponding to each non-terminal node $v_i$ in the BDD_for_CF, and a pair of edges $e_0(v_i)$ and $e_1(v_i)$ that points to next transition child nodes when input values of $z_i$ ($z_i \in (X \cup Y)$) are 0 and 1;
(B) "Means to Store LUTs" storing said LUTs;
(C) "Means to Find Dividing Lines" setting a height of the partition lev which partitions BDD_for_CF represented by said node table stored in said "Means to Store Node Table";
(D) "Means to Reduce by Shorting" executing shorten-processing which is a processing to replace edge $e_c(v_k)$ that points to a node $v_j$ among two edges $e_0(v_k)$ and $e_1(v_k)$ of a parent node $v_k$ of the node by edge $e_b(v_j)$ other than edge $e_a(v_j)$ of the node in the case that a terminal node related to $\chi(X, Y)$=0 pointed by the edge $e_a(v_j)$ of either edges $e_0(v_j)$ or $e_1(v_j)$ of the node $v_j$, about the node data of the node $v_j$ related to a variable $y_r(\in Y)$ representing output and the parent node $v_k$ of the node $v_j$, where the nodes $v_j$ and $v_k$ are contained in a subgraph $B_0$ including a root node among the node data of non-terminal nodes stored in said "Means to Store Node Table", in the case of partitioning BDD_for_CF to two subgraphs $B_0$ and $B_1$ at a partition line in said height of the partition lev;
(E) "Means to Measure a Width of BDDs" which counts a number of the edges that point to child nodes of the non-terminal nodes, whose height is smaller than said height of the partition lev, among the edges which are the non-terminal nodes in BDD_for_CF to which said shorten-processing by said "Means to Reduce by Shorting" is applied and which belong to the non-terminal nodes whose height is larger than said height of the partition lev (where the edges pointing to the same node is counted as one, and the edge pointing to a constant 0 is disregarded), and produces the number of the edges as a width W at the partition line in said height of the partition lev;
(F) "Means to Compute the Intermediate Variables" calculating the number of intermediate variables u following Equation (4), using the width W produced by said "Mean to Measure the Width of BDDs";
(G) "Means to Generate LUTs" which generates LUTs from the node data and stores said LUTs in said "Means to Store LUTs", for the non-terminal nodes which belong to the subgraph $B_0$ including the root node, among the non-terminal nodes stored in said "Means to Store Node Table", in the case of partitioning said BDD_for_CF into two subgraphs at the partition line in said height of the partition lev; and
(H) "Means to Re-construct BDDs" which generates a binary tree which has the same number of control inputs as the number of intermediate variables u which is calculated by said "Means to Compute the Intermediate Variables", and reconstructs the BDD_for_CF by replacing the node data of non-terminal nodes in subgraph $B_0$ of BDD_for_CF stored in said "Means to Store Node Table" by the node data representing said binary tree, and updates the node table stored in said "Means to Store Node Table" by the node data of the non-terminal nodes in said reconstructed BDD_for_CF, wherein Equation (3) and Equation (4) are defined as follows:

[Equation 3]

$$\chi(X, Y) = \bigwedge_{i=0}^{m-1} (y_i \equiv f_i(X)) \quad (3)$$

[Equation 4]

$$u = \lceil \log_2 W \rceil \quad (4).$$

5. The "Device for Logic Synthesis" according to claim 4, wherein said "Means to Store Node Table" stores the BDD_for_CF as a node table, where said BDD_for_CF is a graph that represents the characteristic function $\chi(X, Y)$ (where $Y=(y_0, \ldots, y_{m-1})$ ($m \geq 2$, $m \in N$) denotes the output variables of F(X)) defined in Equation (5), with said multiple-output logic function $F(X)=(f_0(X), \ldots, f_{m-1}(X))$ of an incompletely specified function that includes don't cares in outputs, said node table is the table of the node data that consists of the labels of variables and pairs of edges $e_0(v_i)$ and $e_1(v_i)$, said labels of variables are labels given to the variables $z_i$ ($z_i \in (X \cup Y)$) corresponding to said each non-terminal node $v_i$ in the BDD_for_CF, and said pair of edges $e_0(v_i)$ and $e_1(v_i)$ that points to the next transition child nodes when the values of $z_i$ ($z_i \in (X \cup Y)$) are 0 and, wherein Equation (5) is defined as follows:

[Equation 5]

$$\chi(X, Y) = \bigwedge_{i=0}^{m-1} \{\overline{y}_i f_{i\_0} \vee y_i f_{i\_1} \vee f_{i\_d}\} \quad (5)$$

where $f_{i\_0}, f_{i\_1}, f_{i\_d}$ are OFF function, ON function and DC function defined in Equation (6), respectively, wherein Equation (6) is defined as follows:

[Equation 6]

$$f_{i\_0}(X) = \begin{cases} 1 & (X \in f_i^{-1}(0)) \\ 0 & (\text{otherwise}) \end{cases},$$

$$f_{i\_1}(X) = \begin{cases} 1 & (X \in f_i^{-1}(1)) \\ 0 & (\text{otherwise}) \end{cases},$$

$$f_{i\_d}(X) = \begin{cases} 1 & (X \in f_i^{-1}(d)) \\ 0 & (\text{otherwise}) \end{cases}. \quad (6)$$

6. The "Device for Logic Synthesis" according to claim 4, wherein the device further comprises:

"Means to Decide Ordering of Output Variables" deciding order $\pi$ of elements of said multiple-output logic function F(X) to minimize a value of T represented in Equation (7), where $\pi=(\pi[0], \ldots, \pi[m-1])$ ($\pi[i]=j$ represents that $f_i$ is the i'th element) is the order of the logic functions $f_0(X), \ldots, f_{m-1}(X)$ that are elements of said multiple-output logic function F(X), and supp($f_j$) is a set of input variables that influence the logic function $f_j$ ($\in F(X)$);

"Means to Decide Ordering of all Variables" deciding an order of the variables $y_j(\in Y)$ representing the outputs and input variables $x_i$ ($\in X$) in the order P that satisfies Equation (8); and "Means to Generate BDDs" which generates node data of the BDD_for_CF according to an order P decided in said "Means to Decide the Ordering of all the Variables", and then stores in said "Means to Generate BDDs", wherein Equation (7) and Equation (8) are defined as follows:

[Equation 7]

$$T = \sum_{k=0}^{m-1} \left| \bigcup_{l=0}^{k} supp(f_{\pi[l]}) \right| \quad (7)$$

[Equation 8]

$$P = \Bigg( supp(f_{\pi[0]}), y_{\pi[0]}, supp(f_{\pi[1]}) - supp(f_{\pi[0]}), \quad (8)$$

$$y_{\pi[1]}, supp(f_{\pi[2]}) - \left( \sum_{k=0}^{1} supp(f_{\pi[k]}) \right), y_{\pi[2]},$$

$$\ldots, supp(f_{\pi[m-1]}) - \left( \sum_{k=0}^{m-2} supp(f_{\pi[k]}) \right), y_{\pi[m-1]} \Bigg).$$

7. A "Device for Logic Synthesis" which generates look-up tables (LUTs) of the data for constructing logic circuits corresponding to multiple-output logic function f(X) from a BDD_for_CF (Binary Decision Diagram for Characteristic Function) of the multiple-output logic function $F(X)=F(f_0(X), \ldots, f_{m-1}(X))$ with input variables $X=(x_1, \ldots, x_n)$ ($n \in N$), said device comprising:

(A) "Means to Store Node Table" storing BDD_for_CF representing a characteristic function $\chi(X, Y)$ (where $Y=(y_0, \ldots, y_{m-1})$ ($m \geq 2$, $m \in N$) denotes output variables of F(X)) defined in Equation (3), as a node table which is a table of node data that consists of labels of variables and pairs of edges $e_0(v_i)$ and $e_1(v_i)$, where said multiple-output logic function $F(X)=f_0(X), \ldots, f_{m-1}(X))$ is a completely specified function, the labels of variables are labels given to the variables $z_i$ ($z_i \in (X \cup Y)$) corresponding to each non-terminal node $v_i$ in the BDD_for_CF, and a pair of edges $e_0(v_i)$ and $e_1(v_i)$ that points to next transition child nodes when input values of $z_i$ ($z_i \in (X \cup Y)$) are 0 and 1;

(B) "Means to Store LUTs" storing said LUTs;

(C) "Means to Find Dividing Lines" setting a height of the partition lev which partitions BDD_for_CF represented by said node table stored in said "Means to Store Node Table";

(D) "Means to Reduce by Shorting" executing shorten-processing which is a processing to replace edge $e_c(v_k)$ that points to a node $v_j$ among two edges $e_0(v_k)$ and $e_1(v_k)$ of a parent node $v_k$ of the node $v_j$, by an edge $e_b(v_j)$ other than an edge $e_a(v_j)$ of the node in the case that a terminal node related to $\chi(X, Y)=0$ pointed by the edge $e_a(v_j)$ of either the edges $e_0(v_i)$ or $e_1(v_j)$ of the node $v_j$, about the node data of the node $v_j$ related to a variable $y_r(\in Y)$ representing output and the parent node $v_k$ of the node $v_j$, where the nodes $v_j$ and $v_k$ are contained in a subgraph $B_0$ including a root node among the node data of non-terminal nodes stored in said "Means to Store Node Table", in the case of partitioning BDD_for_CF to two subgraphs $B_0$ and $B_1$ at a partition line in said height of the partition lev;

(E) "Means to Measure Width of BDDs" which counts the number of edges that point to child nodes of non-terminal nodes, whose height is smaller than said height of the partition lev, among the edges which are the non-terminal nodes in BDD_for_CF to which said shorten-processing by said "Means to Reduce by Shorting" is applied and which belong to the non-terminal nodes whose height is larger than said height of the partition lev (where the edges pointing to the same node is counted as one, and the edge to point to a constant 0 is disregarded), and produces the number of edges as a width W at the partition line in said height of the partition lev;

(F) "Means to Compute Intermediate Variables" calculating the number of intermediate variables u following Equation (4), using the width W produced by said "Mean to Measure the Width of BDDs";

(G) "Means to Generate LUTs" which generates LUTs from the node data and stores said LUTs in said "Means to Store LUTs", for the non-terminal nodes which belong to the subgraph $B_0$ including the root node, among the non-terminal nodes stored in said "Means to Store Node Table", in the case of partitioning said BDD_for_CF into two subgraphs at the partition line in said height of the partition lev; and (H) "Means to Re-construct BDDs" which generates a binary tree which has the same number of control inputs as the number of intermediate variables u which is calculated by said "Means to Compute the Intermediate Variables", and reconstructs the BDD_for_CF by replacing the node data of non-terminal nodes in subgraph $B_0$ of BDD_for_CF stored in said "Means to Store Node Table" by the node data representing said binary tree, and updates the node table stored in said "Means to Store Node Table" by the node data of the non-terminal nodes in said reconstructed BDD_for_CF, wherein Equation (3) and Equation (4) are defined as follows:

[Equation 3]

$$\chi(X, Y) = \bigwedge_{i=0}^{m-1} (y_i \equiv f_i(X)) \quad (3)$$

[Equation 4]

$$u = \lceil \log_2 W \rceil \quad (4)$$

wherein said "Means to Store Node Table" stores the BDD_for_CF as a node table, where said BDD_for_CF is a graph that represents the characteristic function $\chi(X, Y)$ (where $Y=(y_0, \ldots, y_{m-1})$ ($m \geq 2$, $m \in N$) denotes output variables of F(X)) defined in Equation (5), with said multiple-output logic function $F(X)=(f_0(X), \ldots, f_{m-1}(X))$ of an incompletely specified function that includes don't cares in outputs, said node table is the table of the node data that consists of the labels of variables and pairs of edges $e_0(v_i)$ and $e_1(v_i)$, said labels of variables are labels given to the variables $z_i$ ($z_i \in (X \cup Y)$) corresponding to said each non-terminal node $v_i$ in the BDD_for_CF, and said pair of edges $e_0(v_i)$ and $e_1(v_i)$ that points to the next transition child nodes when the values of $z_i$ ($z_i \in (X \cup Y)$) are 0 and, wherein Equation (5) is defined as follows:

[Equation 5]

$$\chi(X, Y) = \bigwedge_{i=0}^{m-1} \{\overline{y}_i f_{i\_0} \vee y_i f_{i\_1} \vee f_{i\_d}\} \quad (5)$$

where $f_{i\_0}$, $f_{i\_1}$, $f_{i\_d}$ are OFF function, ON function and DC function defined in Equation (6), respectively, wherein Equation (6) is defined as follows:

[Equation 6]

$$f_{i\_0}(X) = \begin{cases} 1 & (X \in f_i^{-1}(0)) \\ 0 & (\text{otherwise}) \end{cases},$$

$$f_{i\_1}(X) = \begin{cases} 1 & (X \in f_i^{-1}(1)) \\ 0 & (\text{otherwise}) \end{cases},$$

$$f_{i\_d}(X) = \begin{cases} 1 & (X \in f_i^{-1}(d)) \\ 0 & (\text{otherwise}) \end{cases}.$$

said "Means to Reduce by Shorting" reduces the width of BDD_for_CF represented by said node table stored in said "Means to Store Node Table" and then performs said shorten-processing on updated node table.

8. A Method to Reduce a Width of a Graph which reduces a width of a BDD_for_CF (Binary Decision Diagram for Characteristic Function), in a system comprising "Means to Store Node Table" which stores a node table which is a table of node data that consists of the labels of variables and pairs of edges $e_0(v_i)$ and $e_1(v_i)$, where BDD_for_CF is a characteristic function $\chi(X, Y)$ defined in Equation (9), $X=(x_1, \ldots, x_n)$ ($n \in N$, N is a set of natural numbers) are input variables, $Y=(y_0, \ldots, y_{m-1})$ ($m \geq 2$, $m \in N$) denotes output variables of a multiple-output logic function F(X), $F(X)=(f_0(X), \ldots, f_{m-1}(X))$ is an incompletely specified function to an output including don't care, the labels of variables are labels given to variables $z_i$ ($z_i \in (X \cup Y)$) corresponding to non-terminal node $v_i$ in the BDD_for_CF of the multiple-output logic function F(X), and a pair of edges $e_0(v_i)$ and $e_1(v_i)$ that points to next transition child nodes when input values of $z_i$ ($z_i \in (X \cup Y)$) are 0 and 1, the method comprising the steps of:

a) a "Step to Find Dividing Lines" setting a height of the partition lev which partitions BDD_for_CF represented by said node table stored in said "Means to Store Node Table";

b) a "Step to Generate Column Functions" generating a column function which represents a column of a decomposition chart derived by a functional decomposition from said node table stored in said node table in said "Means to Store Node Table", where the decomposition is obtained by partitioning said BDD_for_CF by said height of the partition lev set in said "Step to Find Dividing Lines"; and c) a "Step to Reconstruct Assigned BDD", performed by a computer, assigning constants to don't care in compatible column functions of the column function generated in said "Step to Generate Column Functions", and consequently making assigning these compatible column functions to the identical column functions, and reconstructing said BDD_for_CF using new assigned column functions, and finally updating the node table in said "Means to Store Node Table", wherein Equation (9) is defined as follows:

[Equation 9]

$$\chi(X, Y) = \bigwedge_{i=0}^{m-1} \{\bar{y}_i f_{i\_0} \vee y_i f_{i\_1} \vee f_{i\_d}\} \quad (9)$$

where $f_{i\_0}$, $f_{i\_1}$, $f_{i\_d}$ are OFF function, ON function and DC function defined in Equation (10), respectively, wherein Equation (10) is defined as follows:

[Equation 10]

$$f_{i\_0}(X) = \begin{cases} 1 & (X \in f_i^{-1}(0)) \\ 0 & (\text{otherwise}) \end{cases},$$

$$f_{i\_1}(X) = \begin{cases} 1 & (X \in f_i^{-1}(1)) \\ 0 & (\text{otherwise}) \end{cases}, \quad (10)$$

$$f_{i\_d}(X) = \begin{cases} 1 & (X \in f_i^{-1}(d)) \\ 0 & (\text{otherwise}) \end{cases}.$$

9. The Method to Reduce the Width of Graph according to claim 8 wherein:

said system further comprising "Means to Store Compatible Graphs" storing a compatible graph as a table of function node data, which is a table of column function labels of each function node and data of compatible edges connected to the function node, where the compatible graph is a graph that has nodes of column functions (function nodes), and wherein a pair of function nodes corresponding to column functions compatible each other with an edge or edges (compatible edges), and said method further comprising:

wherein said "Step to Generate Column Functions" further generates column functions corresponding to each edge of nodes at said height of the partition lev set in said "Step to Find Dividing Lines" from said node table stored in "Means to Store Node Table", and then generates said function node data labeled by column function labels corresponding to these column functions, and then stores in said "Means to Store Compatible Graphs";

a "Step to Generate Compatible Edges" which selects the pair of compatible column functions from a set of column functions corresponding to said each function node data, stored in said "Means to Store Compatible Graphs", and then adds compatible edge which connects function node data corresponding to these compatible column functions and these function node, and finally updates the function node data stored in said "Means to Store Compatible Graphs";

a "Step to Generate Cliques" covering all nodes in said compatible graph with a minimum number of complete subgraphs (cliques) and then generating clique data of the function node set contained in the clique; and wherein said "Step to Reconstruct Assigned BDD" further reconstructs said BDD_for_CF by making some column functions into the identically assigned column functions by assigning constants to the don't care(s) of the column functions corresponding to each function node contained in the clique data produced by said "Means to Generate Cliques", and updates said node table in said "Means to Store Node Table".

10. The Method to Reduce a Width of a Graph according to claim 8 wherein:

said "Step to Find Dividing Lines" to said "Step to Reconstruct Assigned BDD" are performed while changing said height lev of the partition sequentially from a height of a child node of a root node in BDD_for_CF represented by said node table stored in said "Means to Store Node Table", towards a lower height.

11. A non-transitory computer readable medium embedded thereon a computer program, which, when executed by a computer, causes the computer to implement the Method to Reduce the Width of Graph according to claim 8.

12. A Method for Logic Synthesis which generates look-up tables (LUTs) of data for constructing logic circuits corresponding to a multiple-output logic function F(X) from a BDD_for_CF (Binary Decision Diagram for Characteristic Function) of the multiple-output, logic function $F(X)=(f_0(X), \ldots, f_{m-1}(X))$ with input variables $X=(x_1, \ldots, x_n)$ (n∈N), in a system comprising:

"Means to Store Node Table" storing BDD_for_CF representing a characteristic function $\chi(X, Y)$ (where $Y=(y_0, \ldots, y_{m-1})$ (m≧2, m∈N) denotes the output variables of F(X)) defined in Equation (11), as a node table which is a table of node data that consists of labels of variables and pairs of edges $e_0(v_i)$ and $e_1(v_i)$, where said multiple-output logic function $F(X)=(f_0(X), \ldots, f_{m-1}(X))$ is a completely specified function, the labels of variables are labels given to variables $z_i$ ($z_i \in (X \cup Y)$) corresponding to non-terminal node $v_i$ in the BDD_for_CF, and a pair of edges $e_0(v_i)$ and $e_1(v_i)$ that points to next transition child node(s) when input values of $z_i$ ($z_i \in (X \cup Y)$) are 0 and 1; and "Means to Store LUTs" storing said LUTs, and said method further comprising:

a "Step to Find Dividing Lines" setting a height of the partition lev which partitions BDD_for_CF represented by said node table stored in said "Means to Store Node Table";

a "Step to Reduce by Shorting" executing, by a processor, shorten-processing which is a processing to replace an edge $e_c(v_k)$ that points to a node $v_j$ among two edges $e_0(v_k)$ and $e_1(v_k)$ of a parent node $v_k$ of the node $v_j$, by an edge $e_b(v_j)$ other than an edge $e_a(v_j)$ of the node $v_j$, in the case that a terminal node related to $\chi(X,Y)=0$ pointed by the edge $e_a(v_j)$ of either edge $e_0(v_j)$ or $e_1(v_j)$ of the node $v_j$, about the node data of the node $v_j$ related to a variable $y_r(\in Y)$ representing the output and the parent node $v_k$ of the node $v_j$, where the nodes $v_j$ and $v_k$ are contained in a subgraph $B_0$ including a root node among the node data of non-terminal nodes stored in said "Means to Store Node Table", in the case of partitioning BDD_for_CF to two subgraphs $B_0$ and $B_1$ at a partition line in said height of the partition lev;

a "Step to Measure a Width of BDDs" which counts a number of the edges that point to child nodes of the non-terminal nodes, whose height is smaller than said height of the partition lev, among the edges which are the non-terminal nodes in BDD_for_CF to which said shorten-processing by said "Means to Reduce by Shorting" is applied, and which belong to the non-terminal nodes whose height is larger than said height of the partition lev (where the edges pointing to the same node is counted as one, and the edges pointing to a constant 0 are ignored), and produces the number of the edges at the partition line in said height of the partition lev as a width W;

a "Step to Count the Intermediate Variables" counting a number of intermediate variables u by Equation (12), using the width W;

a "Step to form LUT" which generates LUTs from the node data and stores said LUTs in said "Means to Store LUTs", for the non-terminal nodes which belong to the subgraph $B_0$ including the root node, among the non-terminal nodes stored in said "Means to Store Node Table", in the case of partitioning said height a "Step to Reconstruct BDD" which generates a binary tree which has the same number of control inputs as the number of intermediate variables u which is calculated by said "Means to Compute the Intermediate Variables", and reconstructs the BDD_for_CF by replacing the node data of non-terminal nodes in subgraph $B_0$ of BDD_for_CF stored in said "Means to Store Node Table" with the node data representing said binary tree, and updates the node table stored in said "Means to Store Node Table" by the node data of the non-terminal nodes in said reconstructed BDD_for_CF, wherein Equation (11) and Equation (12) are defined as follows:

[Equation 11]

$$\chi(X, Y) = \bigwedge_{i=0}^{m-1} (y_i \equiv f_i(X)) \tag{11}$$

[Equation 12]

$$u = \lceil \log_2 W \rceil \tag{12}$$

13. The Method for Logic Synthesis according to claim 12, wherein said "Means to Store Node Table" stores the BDD_for_CF as a node table, where said BDD_for_CF is a graph that represents the characteristic function $\chi(X, Y)$ (where $Y=(y_0, \ldots, y_{m-1})$ ($m \geq 2$, $m \in N$) denotes the output variables of F(X)) defined in Equation (13), with said multiple-output logic function $F(X)=(f_0(X), \ldots, f_{m-1}(X))$ of an incompletely specified function including don't care in outputs, said node table is the table of the node data that consists of the labels of variables and pairs of edges $e_0(v_i)$ and $e_1(v_i)$, said labels of variables are labels given to the variables $z_i$ ($z_i \in (X \cup Y)$) corresponding to said non-terminal node $v_i$ in the BDD_for_CF, and said pair of edges $e_0(v_i)$ and $e_1(v_i)$ points to the next transition child node(s) when the values of $z_i$ ($z_i \in (X \cup Y)$) are 0 and 1, wherein Equation (13) is defined as follows:

[Equation 13]

$$\chi(X, Y) = \bigwedge_{i=0}^{m-1} \{\bar{y}_i f_{i\_0} \vee y_i f_{i\_1} \vee f_{i\_d}\} \tag{13}$$

where $f_{i\_0}$, $f_{i\_1}$, $f_{i\_d}$ are OFF-function, ON-function and DC-function defined in Equation (14), respectively, wherein Equation (14) is defined as follows:

[Equation 14]

$$f_{i\_0}(X) = \begin{cases} 1 & (X \in f_i^{-1}(0)) \\ 0 & (\text{otherwise}) \end{cases} \tag{14}$$

-continued $$f_{i\_1}(X) = \begin{cases} 1 & (X \in f_i^{-1}(1)) \\ 0 & (\text{otherwise}) \end{cases},$$

$$f_{i\_d}(X) = \begin{cases} 1 & (X \in f_i^{-1}(d)) \\ 0 & (\text{otherwise}) \end{cases}.$$

14. The Method for Logic Synthesis according to claim 13 further reduces the width of BDD_for_CF represented by said node table stored in said "Means to Store Node Table", and then updates said node table stored in said "Means to Store Node Table", and then performs from said "Step to Find Dividing Lines" to said "Step to Reconstruct BDD".

15. The Method for Logic Synthesis according to claim 12 wherein, after performing from said "Step to Find Dividing Lines" to said "Step to Reconstruct", said method further performs:

a "Step to Decide Ordering of Output Variables" deciding order $\pi$ of elements of said multiple-output logic function F(X) to minimize a value of T represented in Equation (15), where $\pi=(\pi[0], \pi[m-1])$ ($\pi[i]=j$ represents that $f_j$ is the i'th element) is the order of the logic functions $f_0(X), \ldots, f_{m-1}(X)$ that are elements of said multiple-output logic function F(X), and supp($f_j$) is a set of the input variables that influence the logic function $f_j(\in F(X))$;

a "Step to Decide Ordering of all Variables" deciding an order of variables $y_j(\in Y)$ representing outputs and input variables $x_i$ ($\in X$) in an order P that satisfies Equation (16); and a "Step to Generate BDDs" which generates node data of the BDD_for_CF according to the order P decided in said "Means to Decide the Ordering of all the Variables", and then stores in said "Means to Generate BDDs", wherein Equation (15) and Equation (16) are defined as follows:

[Equation 15]

$$T = \sum_{k=0}^{m-1} \left| \bigcup_{l=0}^{k} supp * (f_{\pi[l]}) \right| \tag{15}$$

[Equation 16]

$$P = \left( supp(f_{\pi[0]}), y_{\pi[0]}, supp(f_{\pi[1]}) - supp(f_{\pi[0]}), \right. \tag{16}$$

$$y_{\pi[1]}, supp(f_{\pi[2]}) - \left( \sum_{k=0}^{1} supp(f_{\pi[k]}) \right), y_{\pi[2]},$$

$$\ldots, supp(f_{\pi[m-1]}) - \left( \sum_{k=0}^{m-2} supp(f_{\pi[k]}) \right), y_{\pi[m-1]} \right).$$

16. A non-transitory computer readable medium embedded thereon a computer program, which, when executed by a computer, causes the computer to implement the Method for Logic Synthesis according to claim 12.

* * * * *